US011385544B2

(12) United States Patent
Ogihara et al.

(10) Patent No.: US 11,385,544 B2

(45) **Date of Patent: *Jul. 12, 2022**

(54) COMPOSITION FOR FORMING SILICON-CONTAINING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Joetsu (JP); Yusuke Biyajima, Joetsu (JP); Masahiro Kanayama, Joetsu (JP); Tsukasa Watanabe, Joetsu (JP); Masaki Ohashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 279 days.

This patent is subject to a terminal disclaimer.

(21) Appl. No.: 16/733,882

(22) Filed: Jan. 3, 2020

(65) Prior Publication Data

US 2020/0233303 A1 Jul. 23, 2020

(30) Foreign Application Priority Data

Jan. 22, 2019 (JP) ............................. JP2019-008818

(51) Int. Cl.

| | |
|---|---|
| ***G03F 7/075*** | (2006.01) |
| ***G03F 7/11*** | (2006.01) |
| ***C08G 77/08*** | (2006.01) |
| ***G03F 7/20*** | (2006.01) |

(52) U.S. Cl.

CPC ........... *G03F 7/0752* (2013.01); *C08G 77/08* (2013.01); *G03F 7/11* (2013.01); *G03F 7/2002* (2013.01)

(58) Field of Classification Search

CPC ........ G03F 7/0752; G03F 7/11; G03F 7/2002; G03F 7/0757; G03F 7/20; C08G 77/08; C08G 77/14; H01L 21/0332; H01L 21/0337; H01L 21/3065; H01L 21/31116; H01L 21/31144; C09D 183/06; C08K 5/36; C08L 83/04

USPC ........................................... 430/270.1, 272.1

See application file for complete search history.

(56) References Cited

U.S. PATENT DOCUMENTS

| | | | | |
|---|---|---|---|---|
| 2009/0013869 | A1 | 1/2009 | Rottmann et al. | |
| 2011/0008735 | A1 | 1/2011 | Ohsawa et al. | |
| 2012/0052685 | A1 | 3/2012 | Ogihara et al. | |
| 2013/0210236 | A1 | 8/2013 | Ogihara et al. | |
| 2013/0280912 | A1 | 10/2013 | Ogihara et al. | |
| 2014/0349221 | A1 | 11/2014 | Takizawa et al. | |
| 2017/0154766 | A1 | 6/2017 | Ogihara et al. | |
| 2020/0041906 | A1 | 2/2020 | Shibayama et al. | |
| 2020/0073241 | A1 | 3/2020 | Yoshida et al. | |
| 2020/0159120 | A1 * | 5/2020 | Ogihara | G03F 7/0751 |
| 2020/0216670 | A1 | 7/2020 | Yano et al. | |
| 2021/0026246 | A1 * | 1/2021 | Ogihara | G03F 7/0397 |

FOREIGN PATENT DOCUMENTS

| | | | |
|---|---|---|---|
| EP | 3680275 | A1 | 7/2020 |
| JP | 2009-126940 | A | 6/2009 |
| JP | 2011-016746 | A | 1/2011 |
| JP | 2012-053253 | A | 3/2012 |
| JP | 2013-167669 | A | 8/2013 |
| JP | 2013-167826 | A | 8/2013 |
| JP | 2013-224279 | A | 10/2013 |
| KR | 10-2020-0086641 | A | 7/2020 |

(Continued)

OTHER PUBLICATIONS

Sep. 4, 2020 Office Action issued in European Patent Application No. 20152718.1.

Sep. 15, 2020 Office Action issued in Taiwanese Patent Application No. 109101864.

May 20, 2020 Search Report issued in European Patent Application No. 20152718.1.

Jul. 29, 2021 Office Action issued in Korean Patent Application No. 10-2020-0007958.

* cited by examiner

*Primary Examiner* — Caleen O Sullivan

(74) *Attorney, Agent, or Firm* — Oliff PLC

(57) ABSTRACT

A composition for forming a silicon-containing resist underlayer film contains at least: one or more compounds shown by the following general formula (P-0); and a thermally crosslinkable polysiloxane (Sx), (P-0)

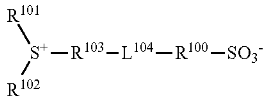

where $R^{100}$ represents divalent organic group substituted with one or more fluorine atoms; $R^{101}$ and $R^{102}$ each independently represent a linear, branched, or cyclic monovalent hydrocarbon group having 1 to 20 carbon atoms optionally substituted with a hetero-atom or optionally interposed by hetero-atom; $R^{103}$ represents linear, branched, or cyclic divalent hydrocarbon group having 1 to 20 carbon atoms optionally substituted with a hetero-atom or optionally interposed by hetero-atom; $R^{101}$ and $R^{102}$, or $R^{101}$ and $R^{103}$, are optionally bonded to each other to form a ring with sulfur atom in the formula; and $L^{104}$ represents a single bond or linear, branched, or cyclic divalent hydrocarbon group having 1 to 20 carbon atoms optionally substituted with a hetero-atom or optionally interposed by hetero-atom.

20 Claims, No Drawings

(56) References Cited

FOREIGN PATENT DOCUMENTS

| | | | |
|---|---|---|---|
| TW | 201720874 | A | 6/2017 |
| TW | 201901296 | A | 1/2019 |
| WO | 2018-181989 | A1 | 10/2018 |

COMPOSITION FOR FORMING SILICON-CONTAINING RESIST UNDERLAYER FILM AND PATTERNING PROCESS

TECHNICAL FIELD

The present invention relates to: a composition for forming a coating-type silicon-containing film used in lithography in processes of manufacturing semiconductor devices and the like; and a patterning process using the composition.

BACKGROUND ART

As Large-Scale Integrated circuits (LSIs) advance toward higher integration and higher processing speed, miniaturization in pattern rule has been required. In this situation, various technologies have been developed in regard to how patterning process can be performed more finely and precisely with light sources used in photolithography using a chemically amplified resist, which is a commonly-employed technique at present.

Meanwhile, as the miniaturization advances, light diffraction phenomenon is approaching to the physical limit. Consequently, the contrast of exposure light employed in patterning has been lowered. Such physical limit causes low dissolution contrast in positive resist films, and thereby degrades focus margin and resolution of hole patterns and trench patterns. To prevent the degradation of patterning performance in such a limiting state, a technique is required which enhances the dissolution contrast of resist films. As a method for enhancing the dissolution contrast of a chemically amplified resist, efforts have been made by utilizing the proliferation mechanism of an acid generated from a photo-acid generator so as to increase sensitivity and minimize the influence from the lowered contrast of exposure light.

On the other hand, as influences of this acid proliferation mechanism, edge roughness (or line width roughness: LWR) and critical dimension uniformity (CDU) of hole pattern are degraded. These are possibly caused by the influence of localization and agglomeration of a base polymer and an acid generator; nevertheless, the influence of the diffusion of proliferated acids is not negligible. Further, to prevent pattern collapse in fine patterns, thin resist films are formed increasingly. However, forming thin resist films tends to degrade LWR and CDU. In these manners, as the miniaturization of resist pattern advances, the combination of the acid proliferation for contrast improvement and the thin-film formation for collapse prevention brings about serious problems of LWR and CDU degradations.

Heretofore, to improve CDU/LWR, there has been known a photosensitive upper layer resist material to which a compound having a cation and an anion in a molecule is added (Patent Document 1). However, in a recent fine pattern, the interaction with a resist underlayer film at the interface influences CDU/LWR. Hence, it is also necessary to improve the properties of a resist underlayer film.

CITATION LIST

Patent Literature

Patent Document 1: Japanese Unexamined Patent Application Publication No. 2011-16746

SUMMARY OF INVENTION

Technical Problem

An object of the present invention is to provide a resist underlayer film capable of improving LWR and CDU in a fine pattern formed in a chemically amplified resist that uses an acid as a catalyst.

Solution to Problem

The present invention has been made to achieve the above object, and provides a composition for forming a silicon-containing resist underlayer film, comprising at least:

one or more compounds shown by the following general formula (P-0); and a thermally crosslinkable polysiloxane (Sx), (P-0)

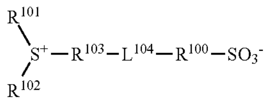

wherein $R^{100}$ represents a divalent organic group substituted with one or more fluorine atoms; $R^{101}$ and $R^{102}$ each independently represent a linear, branched, or cyclic monovalent hydrocarbon group having 1 to 20 carbon atoms optionally substituted with a hetero-atom or optionally interposed by a hetero-atom; $R^{103}$ represents a linear, branched, or cyclic divalent hydrocarbon group having 1 to 20 carbon atoms optionally substituted with a hetero-atom or optionally interposed by a hetero-atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero-atom or optionally interposed by a hetero-atom.

The compound shown by the general formula (P-0) incorporated in the present invention functions as a photo-acid generator, and is characterized by having a structure containing a cation and an anion in one molecule, that is, a betaine structure. Thus, when acids are generated, a salt compound is formed from molecules of the inventive compound, or when another photo-acid generator is used in combination, a salt compound is formed with the photo-acid generator, possibly forming a giant compound by appearance. As a result, presumably, the generated acids diffuse less. When actually added, the inventive acid generator improves the dissolution contrast of an upper layer resist near the interface between an exposed portion and an unexposed portion, and a resist residue remaining near the interface disappears, thereby improving LWR and CDU of the resist pattern. In contrast, acids generated from a conventional acid generator diffuse into an upper layer resist composition, and the acid concentration in the resist is increased, thereby degrading not only LWR and CDU but also mask error factor (MEF) and depth of focus (DOF), which are important as the lithography performance.

In this case, the compound shown by the general formula (P-0) is preferably a compound shown by the following general formula (P-1):

(P-1)

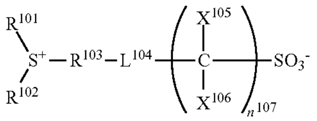

wherein $X^{105}$ and $X^{106}$ each independently represent any of a hydrogen atom, a fluorine atom, and a trifluoromethyl group, but not all of $X^{105}$'s and $X^{106}$'s are hydrogen atoms simultaneously; $n^{107}$ represents an integer of 1 to 4; and $R^{101}$, $R^{102}$, $R^{103}$, and $L^{104}$ are as defined above.

When the compound shown by the general formula (P-0) represents a compound shown by the following general formula (P-1), the effects of the present invention more sufficiently exhibited.

Moreover, the thermally crosslinkable polysiloxane (Sx) preferably comprises any one or more of a repeating unit shown by the following general formula (Sx-1), a repeating unit shown by the following general formula (Sx-2), and a partial structure shown by the following general formula (Sx-3):

(Sx-1)

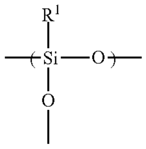

(Sx-2)

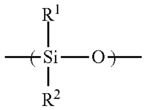

(Sx-3)

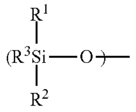

wherein $R^1$, $R^2$, and $R^3$ are identical to or different from each other and each represent a monovalent organic group having 1 to 30 carbon atoms.

When the thermally crosslinkable polysiloxane (Sx) contains a certain structure(s) as described above, the effects of the present invention are more sufficiently exhibited.

The present invention preferably further comprises a crosslinking catalyst (Xc).

As containing the crosslinking catalyst (Xc), the inventive composition for forming a silicon-containing resist underlayer film is particularly suitable for ArF lithography.

The crosslinking catalyst (Xc) contained in the inventive composition for forming a silicon-containing resist underlayer film makes it possible to promote siloxane bond formation when the thermally crosslinkable polysiloxane (Sx) is cured, and to form a silicon-containing resist underlayer film crosslinked at high density. Accordingly, acids generated from the inventive acid generator diffuse to small extent, and the diffusion to the upper layer resist is suppressed, making it possible to form an upper layer resist pattern excellent in LWR and CDU.

In this case, the crosslinking catalyst (Xc) is preferably a sulfonium salt (Xc-1), an iodonium salt (Xc-2), a phosphonium salt (Xc-3), an ammonium salt (Xc-4), a polysiloxane (Xc-10) having a structure partially containing one of these salts, or an alkaline metal salt.

When the crosslinking catalyst (Xc) is a certain material as described above, the effects of the present invention are more sufficiently exhibited.

The present invention provides a patterning process comprising the steps of:

forming an organic film on a body to be processed by using a coating-type organic film material;

forming a resist underlayer film on the organic film by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and transferring the pattern to the body to be processed by etching using the organic film having the transferred pattern as a mask.

Further, the present invention provides a patterning process comprising the steps of:

forming a hard mask mainly containing carbon on a body to be processed by a CVD method;

forming a resist underlayer film on the hard mask by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the hard mask by dry etching using the resist underlayer film having the transferred pattern as a mask; and transferring the pattern to the body to be processed by dry etching using the hard mask having the transferred pattern as a mask.

According to the patterning processes, the dissolution contrast of an upper layer resist near the interface between an exposed portion and an unexposed portion is improved, and a resist residue remaining near the interface disappears, so that the LWR and CDU of the resist pattern are improved.

The pattern is preferably formed in the resist upper layer film by a photolithography with a wavelength of 10 nm or more and 300 nm or less, direct drawing with electron beam, nanoimprinting, or a combination thereof.

When a pattern is formed in the resist upper layer film by a certain patterning process as described above, the effects of the present invention are more sufficiently exhibited.

The body to be processed may be a semiconductor apparatus substrate, a metal film, a metal carbide film, a metal oxide film, a metal nitride film, a metal oxycarbide film, or a metal oxynitride film.

When the body to be processed is a certain material as described above, the effects of the present invention are more sufficiently exhibited.

Further, the metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When the metal of the body to be processed is a certain metal as described above, the effects of the present invention are more sufficiently exhibited.

Advantageous Effects of Invention

The inventive composition for forming a silicon-containing resist underlayer film contains a betaine-type acid generator, thereby making it possible to form an upper layer resist pattern with favorable LWR and CDU, and also to form a semiconductor-device pattern on a substrate with high yield because of excellent dry etching selectivity relative to a resist upper layer film and an organic film or a hard mask. Moreover, the inventive composition for forming a silicon-containing resist underlayer film has high etching selectivity relative to an organic material, so that a photoresist pattern formed in the resist film can be successively transferred to the silicon-containing resist under layer film and the organic film or hard mask by (dry) etching process. Particularly, as the semiconductor-device manufacturing process progresses toward miniaturization recently, multiple exposure process is often used, and the LWR and CDU in the developed pattern greatly influence the device performances. Hence, it is important to enhance LWR and CDU properties. Further, since the inventive composition for forming a silicon-containing resist underlayer film has favorable dry etching selectivity ratio, it is possible to suppress deformation of a resist upper layer film pattern during dry etching and to transfer the pattern to a substrate with high precision while the excellent LWR and CDU are maintained, even when the silicon-containing resist underlayer film is used as a dry etching mask.

DESCRIPTION OF EMBODIMENTS

The present inventors have earnestly studied to achieve the above object and consequently found that when an acid generator having an anion moiety and a cation moiety in one molecule shown by the following general formula (P-0) is employed in a composition for forming a silicon-containing resist underlayer film, development residue of a resist material, which is slightly formed near a resist pattern and an underlayer film, can be prevented without degrading LWR and CDU of an upper layer resist, thus making it possible to improve the LWR and CDU of the entire resist pattern. These findings have led to the completion of the present invention.

Specifically, the present invention provides a composition for forming a silicon-containing resist underlayer film, comprising at least:

one or more compounds shown by the following general formula (P-0); and a thermally crosslinkable polysiloxane (Sx), (P-0)

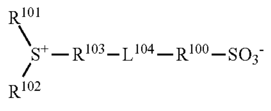

wherein $R^{100}$ represents a divalent organic group substituted with one or more fluorine atoms; $R^{101}$ and $R^{102}$ each independently represent a linear, branched, or cyclic monovalent hydrocarbon group having 1 to 20 carbon atoms optionally substituted with a hetero-atom or optionally interposed by a hetero-atom; $R^{103}$ represents a linear, branched, or cyclic divalent hydrocarbon group having 1 to 20 carbon atoms optionally substituted with a hetero-atom or optionally interposed by a hetero-atom; $R^{10}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero-atom or optionally interposed by a hetero-atom.

Moreover, the present invention provides a patterning process comprising the steps of:

forming an organic film on a body to be processed by using a coating-type organic film material;

forming a resist underlayer film on the organic film by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and transferring the pattern to the body to be processed by etching using the organic film having the transferred pattern as a mask.

Further, the present invention provides a patterning process comprising the steps of:

forming a hard mask mainly containing carbon on a body to be processed by a CVD method;

forming a resist underlayer film on the hard mask by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the hard mask by dry etching using the resist underlayer film having the transferred pattern as a mask; and transferring the pattern to the body to be processed by dry etching using the hard mask having the transferred pattern as a mask.

Hereinafter, the present invention will be described in detail, but the present invention is not limited thereto.

(Compound Shown by General Formula (P-0): Photo-Acid Generator)

A betaine-type acid generator of the present invention has a cation moiety and an anion moiety in a molecule as shown by:

(P-0)

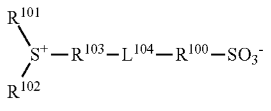

where $R^{100}$ represents a divalent organic group substituted with one or more fluorine atoms; $R^{101}$ and $R^{102}$ each independently represent a linear, branched, or cyclic monovalent hydrocarbon group having 1 to 20 carbon atoms optionally substituted with a hetero-atom or optionally interposed by a hetero-atom; $R^{103}$ represents a linear, branched, or cyclic divalent hydrocarbon group having 1 to 20 carbon atoms optionally substituted with a hetero-atom or optionally interposed by a hetero-atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero-atom or optionally interposed by a hetero-atom.

In the general formula (P-0), $R^{100}$ is a divalent organic group substituted with one or more fluorine atoms. The divalent organic group represents, for example, a linear, branched, or cyclic divalent hydrocarbon group, such as an alkylene group, an alkenylene group, and an arylene group, having 1 to 20 carbon atoms. Specific examples of $R^{100}$ include the following.

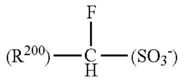 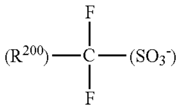

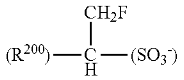 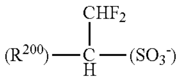

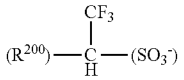 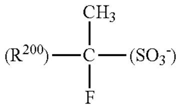

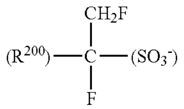 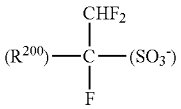

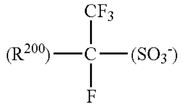 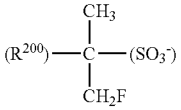

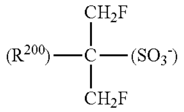 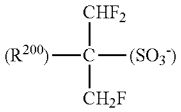

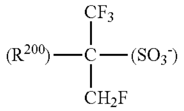 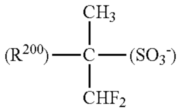

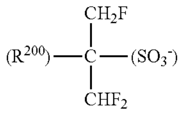 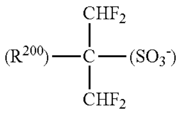

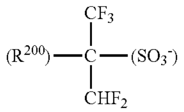 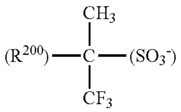

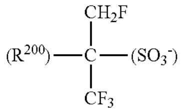 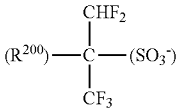

-continued

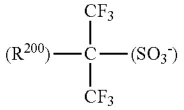 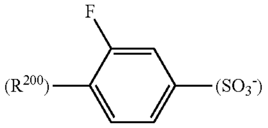

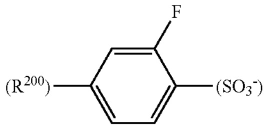

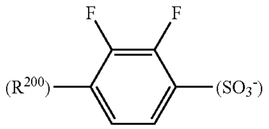

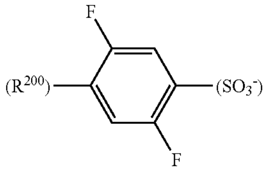

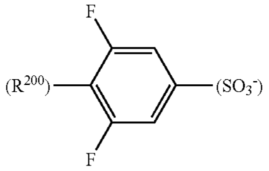

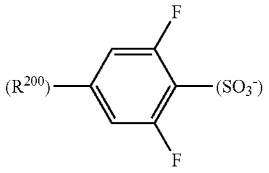

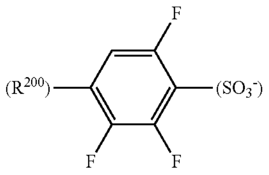

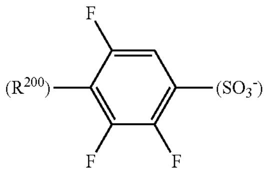

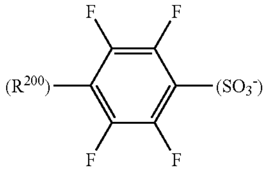 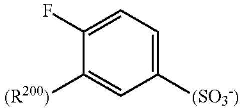

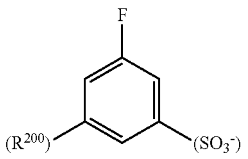 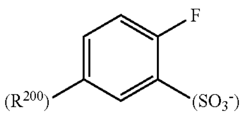

-continued

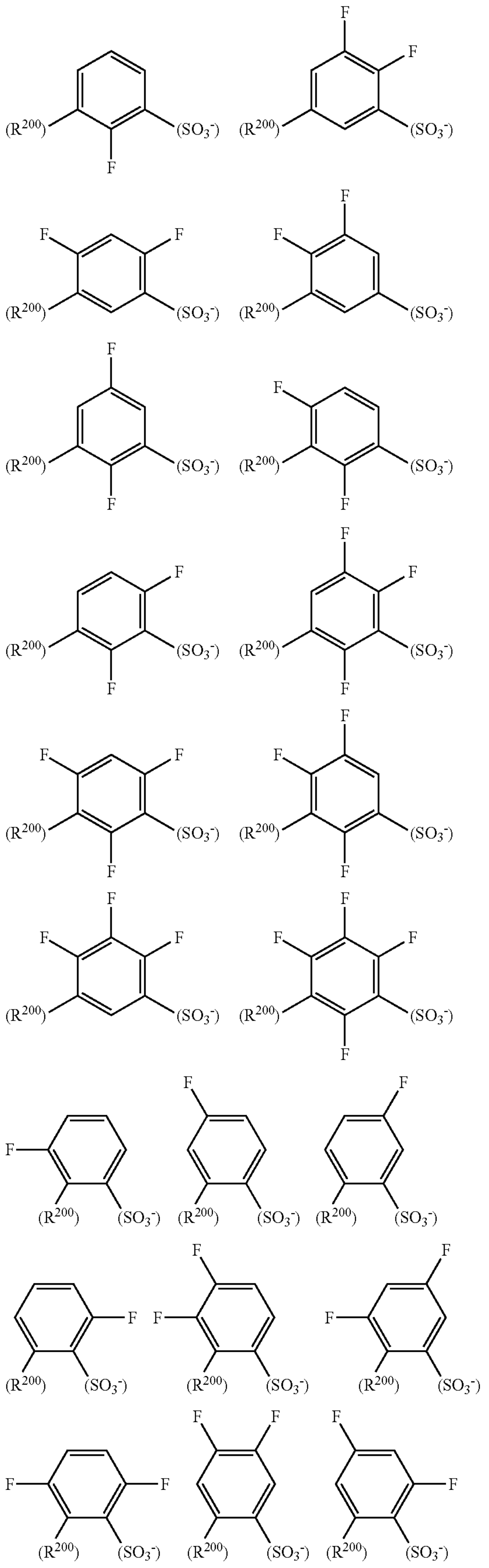

-continued

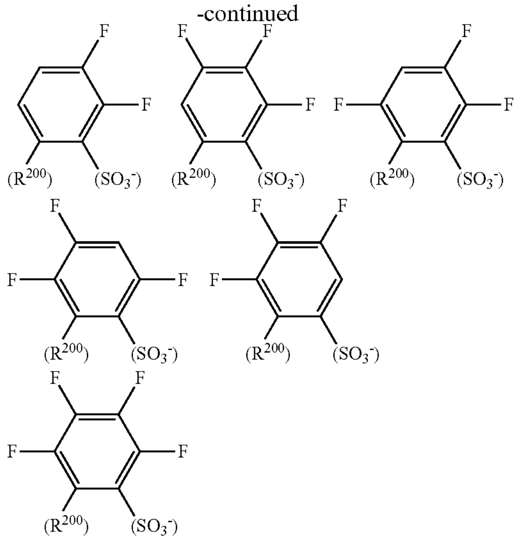

Note that, in the above formulae, ($SO_3^-$) is depicted to show a bonding site to the $SO_3$ group in the general formula (P-0). Moreover, ($R^{200}$) is depicted to show a bonding site to a portion where the cation moiety in the general formula (P-0) bonds to $R^{100}$ via $L^{104}$.

$R^{101}$ and $R^{102}$ each independently represent a linear, branched, or cyclic monovalent hydrocarbon group, such as an alkyl group, an alkenyl group, an aryl group, and an aralkyl group, having 1 to 20 carbon atoms optionally substituted with a hetero-atom or optionally interposed by a hetero-atom. Examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, a thienyl group, and the like; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a 1-phenylethyl group, a 2-phenylethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like. Additionally, $R^{101}$ and $R^{102}$ may be bonded to each other to form a ring together with the sulfur atom in the formula; in this case, examples of the ring include groups shown by the following formulae.

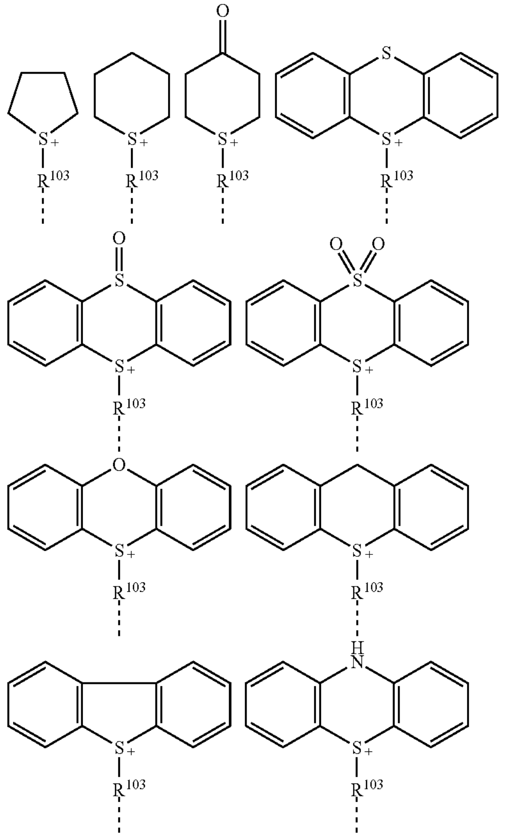

In the general formula (P-0), $R^{103}$ represents a linear, branched, or cyclic divalent hydrocarbon group having 1 to 20 carbon atoms optionally substituted with a hetero-atom or optionally interposed by a hetero-atom. Specific examples of $R^{103}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero-atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed. Further, $R^{101}$ and $R^{103}$ may be bonded to each other to form a ring together with the sulfur atom in the formula; in this case, examples of the ring include groups shown by the following formulae.

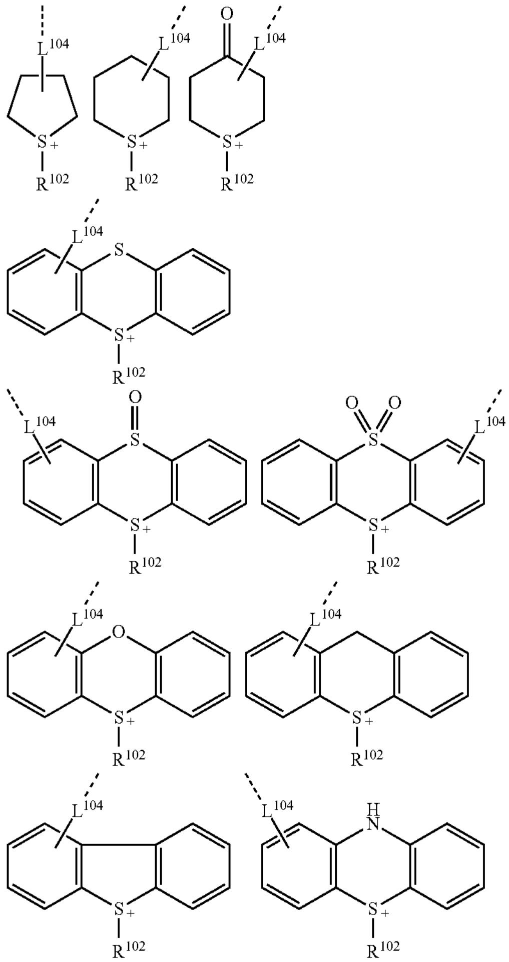

In the general formula (P-0), $L^{104}$ represents a single bond or a linear, branched, or cyclic divalent hydrocarbon group having 1 to 20 carbon atoms optionally substituted with a hetero-atom or optionally interposed by a hetero-atom. Specific examples of $L^{104}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero-atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed.

The photo-acid generator shown by the general formula (P-0) is preferably shown by the following general formula (P-1).

(P-1)

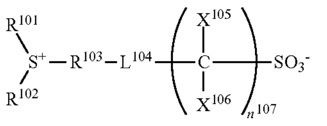

In the general formula (P-1), $X^{105}$ and $X^{106}$ each independently represent any of a hydrogen atom, a fluorine atom, and a trifluoromethyl group, but not all of $X^{105}$'s and $X^{106}$'s are hydrogen atoms simultaneously. $n^{107}$ represents an integer of 1 to 4. $R^{101}$, $R^{102}$, $R^{103}$, and $L^{104}$ are as defined above.

The photo-acid generator shown by the general formula (P-0) is more preferably shown by the following general formula (P-1-1).

(P-1-1)

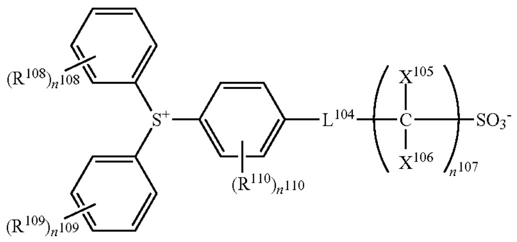

In the general formula (P-1-1), $R^{108}$, $R^{109}$ and $R^{110}$ each independently represent a hydrogen atom or a linear, branched, or cyclic monovalent hydrocarbon group having 1 to 20 carbon atoms optionally interposed by a hetero-atom. Specific examples of the monovalent hydrocarbon group include a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.$0^{2,6}$]decanyl group, an adamantyl group, and the like. Additionally, some of hydrogen atoms of these groups may be substituted with a hetero-atom such as an oxygen atom, a sulfur atom, a nitrogen atom, and a halogen atom. Alternatively, the monovalent hydrocarbon group may be interposed by a hetero-atom such as an oxygen atom, a sulfur atom, and a nitrogen atom. As a result, the monovalent hydrocarbon group may be formed to have or interposed by a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like. The monovalent hydrocarbon group is preferably a methyl group, a methoxy group, a tert-butyl group, or a tert-butoxy group.

In the general formula (P-1-1), $n^{108}$ and $n^{109}$ each represent an integer of 0 to 5, preferably 0 or 1. $n^{110}$ represents an integer of 0 to 4, preferably 0 or 2. $L^{104}$, $X^{105}$, $X^{106}$, and $n^{107}$ are as defined above.

The photo-acid generator shown by the general formula (P-0) is further preferably shown by the following general formula (P-1-2).

(P-1-2)

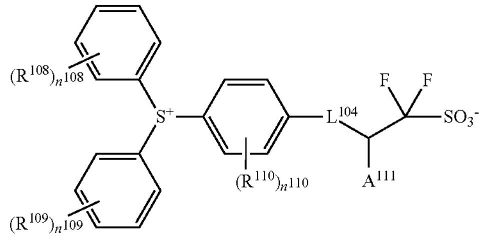

In the general formula (P-1-2), $A^{111}$ represents a hydrogen atom or a trifluoromethyl group. $R^{108}$, $R^{109}$, $R^{110}$, $n^{108}$, $n^{109}$, $n^{110}$, and $L^{104}$ are as defined above.

More specific examples of the photo-acid generators shown by the general formulae (P-0), (P-1), (P-1-1), and (P-1-2) include ones with structures shown below. Nevertheless, the photo-acid generator is not limited thereto.

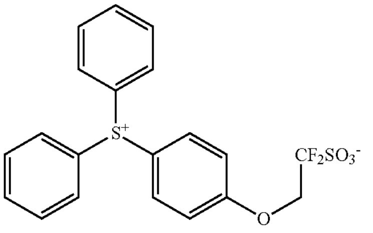

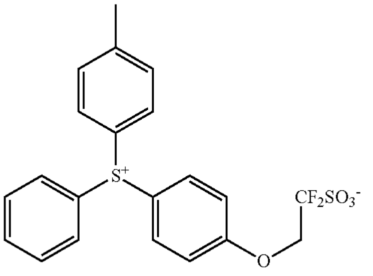

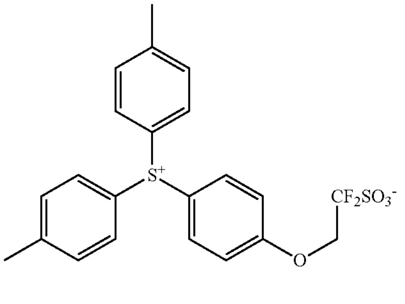

-continued
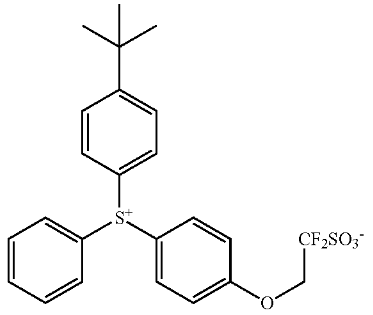
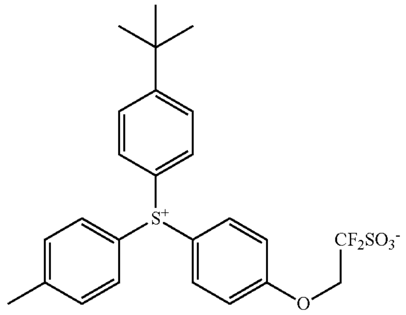
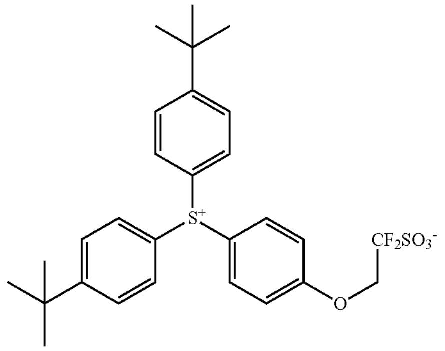
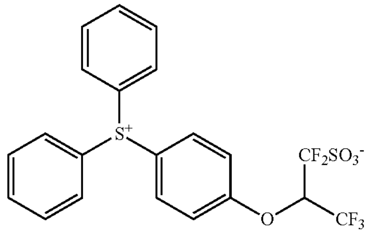
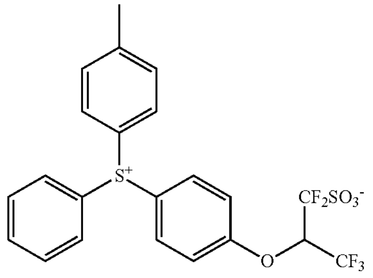
-continued
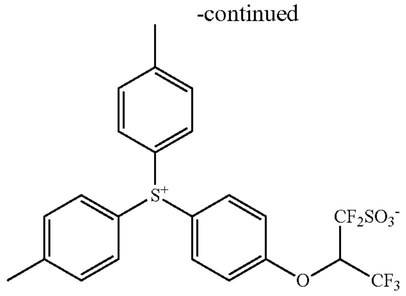
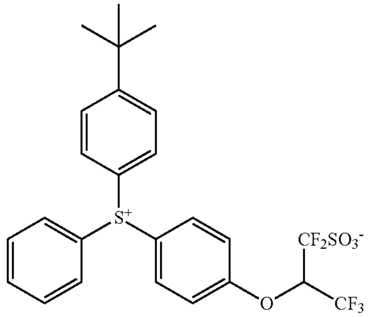
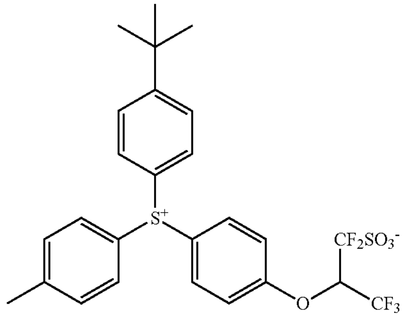
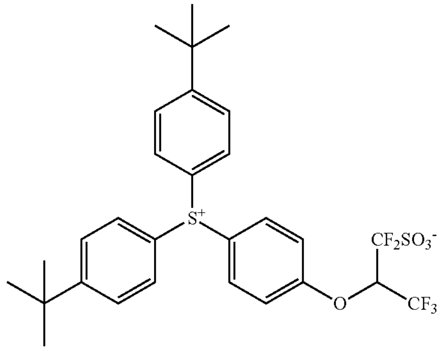
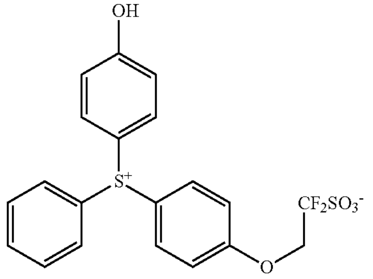

-continued
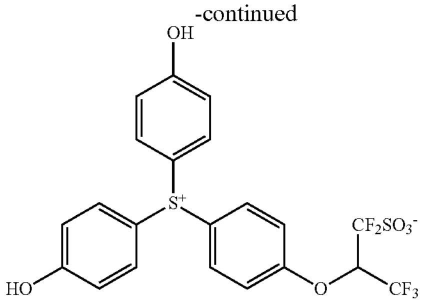
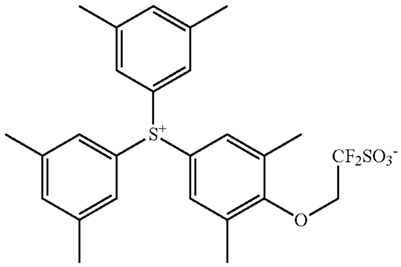
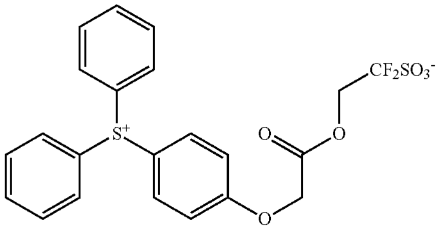
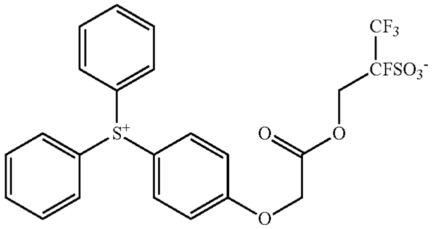
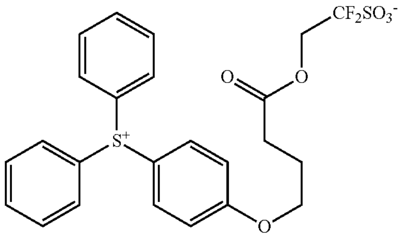
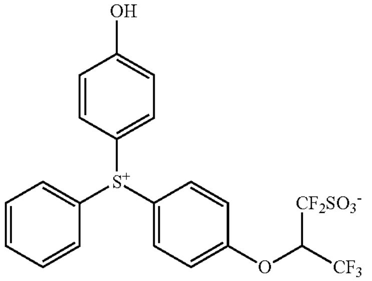
-continued
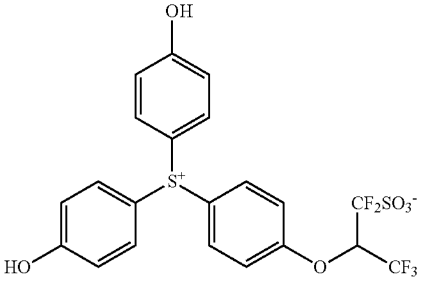
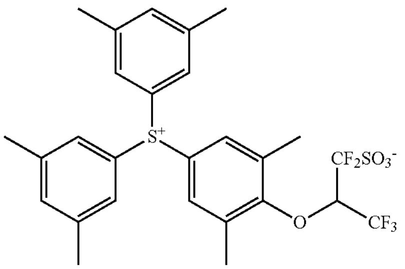
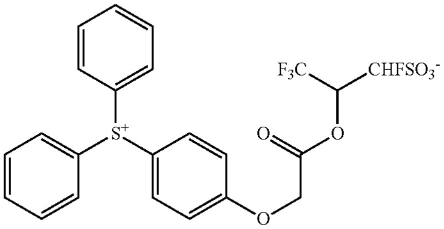
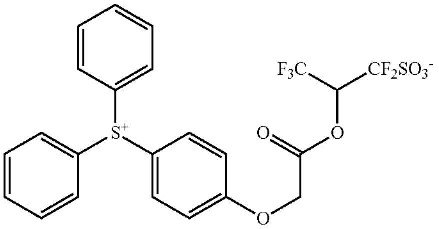
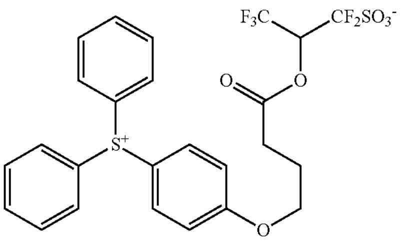
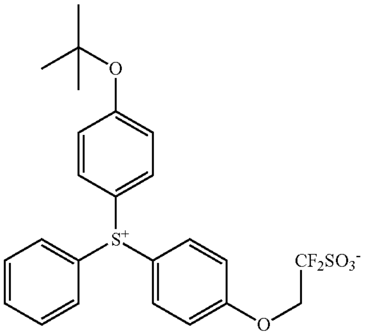

-continued
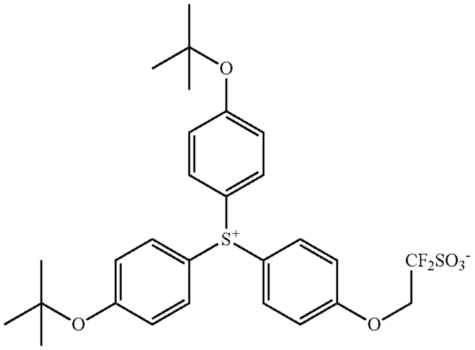
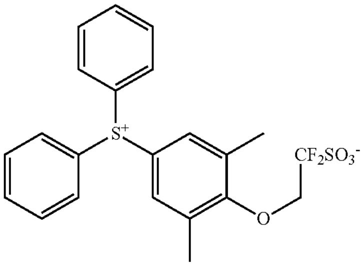
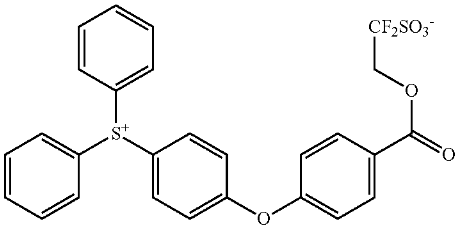
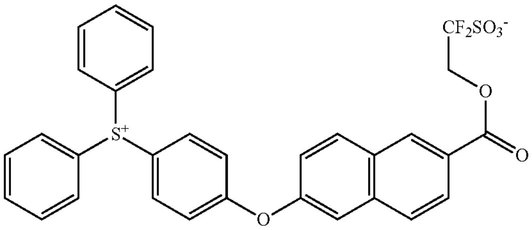
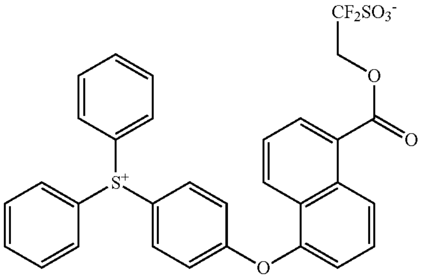
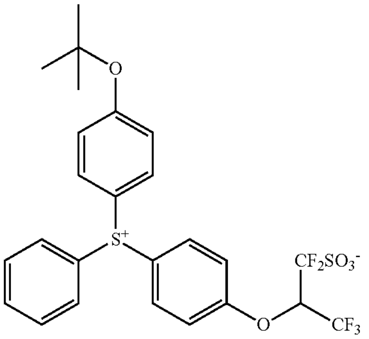
-continued
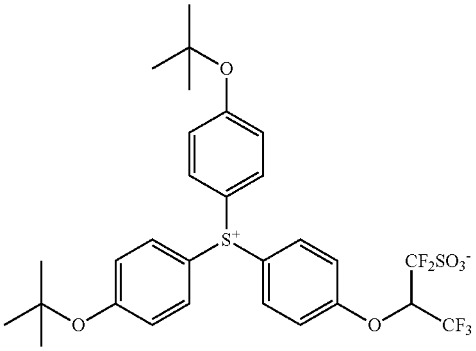
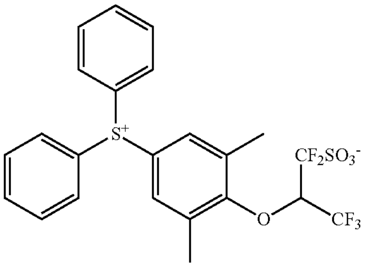
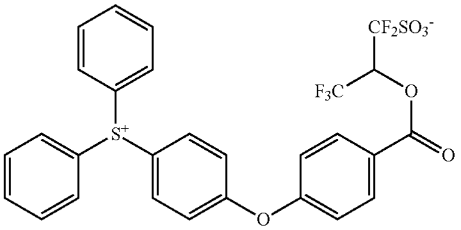
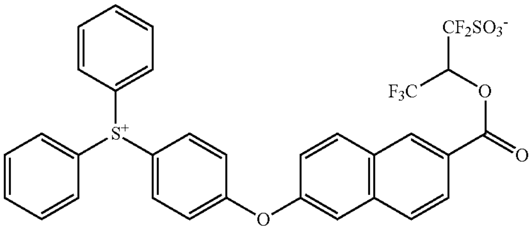
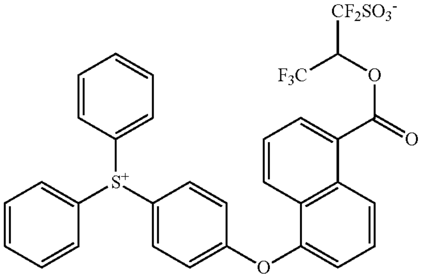
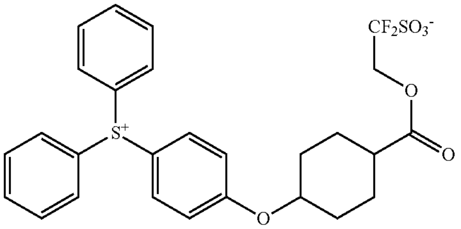

-continued
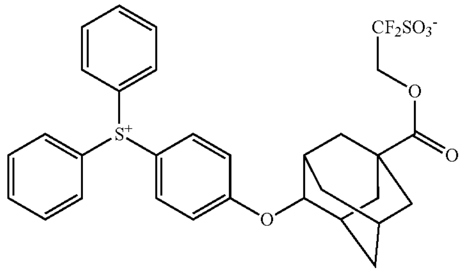
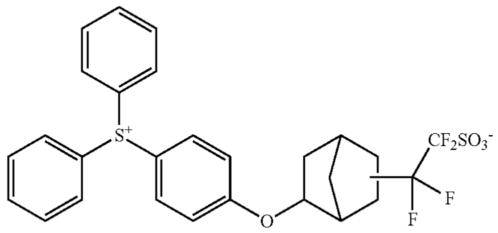
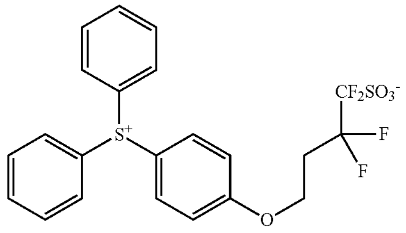
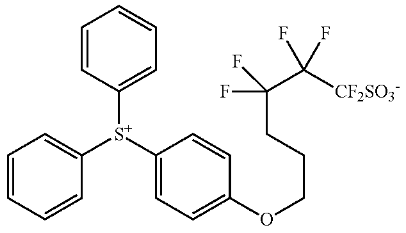
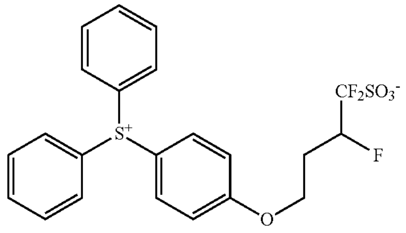
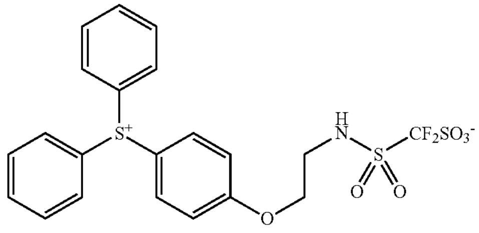
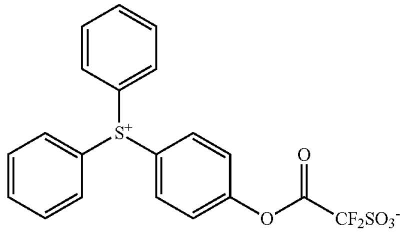
-continued
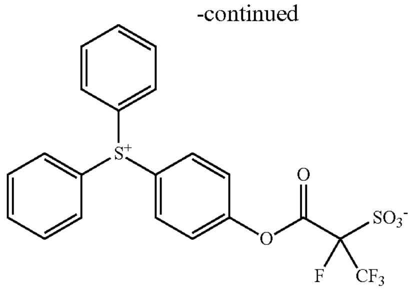
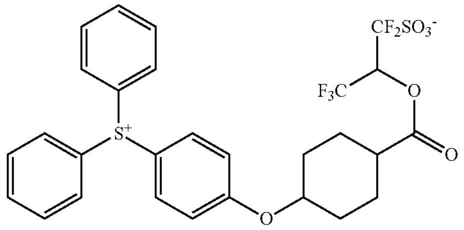
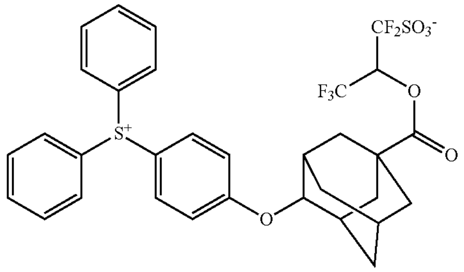
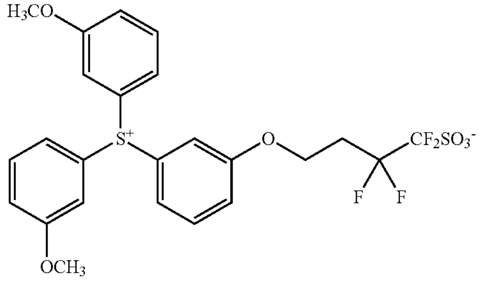
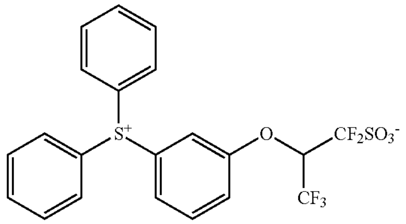
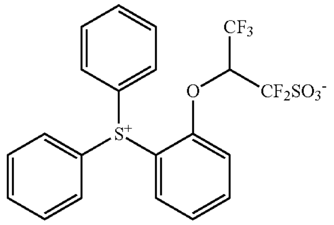
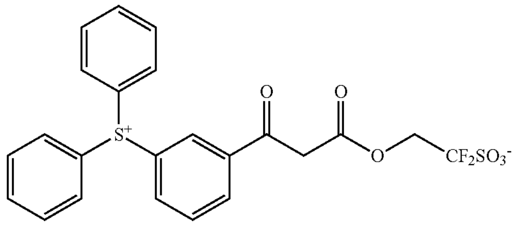

-continued
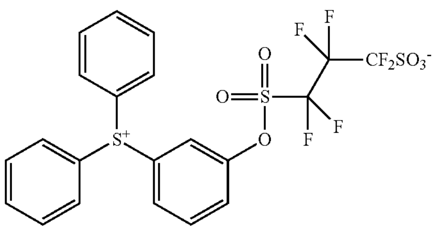
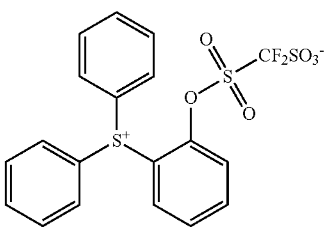
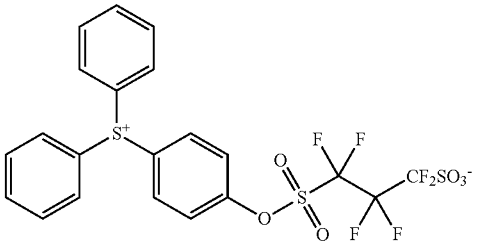
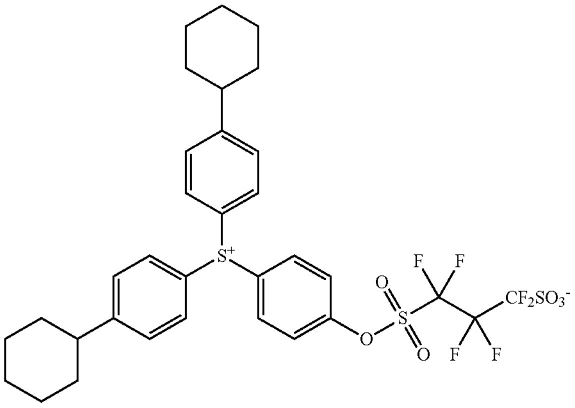
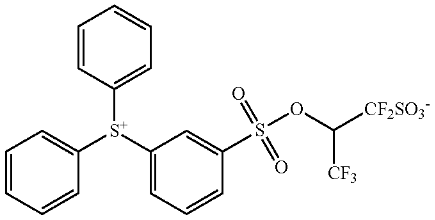
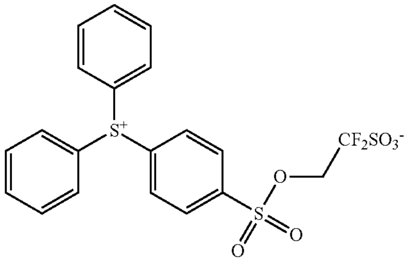
-continued
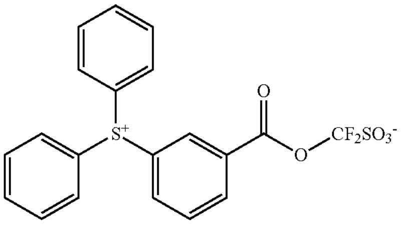
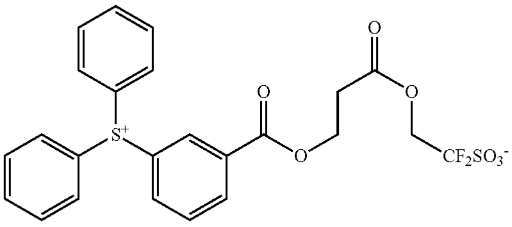
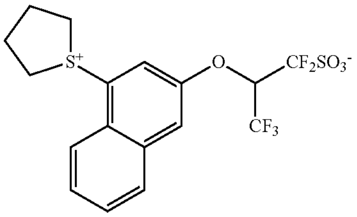
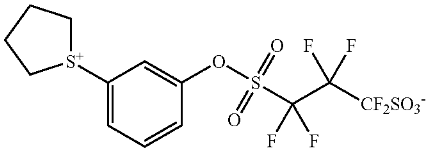
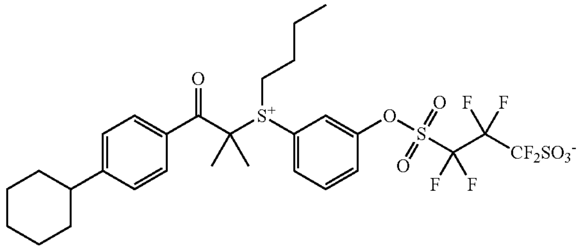
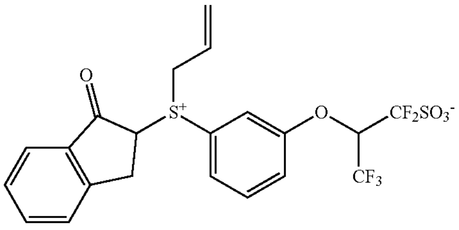
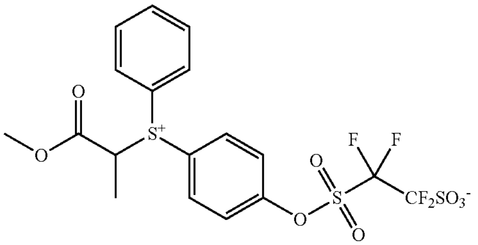

-continued
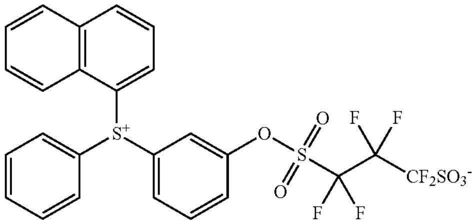
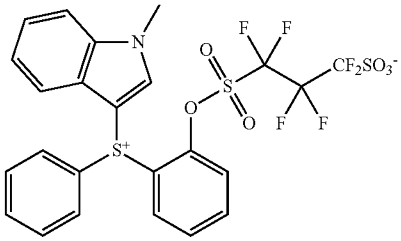
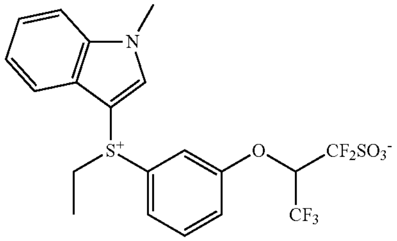
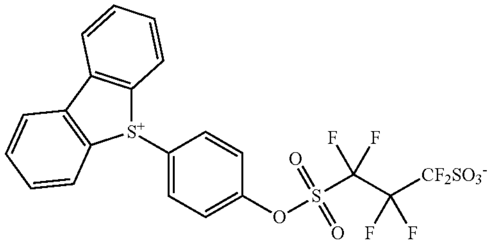
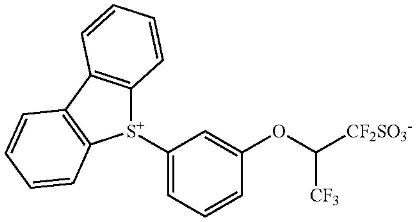
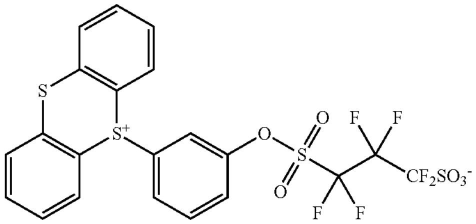
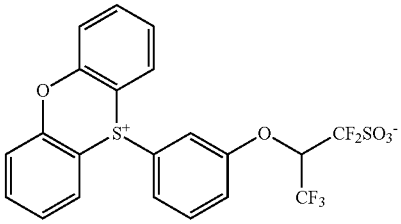
-continued
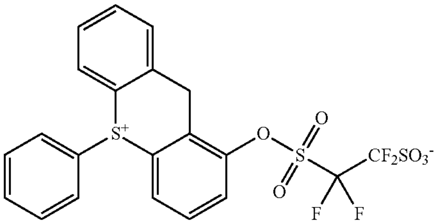
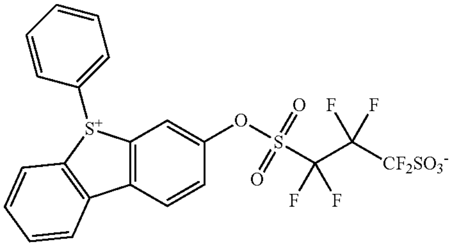
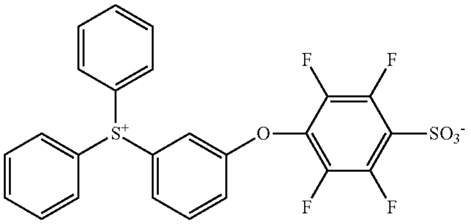
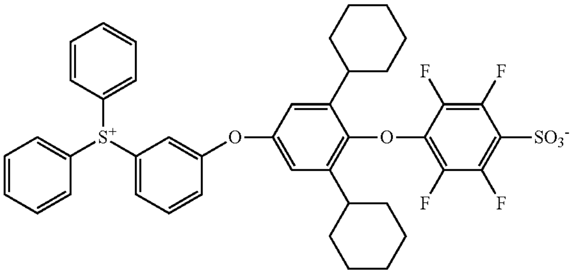
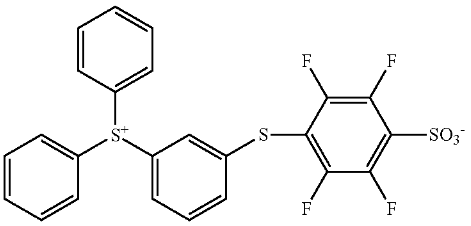
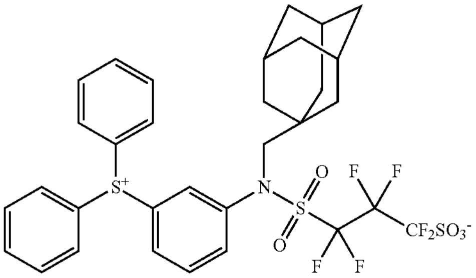

-continued
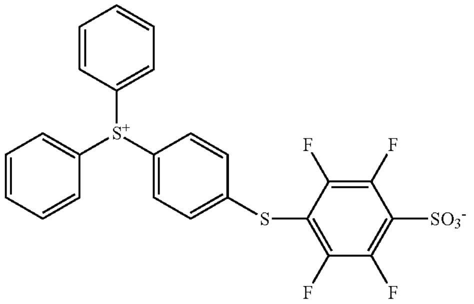
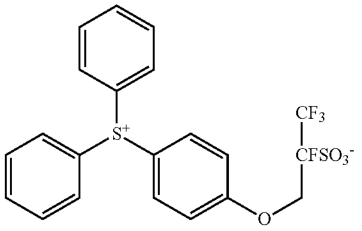
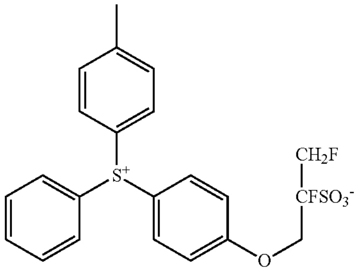
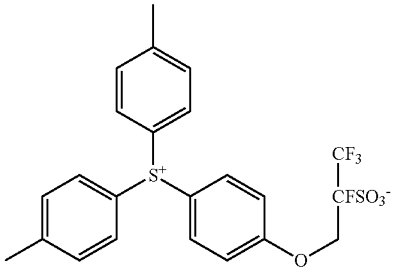
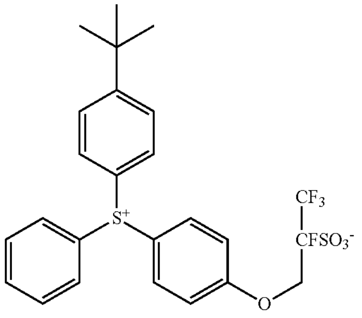
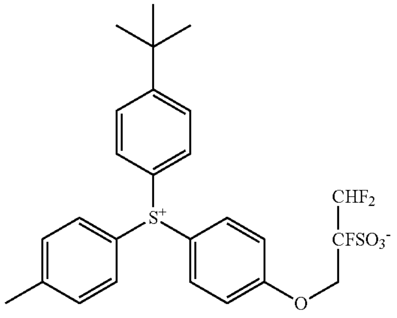
-continued
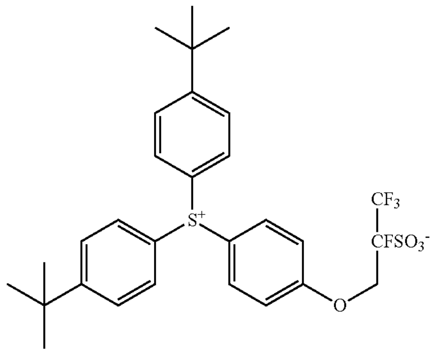
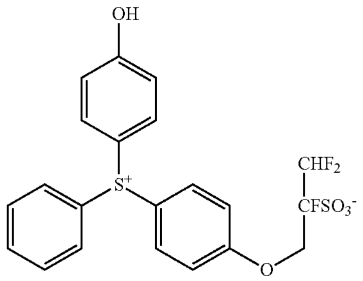
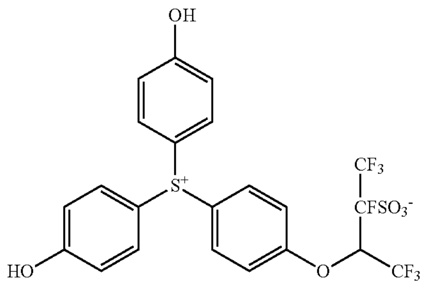
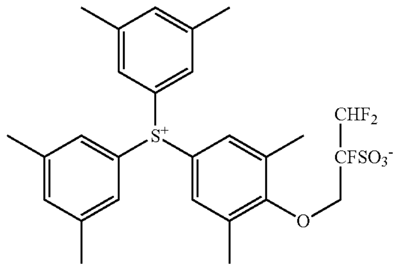
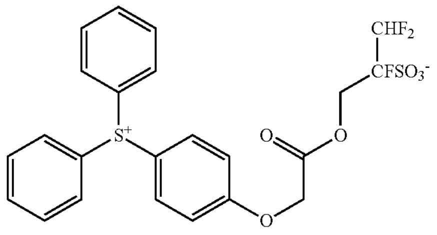
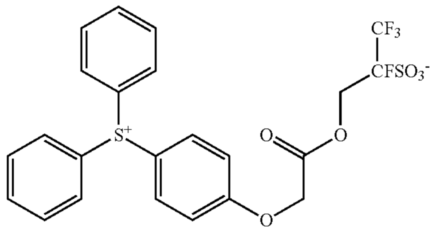

-continued
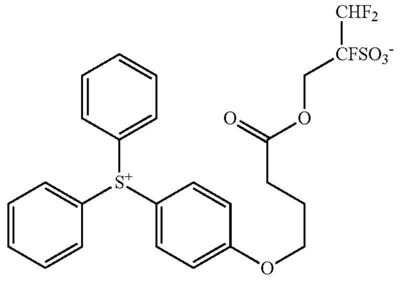
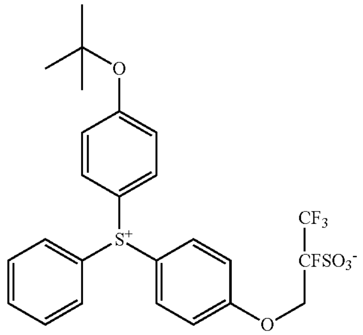
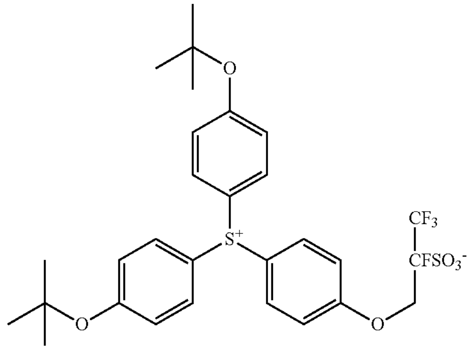
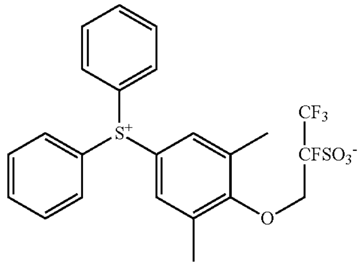
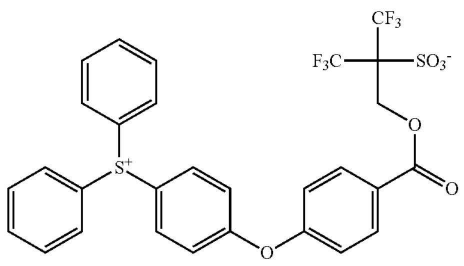
-continued
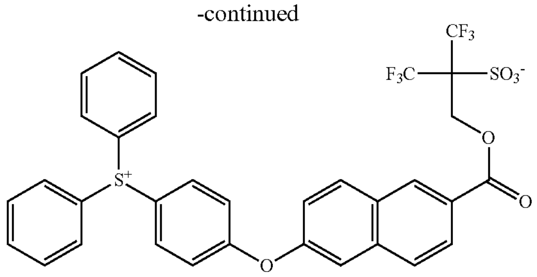
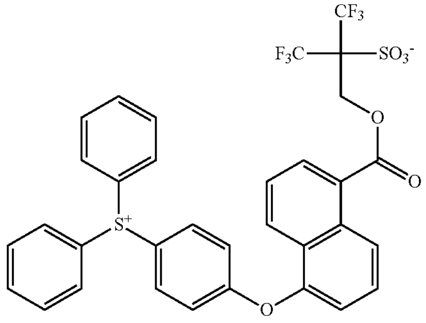
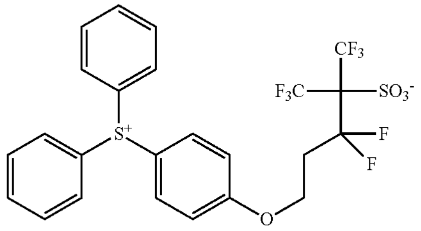
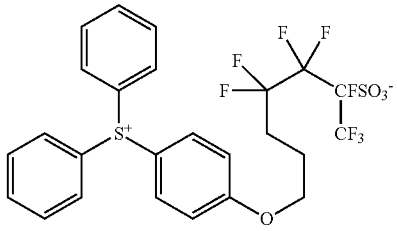
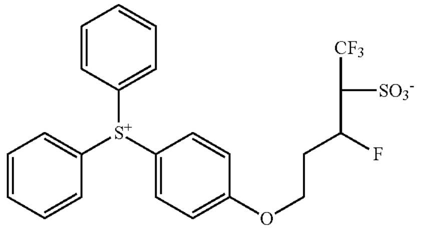
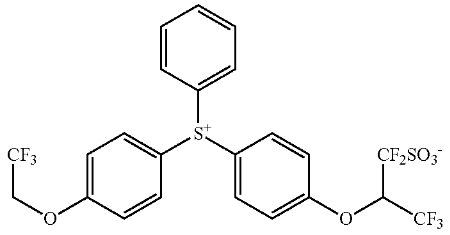
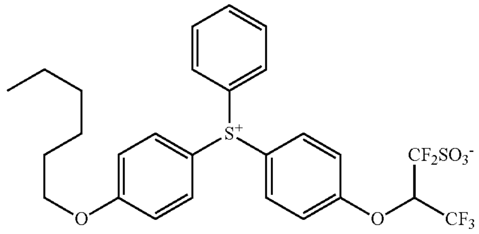

-continued

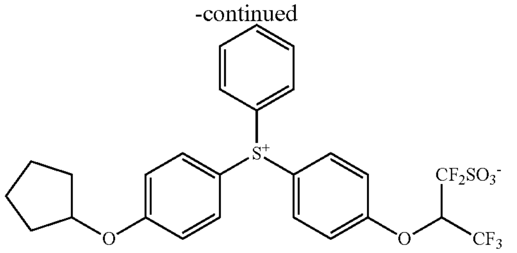

The compound shown by the general formula (P-0) can be added in an amount of 0.001 to 40 parts by mass, preferably 0.1 to 40 parts by mass, further preferably 0.1 to 20 parts by mass, based on 100 parts by mass of a thermally crosslinkable polysiloxane (Sx). This range is preferable because favorable resolution is obtained and no problem of foreign matters will arise after resist development or during removal. Further, as necessary, one kind of the compound can be used alone, or two or more kinds thereof can be used in combination.

(Thermally Crosslinkable Polysiloxane (Sx))

The inventive thermally crosslinkable polysiloxane (Sx) preferably contains any one or more of a repeating unit shown by the following general formula (Sx-1), a repeating unit shown by the following general formula (Sx-2), and a partial structure shown by the following general formula (Sx-3):

(Sx-1)

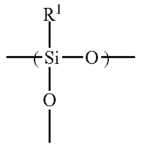

(Sx-2)

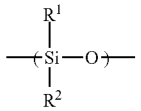

(Sx-3)

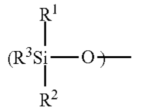

where $R^1$, $R^2$, and $R^3$ are identical to or different from each other and each represent a monovalent organic group having 1 to 30 carbon atoms.

The thermally crosslinkable polysiloxane (Sx) can be produced by hydrolysis condensation of the following hydrolysable monomer (Sm).

Specific examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl) dimethoxysilane, bis(bicycloheptyl)diethoxysilane, bis (bicycloheptyl)dipropoxysilane, bis(bicycloheptyl) diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the compound include tetramethoxysilane; tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the organic group shown by $R^1$, $R^2$, and $R^3$ include organic groups having one or more carbon-oxygen single bonds or carbon-oxygen double bonds, specifically organic groups having an ether bond, an ester bond, or one or more groups selected from the group consisting of alkoxy groups, a hydroxy group, and the like. Examples of the organic groups include ones shown by the following general formula (Sm-R).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \qquad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $—C_qH_{(2q-p)}P_p—$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent —O—, —CO—, —OCO—, —COO—, or —OCOO—. v1, v2, and v3 each independently represent 0 or 1. T represents a divalent atom other than carbon, or a divalent group of an alicyclic, aromatic, or heterocyclic ring. As T, examples of the alicyclic, aromatic, or heterocyclic ring optionally containing a hetero-atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

T =

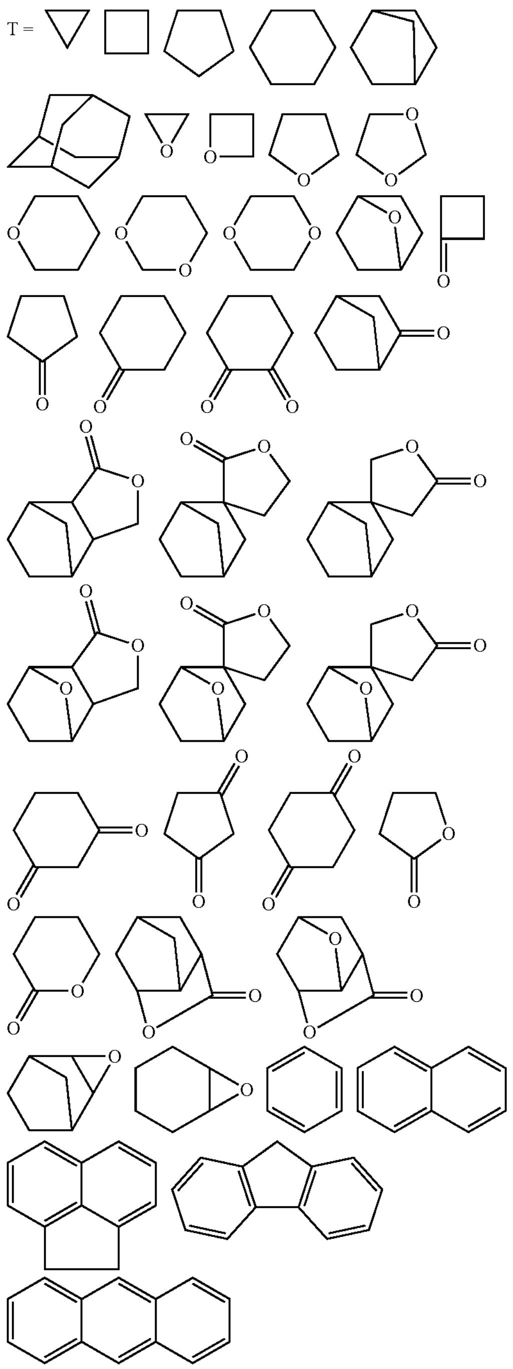

Preferable examples of the organic groups having one or more carbon-oxygen single bonds or carbon-oxygen double bonds in the general formula (Sm-R) include the following. Note that, in the following formulae, (Si) is depicted to show a bonding site to Si.
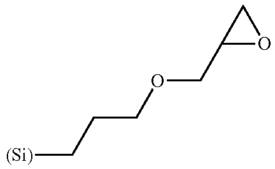
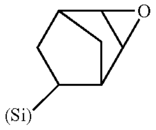
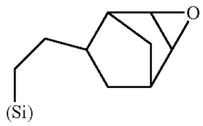
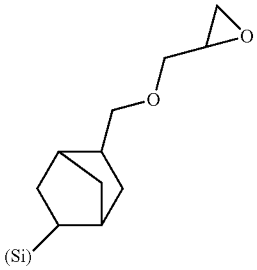
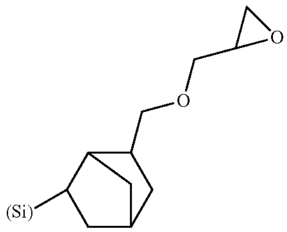
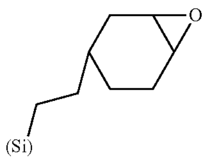
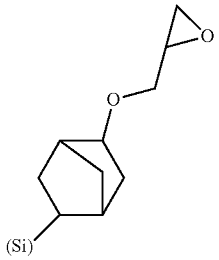
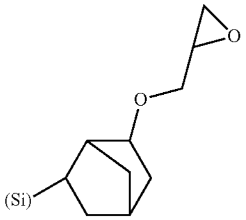
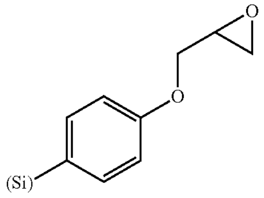
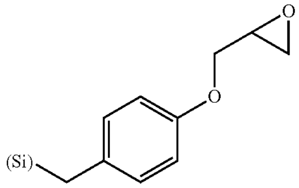
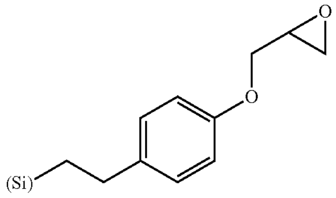
-continued
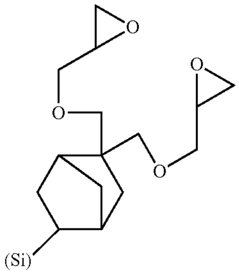
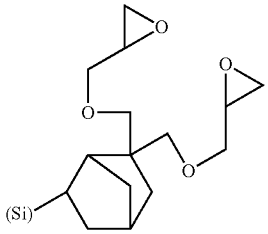
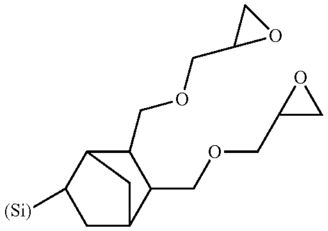
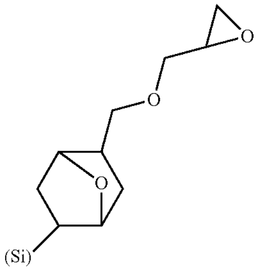
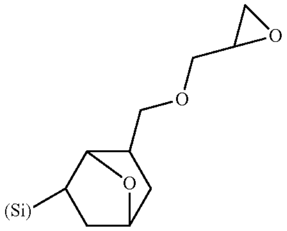
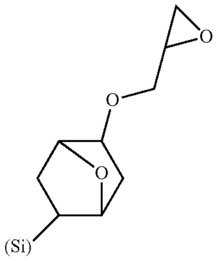
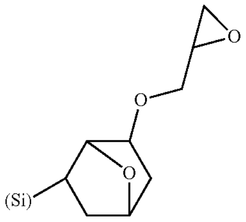
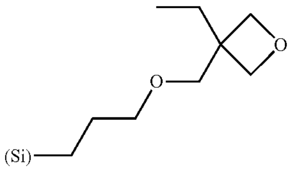
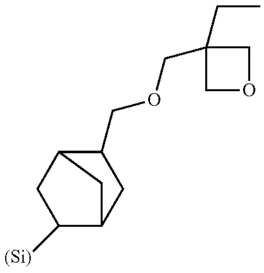

-continued
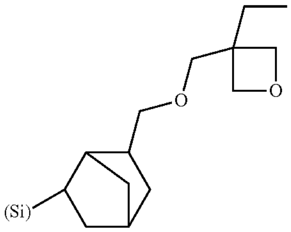
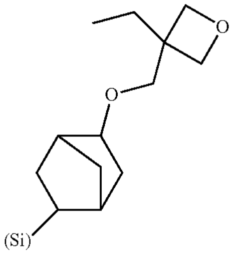
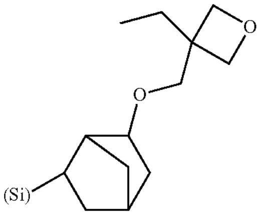
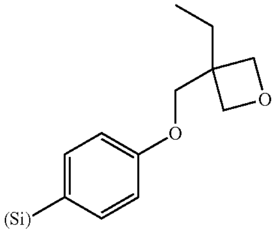
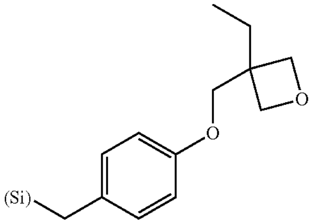
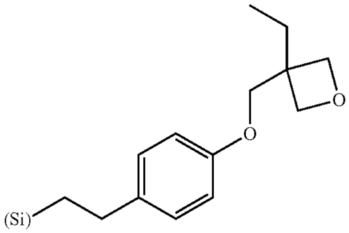
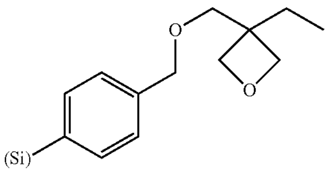
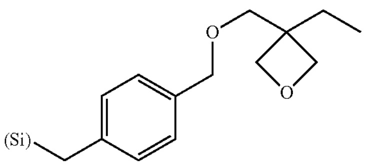
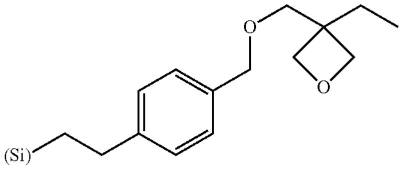
-continued
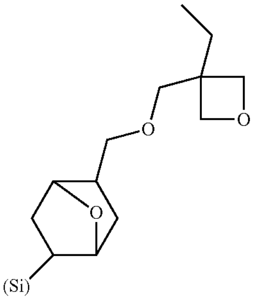
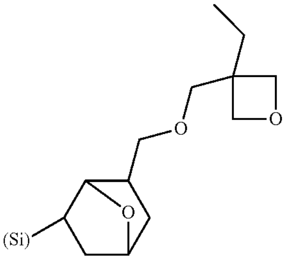
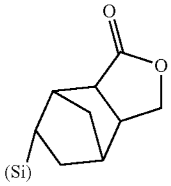
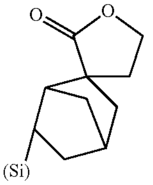
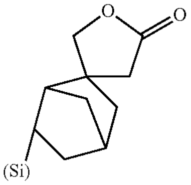
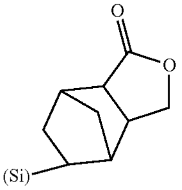
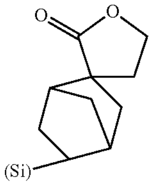
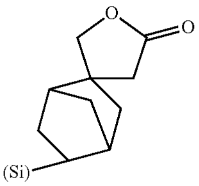
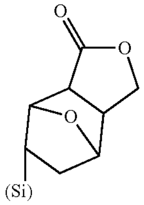
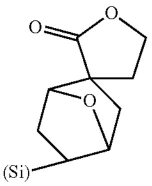
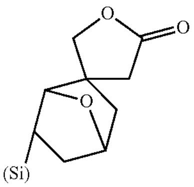
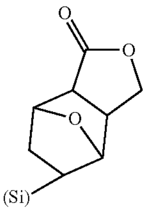
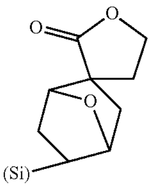
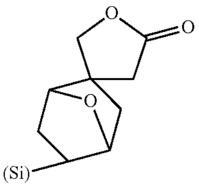
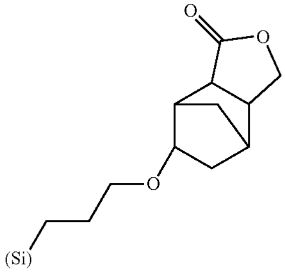

-continued
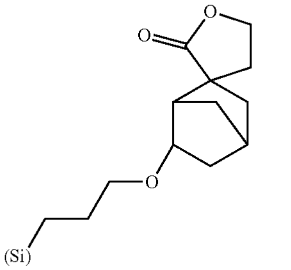
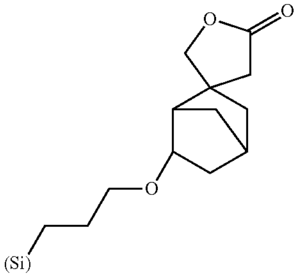
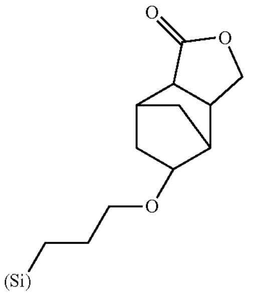
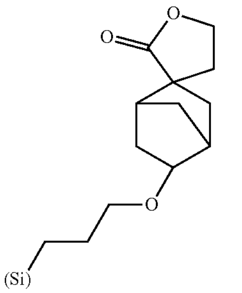
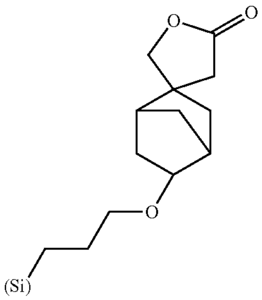
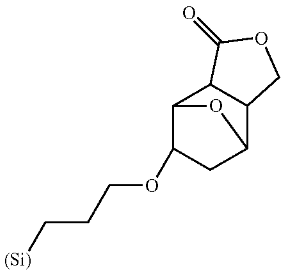
-continued
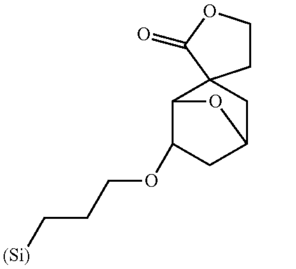
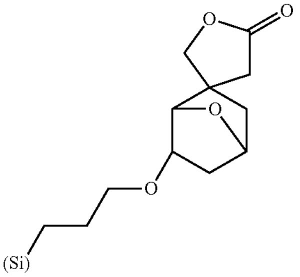
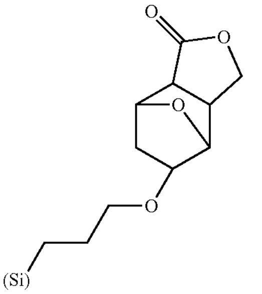
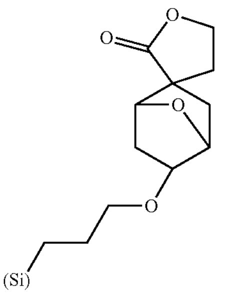
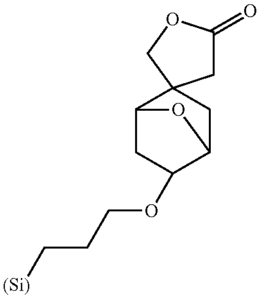
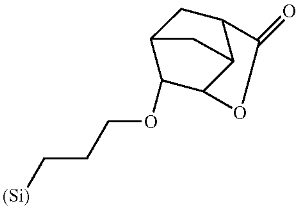
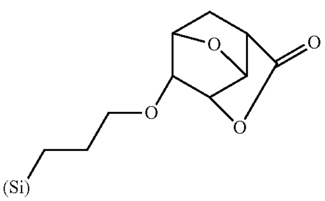
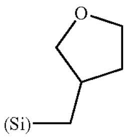
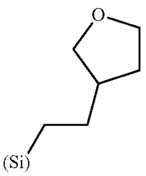
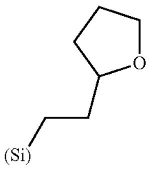
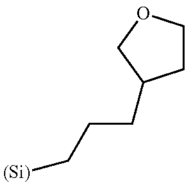

-continued
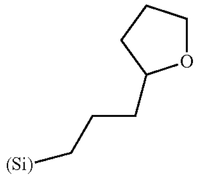
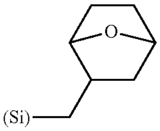
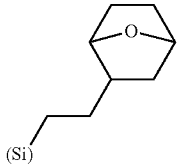
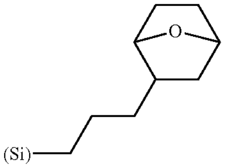
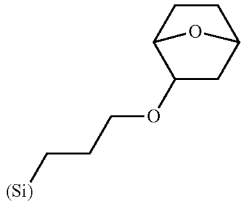
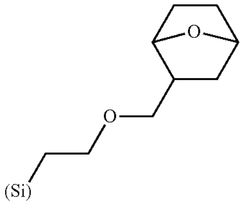
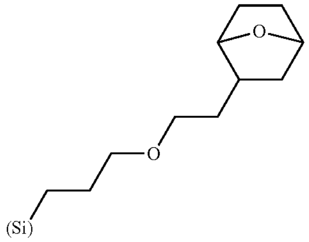
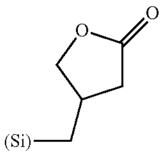
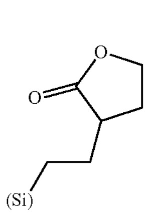
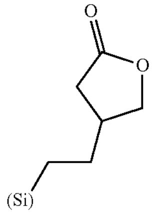
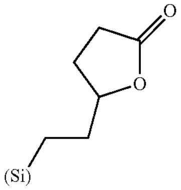
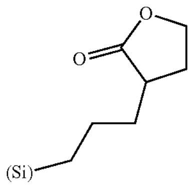
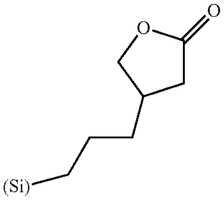
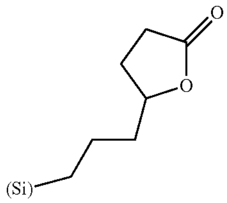
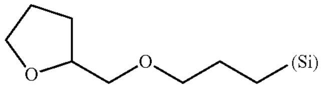
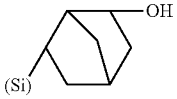
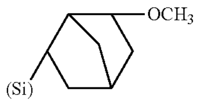
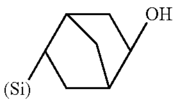
-continued
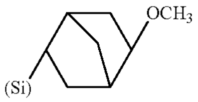
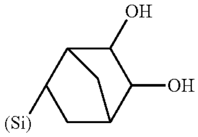
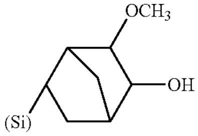
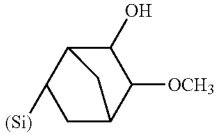
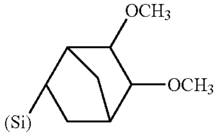
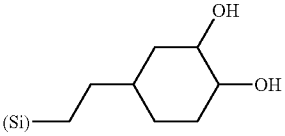
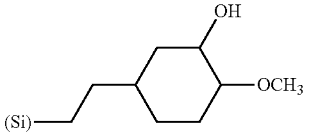
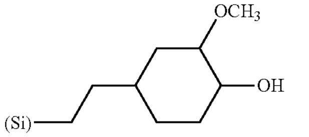
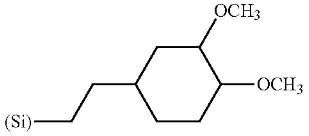
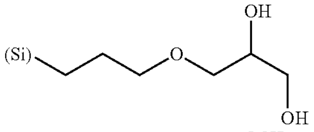
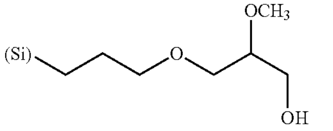
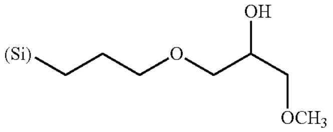
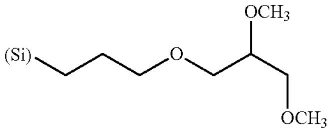
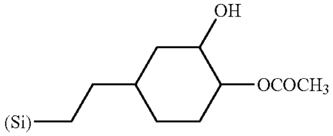
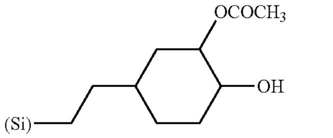
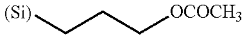
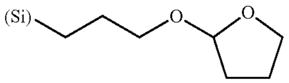

-continued

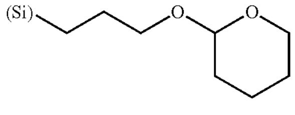

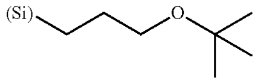

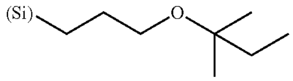

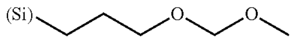

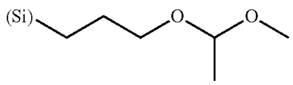

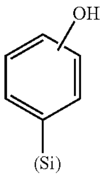

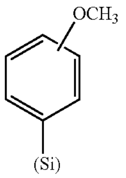

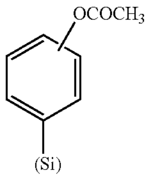

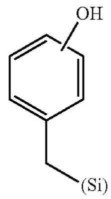

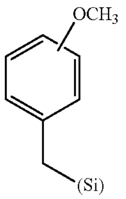

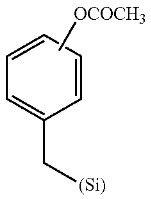

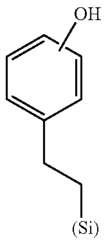

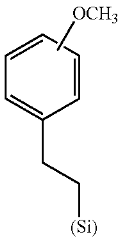

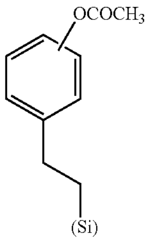

Moreover, as an example of the organic group of $R^1$, $R^2$, and $R^3$, an organic group containing a silicon-silicon bond can also be used. Specific examples thereof include the following.

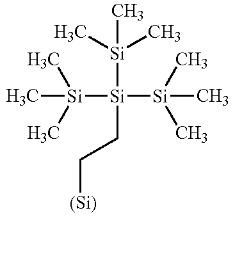

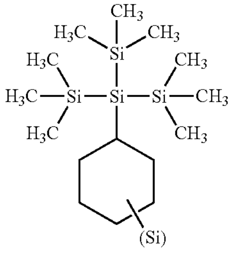

-continued

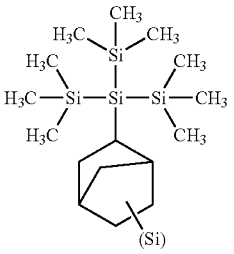

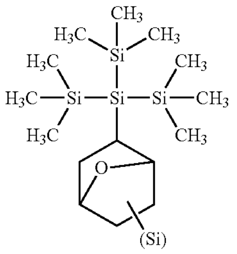

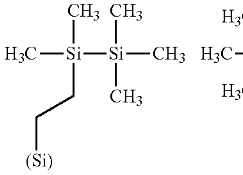

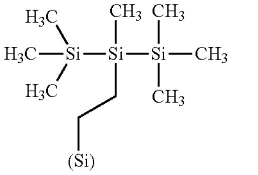

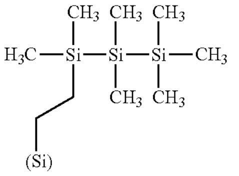

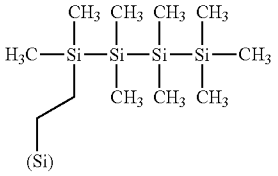

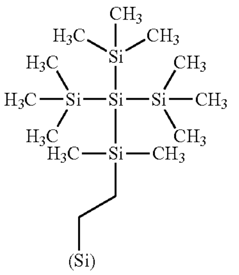

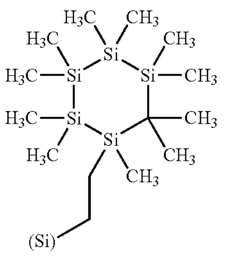

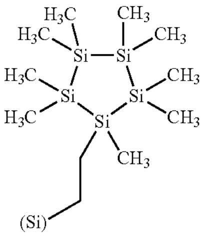

Moreover, as an example of the organic group of $R^1$, $R^2$, and $R^3$, an organic group having a protective group that is decomposed with an acid can also be used. Specific examples thereof include organic groups shown from paragraphs (0043) to (0048) of Japanese Unexamined Patent Application Publication No. 2013-167669, and organic groups obtained from silicon compounds shown in paragraph (0056) of Japanese Unexamined Patent Application Publication No. 2013-224279.

Further, as an example of the organic group of $R^1$, $R^2$, and $R^3$, an organic group having a fluorine atom can also be used. Specific examples thereof include organic groups obtained from silicon compounds shown from paragraphs (0059) to (0065) of Japanese Unexamined Patent Application Publication No. 2012-53253.

In the hydrolysable monomer (Sm), one, two, or three among chlorine, bromine, iodine, an acetoxy group, a methoxy group, an ethoxy group, a propoxy group, a butoxy group, and so forth are bonded as a hydrolysable group(s) on silicon shown by (Si) in the partial structure.

[Method for Synthesizing Thermally Crosslinkable Polysiloxane (Sx)]

(Synthesis Method 1: Acid Catalyst)

The inventive thermally crosslinkable polysiloxane (Sx) can be produced by hydrolysis condensation of one of the hydrolysable monomers (Sm) or a mixture of two or more kinds thereof in the presence of an acid catalyst.

Examples of the acid catalyst used in this event include organic acids such as formic acid, acetic acid, oxalic acid, maleic acid, methanesulfonic acid, benzenesulfonic acid, and toluenesulfonic acid; hydrofluoric acid, hydrochloric acid, hydrobromic acid, sulfuric acid, nitric acid, perchloric acid, phosphoric acid, and the like. The catalyst can be used in an amount of $1\times10^{-6}$ to 10 mol, preferably $1\times10^{5}$ to 5 mol, more preferably $1\times10^{-4}$ to 1 mol, relative to 1 mol of the monomer.

When the thermally crosslinkable polysiloxane (Sx) is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is 100 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a small amount, only a small reaction vessel is required and economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such, as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the thermally crosslinkable polysiloxane solution is mixed with water, and the thermally crosslinkable polysiloxane is extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the thermally crosslinkable polysiloxane escapes into the aqueous layer, so that substantially the same effect as fractionation operation is obtained in some cases. Hence, the number of water-washing operations and the amount of washing water may be appropriately determined in view of the catalyst removal effect and the fractionation effect.

To a solution of either the thermally crosslinkable polysiloxane with the acid catalyst still remaining or the thermally crosslinkable polysiloxane with the acid catalyst having been removed, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermally crosslinkable polysiloxane may become unstable by the solvent exchange. This occurs due to incompatibility of the thermally crosslinkable polysiloxane with the final solvent. Thus, in order to prevent this phenomenon, a monohydric, dihydric, or polyhydric alcohol having cyclic ether substituent as shown in paragraphs (0181) to (0182) of Japanese Unexamined Patent Application Publication No. 2009-126940 may be added as a stabilizer. The alcohol may be added in an amount of 0 to 25 parts by mass, preferably 0 to 15 parts by mass, more preferably 0 to 5 parts by mass, based on 100 parts by mass of the thermally crosslinkable polysiloxane in the solution before the solvent exchange. When the alcohol is added, the amount is preferably 0.5 parts by mass or more. If necessary, the monohydric, dihydric, or polyhydric alcohol having cyclic ether substituent may be added to the solution before the solvent exchange operation.

If the thermally crosslinkable polysiloxane is concentrated above a certain concentration level, the condensation reaction may further progress, so that the thermally crosslinkable polysiloxane becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermally crosslinkable polysiloxane solution is preferably an alcohol-based solvent, particularly preferably monoalkyl ether derivatives of ethylene glycol, diethylene glycol, triethylene glycol, propylene glycol, dipropylene glycol, butanediol, and so on. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, and the like.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

As an alternative reaction operation using an acid catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The organic solvent is used in an amount of preferably 0 to 1,000 ml, particularly preferably 0 to 500 ml, relative to 1 mol of the monomer. When the organic solvent is used in a small amount, only a small reaction vessel is required and economical. The obtained reaction mixture may be subjected to post-treatment by the same procedure as mentioned above to obtain a thermally crosslinkable polysiloxane.

(Synthesis Method 2: Alkali Catalyst)

Alternatively, the thermally crosslinkable polysiloxane (Sx) can be produced by hydrolysis condensation of one of the hydrolysable monomers (Sm) or a mixture of two or more kinds thereof in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst can be used in an amount of $1\times10^{-6}$ mol to 10 mol, preferably $1\times10^{-5}$ mol to 5 mol, more preferably $1\times10^{-4}$ mol to 1 mol, relative to 1 mol of the silicon monomer.

When the thermally crosslinkable polysiloxane is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the catalyst used in the hydrolysis condensation, the thermally crosslinkable polysiloxane may be extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, a mixture of a water-soluble organic solvent and a slightly-water-soluble organic solvent can also be used.

As concrete examples of the organic solvent used for removing the alkali catalyst, it is possible to use the aforementioned organic solvents specifically exemplified for the acid catalyst removal or the same mixtures of the water-soluble organic solvent and the slightly-water-soluble organic solvent.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

To the washed thermally crosslinkable polysiloxane solution, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the thermally crosslinkable polysiloxane solution is preferably an alcohol-based solvent, particularly preferably a monoalkyl ether of ethylene glycol, diethylene glycol, triethylene glycol, etc. and a monoalkyl ether of propylene glycol, dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, and the like.

As an alternative reaction operation using an alkali catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The molecular weight of the thermally crosslinkable polysiloxane obtained by the above synthesis method 1 or 2 can be adjusted not only through the selection of the monomer but also by controlling the reaction conditions during the polymerization. When the weight average molecular weight is 100,000 or less, generation of foreign matters and coating spots is suppressed. Thus, it is preferable to use the thermally crosslinkable polysiloxane having a weight average molecular weight of 100,000 or less, more preferably 200 to 50,000, further preferably 300 to 30,000. Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Properties of the thermally crosslinkable polysiloxane used in the present invention vary depending on the kind of the acid or alkali catalyst used in the hydrolysis condensation and the reaction conditions. Thus, the catalyst and the reaction conditions can be appropriately selected in accordance with the characteristics of a resist underlayer film to be achieved.

Furthermore, a polysiloxane derivative produced from a mixture of one or more of the hydrolysable monomers (Sm) with a hydrolysable metal compound, shown by the following general formula (Mm) under the conditions using the acid or alkali catalyst can be used as a component of a composition for forming a resist underlayer film.

$$U(OR^7)_{m7}(OR^8)_{m8} \quad (Mm)$$

In the formula, $R^7$ and $R^8$ each represent an organic group having 1 to 30 carbon atoms; m7+m8 represents the same number of a valence determined by the kind of U; m7 and m8 each represent an integer of 0 or more; and U represents an element belonging to the group III, IV, or V in the periodic table, except for carbon and silicon.

Examples of the hydrolysable metal compound shown by the general formula (Mm) used in this event include the following. When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy(ethyl acetoacetate), aluminum dibutoxy(ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy(ethyl acetoacetate), gallium dibutoxy(ethyl acetoacetate), gallium propoxy bis (ethyl acetoacetate), gallium butoxy bis(ethyl acetoacetate), gallium 2,4-pentanedionate, gallium 2,2,6,6-tetramethyl-3, 5-heptanedionate, and the like.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethdxide, yttrium ethoxyethoxide, yttrium dipropoxy(ethyl acetoacetate), yttrium dibutoxy(ethyl acetoacetate), yttrium propoxy bis (ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis (ethyl acetoacetate), titanium dipropoxy bis(2,4-pentanedionate), titanium dibutoxy bis(2, 4-pentanedionate), and the like.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis(2,4-pentanedionate), hafnium dibutoxy bis(2, 4-pentanedionate), and the like.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as monomers, methoxy arsenic, ethoxy arsenic, propoxy arsenic, butoxy arsenic, phenoxy arsenic, and the like.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as monomers, methoxy niobium, ethoxy niobium, propoxy niobium, butoxy niobium, phenoxy niobium, and the like.

When U is tantalum, examples of the compound shown by the general formula (Mm) include, as monomers, methoxy tantalum, ethoxy tantalum, propoxy tantalum, butoxy tantalum, phenoxy tantalum, and the like.

When U is bismuth, examples of the compound shown by the general formula (Mm) include, as monomers, methoxy bismuth, ethoxy bismuth, propoxy bismuth, butoxy bismuth, phenoxy bismuth, and the like.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2, 6,6-tetramethyl-3,5-heptanedionate), and the like.

[Other Components]

(Crosslinking Catalyst)

In the present invention, a crosslinking catalyst (Xc) may be blended into the composition for forming a resist underlayer film. An example of the blendable crosslinking catalyst (Xc) includes a compound shown by the following general formula (Xc0):

$$L_aH_bA \quad \text{(Xc0)}$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst (Xc) used in the present invention as specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) are shown below.

(Xc-1)

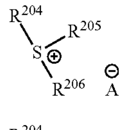

(Xc-2)

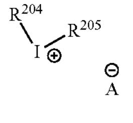

(Xc-3)

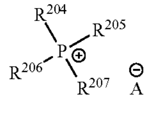

Moreover, an example of the ammonium salt (Xc-4) is shown below.

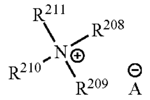

(Xc-4)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{208}$, $R^{209}$, $R^{210}$, and $R^{211}$ are the same as $R^{204}$, $R^{205}$, $R^{206}$, and $R^{207}$, and may be each a hydrogen atom. $R^{208}$ and $R^{209}$, or $R^{208}$ and $R^{209}$ and $R^{210}$, may form a ring; when a ring is formed, $R^{208}$ and $R^{209}$, or $R^{208}$ and $R^{209}$ and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specific examples thereof include alkyl groups such as a methyl group, an ethyl group, a propyl group, an isopropyl group, an n-butyl group, a sec-butyl group, a tert-butyl group, a pentyl group, a hexyl group, a heptyl group, and an octyl group; a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion A include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Meanwhile, specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethyliphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenyllammonium formate, benzyldimethylphenyllammonium acetate, benzyldimethylphenyllammonium propionate, benzyldimethylphenyllammonium butanoate, benzyldimethylphenyllammonium benzoate, benzyldimethylphenyllammonium phthalate, benzyldimethylphenyllammonium isophthalate, benzyldimethylphenyllammonium terephthalate, benzyldimethylphenyllammonium salicylate, benzyldimethylphenyllammonium trifluoromethanesulfonate, benzyldimethylphenyllammonium trifluoroacetate, benzyldimethylphenyllammonium monochloroacetate, benzyldimethylphenyllammonium dichloroacetate, benzyldimethylphenyllammonium trichloroacetate, benzyldimethylphenyllammonium hydroxide, benzyldimethylphenyllammonium nitrate, benzyldimethylphenyllammonium chloride, benzyldimethylphenyllammonium bromide, benzyldimethylphenyllammonium iodide, benzyldimethylphenyllammonium methanesulfonate, benzyidimethylphenyllammonium monomethylsulfate, benzyldimethylphenyllammonium oxalate, benzyldimethylphenyllammonium malonate, benzyldimethylphenyllammonium maleate, benzyldimethylphenyllammonium fumarate, benzyldimethylphenyllammonium citraconate, benzyldimethylphenyllammonium citrate, benzyldimethylphenyllammonium carbonate, bisbenzyldimethylphenyllammonium oxalate, bisbenzyldimethylphenyllammonium malonate, bisbenzyldimethylphenyllammonium maleate, bisbenzyldimethylphenyllammonium fumarate, bisbenzyldimethylphenyllammonium citraconate, bisbenzyldimethylphenyllammonium citrate, bisbenzyldimethylphenyllammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a polysiloxane (Xc-10) having a structure partially containing one of the sulfonium salt, the iodonium salt, the phosphonium salt, and the ammonium salt may be blended as the crosslinking catalyst (Xc) into the composition for forming a resist underlayer film.

As a raw material for producing (Xc-10) used here, it is possible to employ a compound shown by the following general formula (Xm):

$$R^{1A}{}_{A1}R^{2A}{}_{A2}R^{3A}{}_{A3}Si(OR^{0A})_{(4-A1-A2-A3)} \quad (Xm)$$

where $R^{0A}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that 1≤A1+A2+A3≤3.

Here, examples of $OR^{0A}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes a compound shown by the following general formula (Xm-1), which shows a hydrolysable silicon compound having a structure partially containing the sulfonium salt:

(Xm-1)

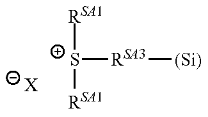

where $R^{SA1}$ and $R^{SA2}$ each represent a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Note that, in the general formula (Xm-1), (Si) is depicted to show a bonding site to Si.

Examples of $X^-$ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specific examples of the cation moiety in the compound shown by the general formula (Xm-1) include the following ions.

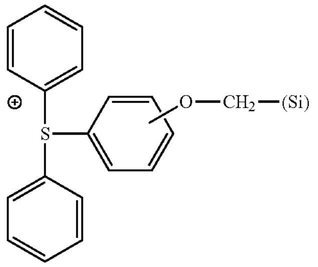

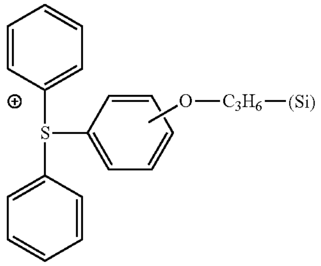

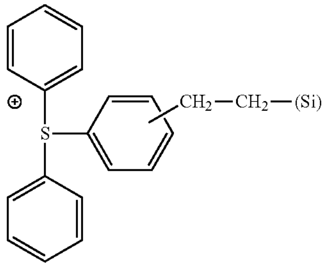

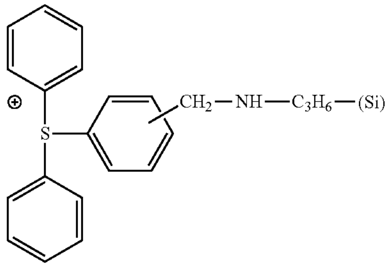

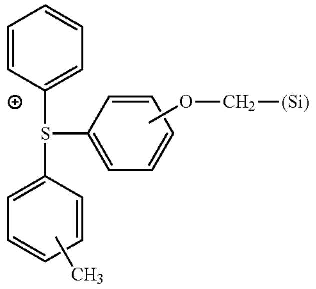

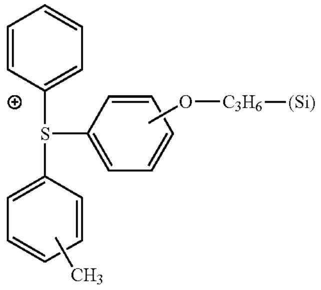

-continued
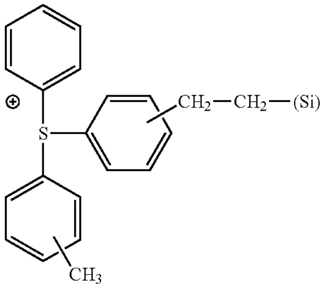
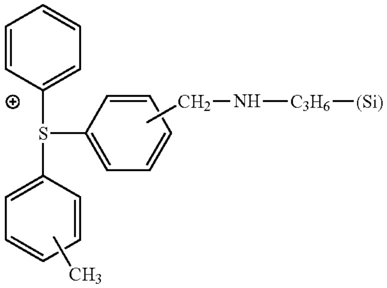
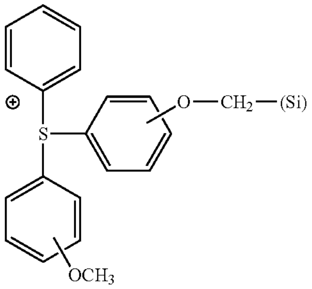
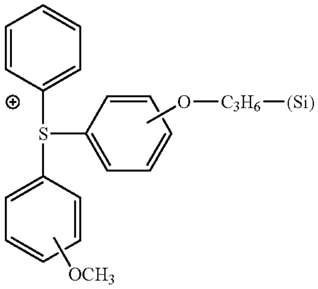
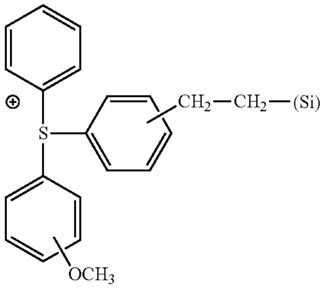
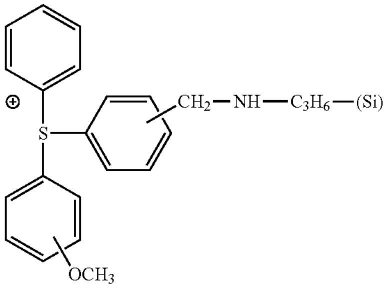
-continued
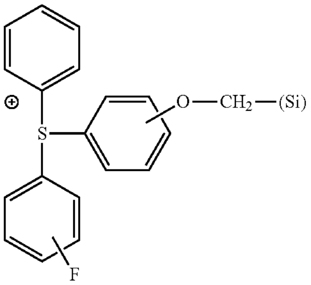
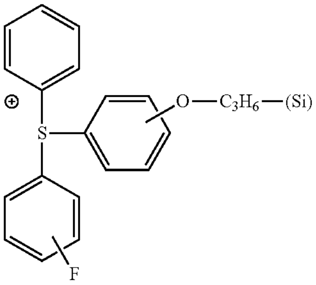
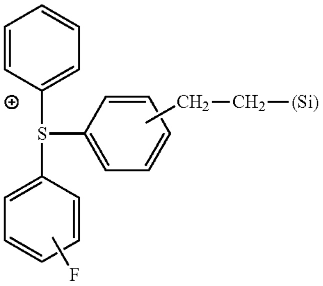
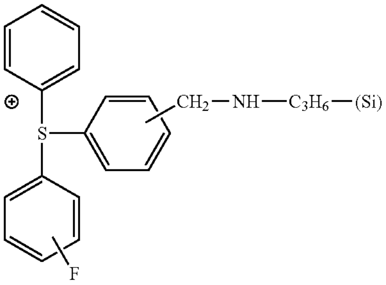
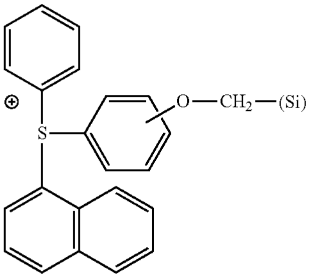
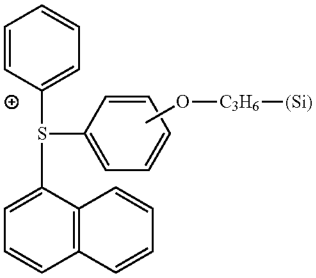

-continued

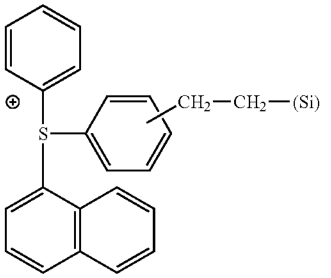

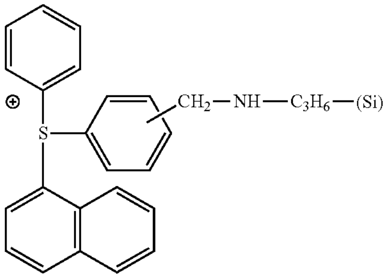

For example, a hydrolysable silicon compound having a structure partially containing the iodonium salt can be shown by the following general formula (Xm-2):

(Xm-2)

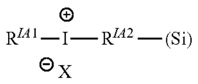

where $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Note that, in the general formula (Xm-2), (Si) is depicted to show a bonding site to Si. $X^-$ is as defined above.

Specific examples of the cation moiety in the compound shown by the general formula (Xm-2) include the following ions.

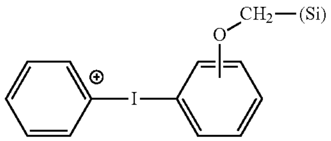

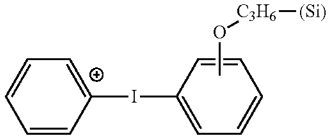

-continued

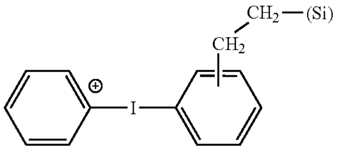

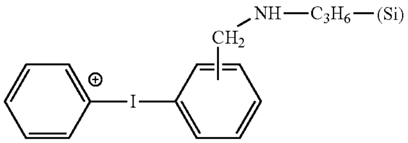

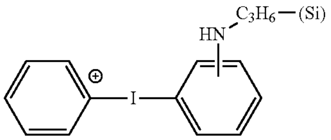

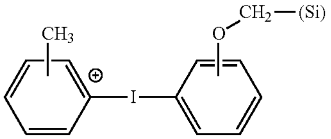

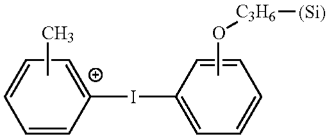

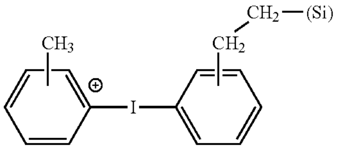

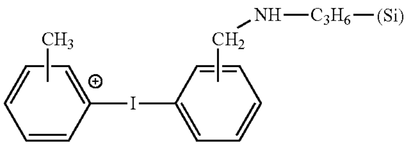

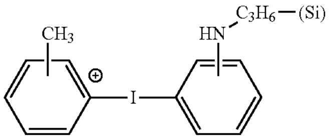

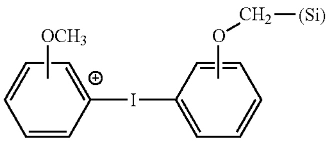

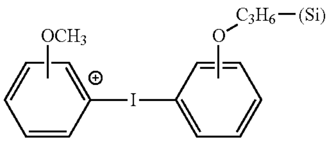

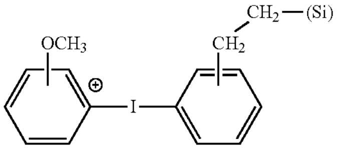

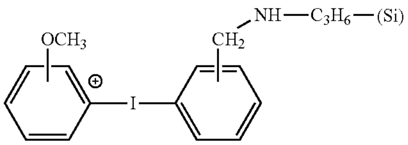

-continued

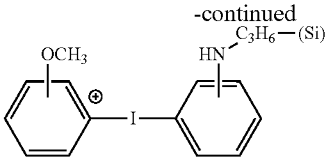

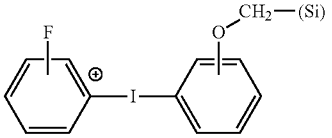

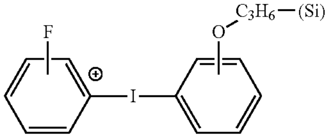

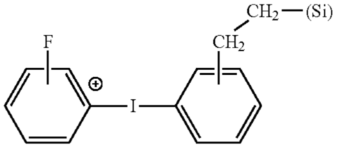

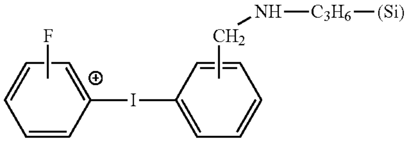

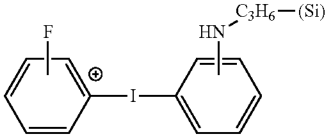

For example, a hydrolysable silicon compound having a structure partially containing the phosphonium salt can be shown by the following general formula (Xm-3):

(Xm-3)

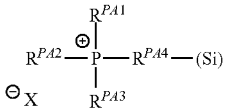

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Note that, in the general formula (Xm-3), (Si) is depicted to show a bonding site to Si. $X^-$ is as defined above.

Specific examples of the cation moiety in the compound shown by the general formula (Xm-3) include the following ions.

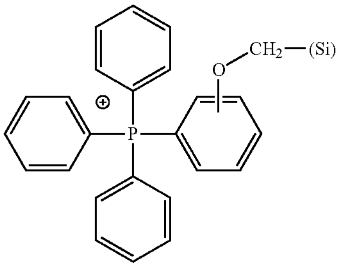

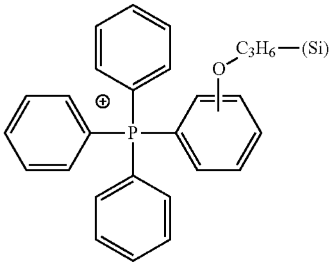

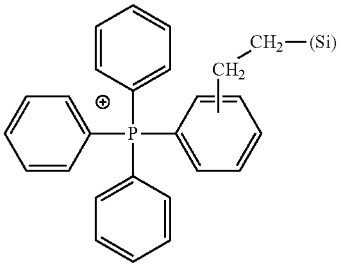

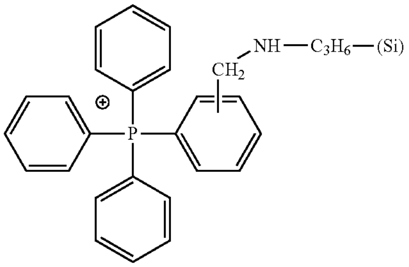

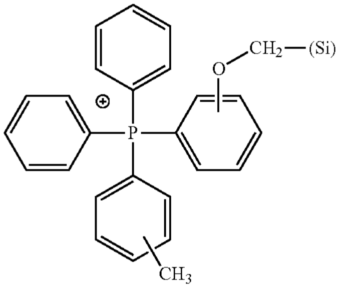

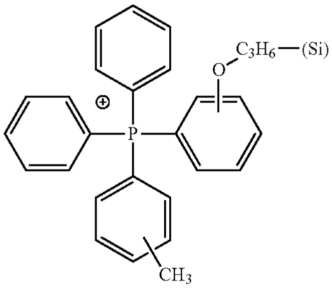

-continued
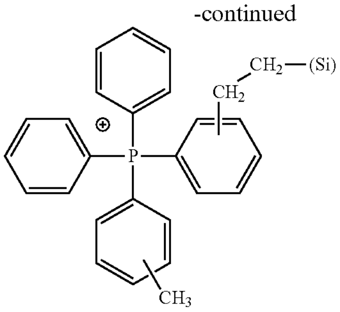
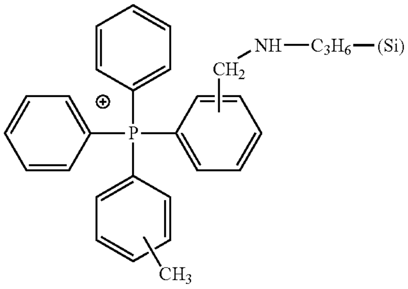
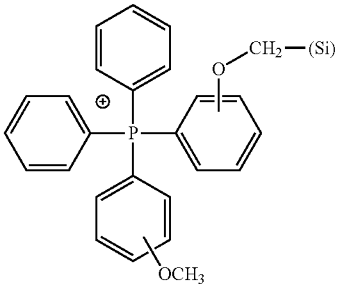
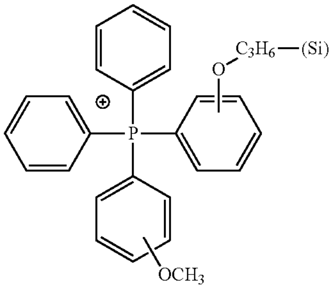
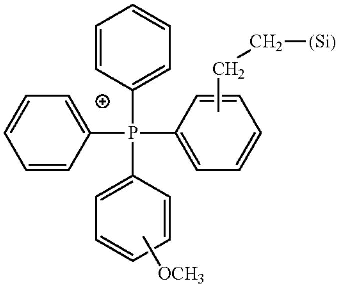
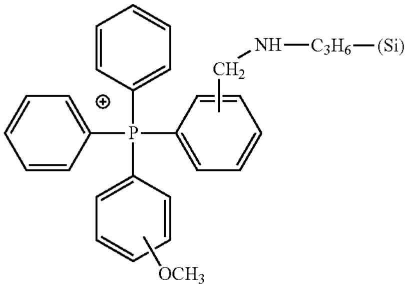
-continued
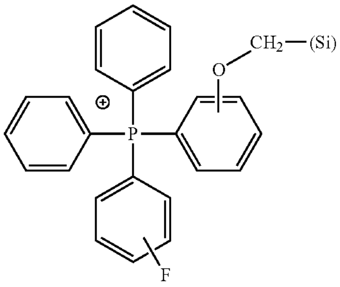
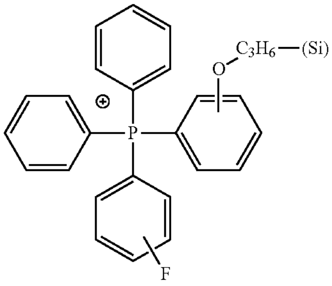
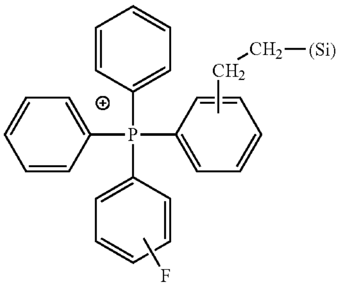
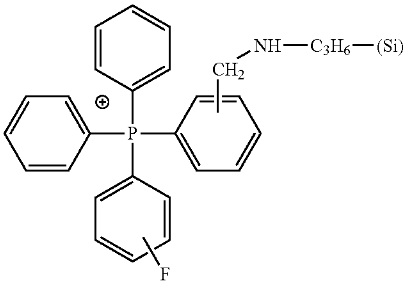
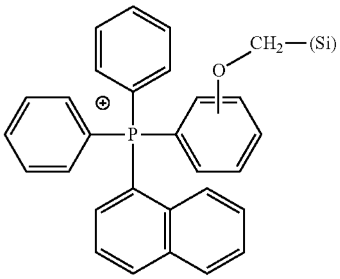
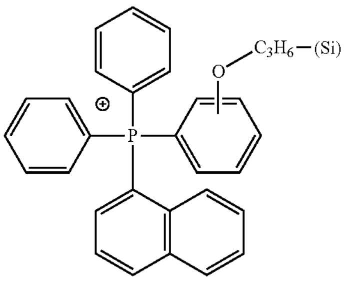

-continued
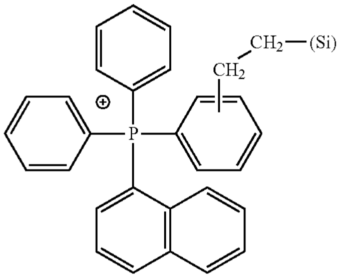
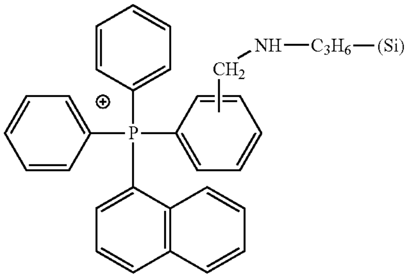
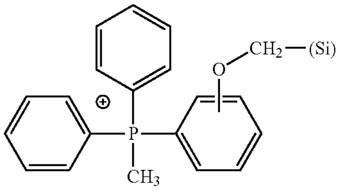
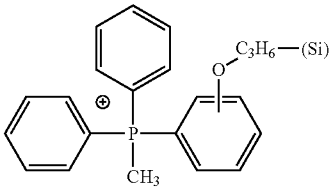
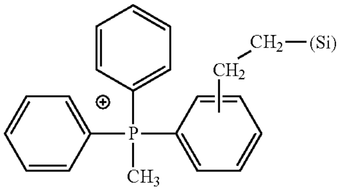
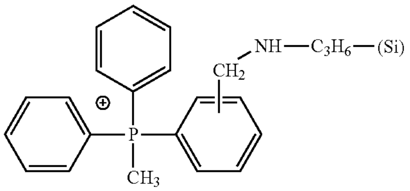
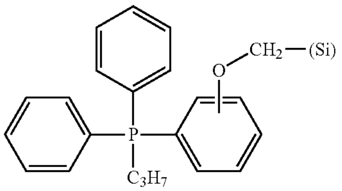
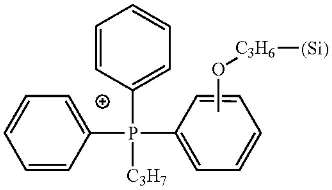
-continued
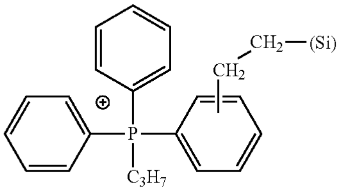
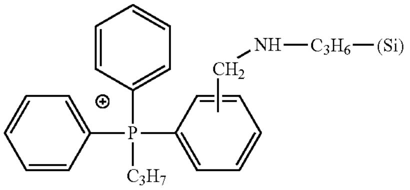
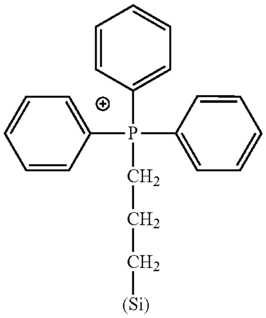
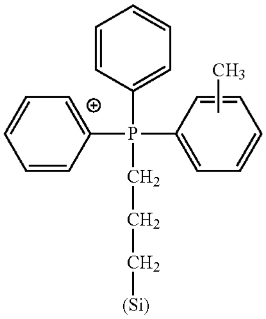
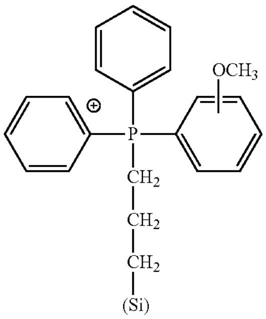
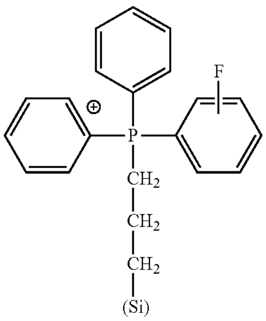
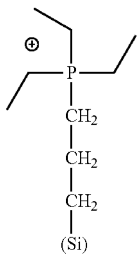

-continued

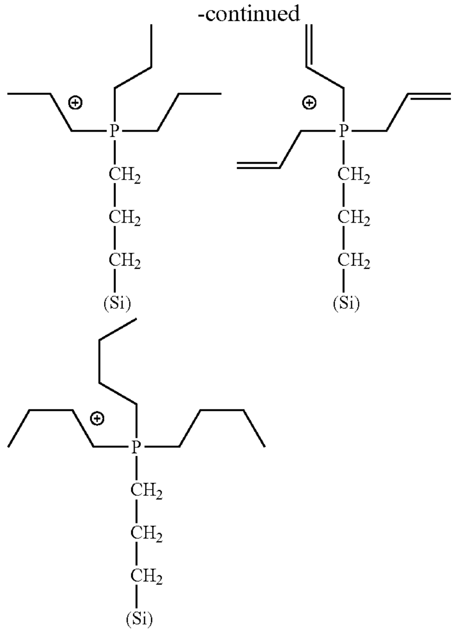

For example, a hydrolysable silicon compound having a structure partially containing the ammonium salt can be shown by the following general formula (Xm-4):

(Xm-4)

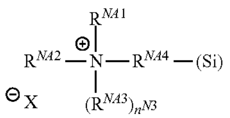

where $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a heterocyclic ring or heteroaromatic ring containing nitrogen. $R^{NA4}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{NA3}$=0; in the other cases, $n^{NA3}$=1.

Note that, in the general formula (Xm-4), (Si) is depicted to show a bonding site to Si. $X^-$ is as defined above.

Specific examples of the cation moiety in the compound shown by the general formula (Xm-4) include the following ions.

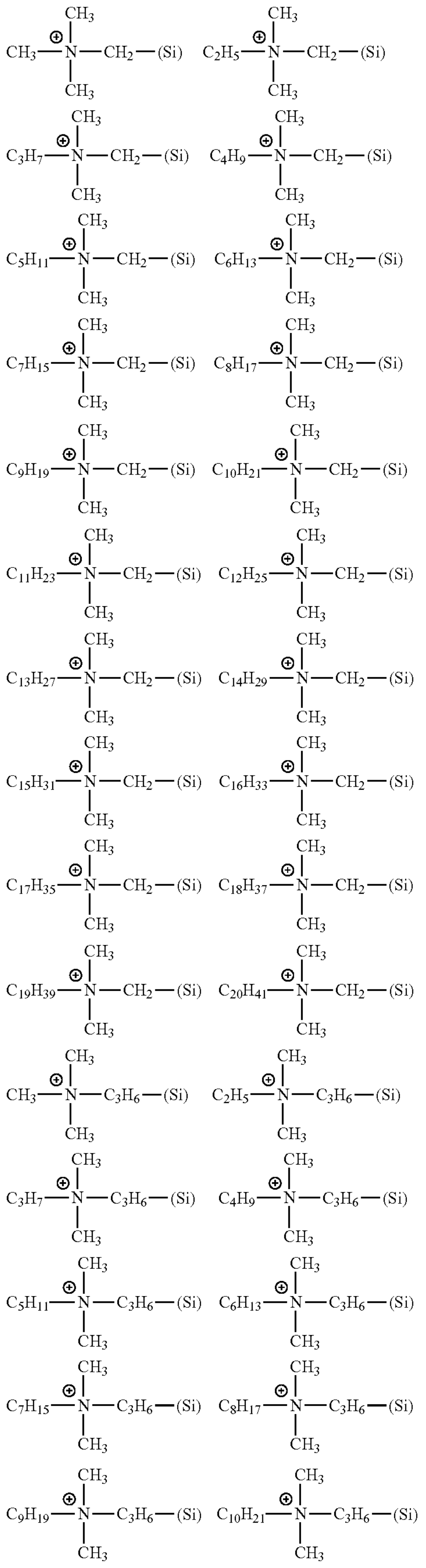

-continued
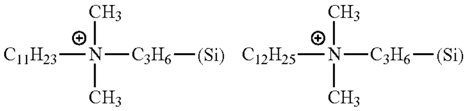
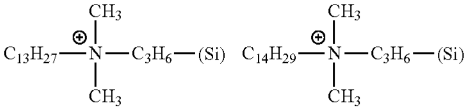
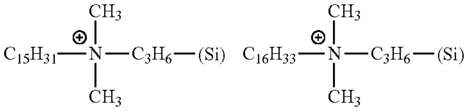
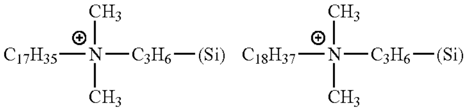
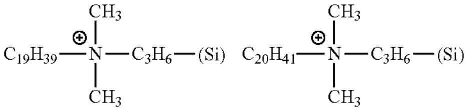
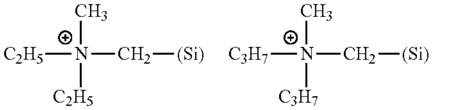
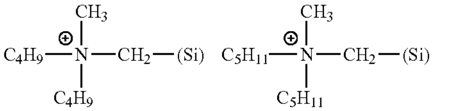
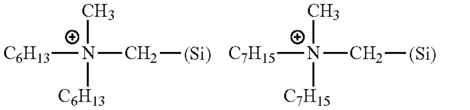
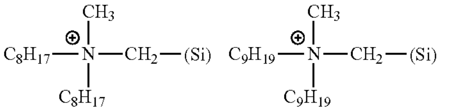
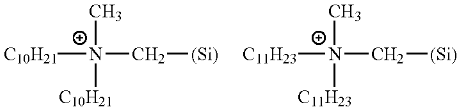
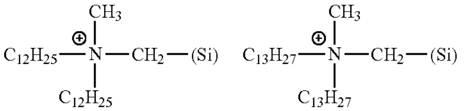
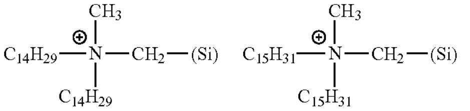
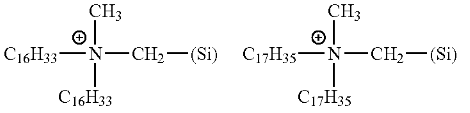
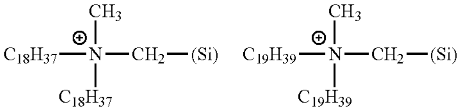
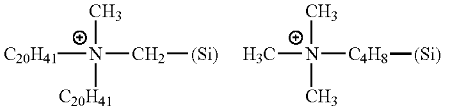
-continued
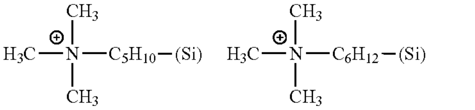
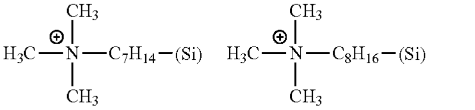
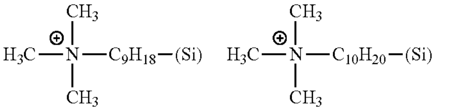
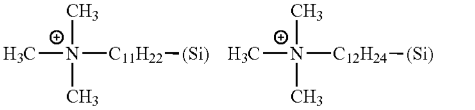
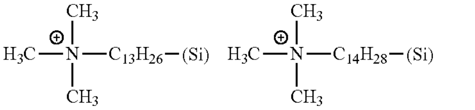
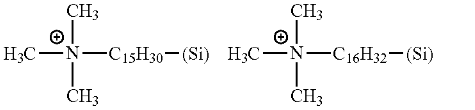
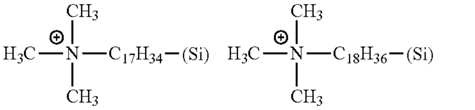
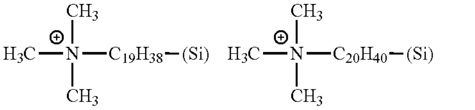
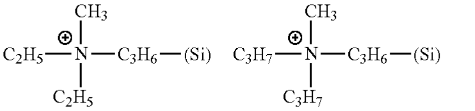
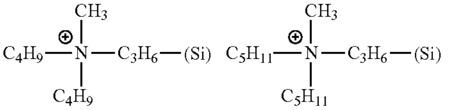
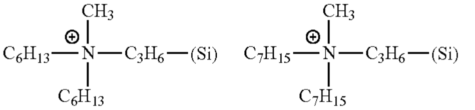
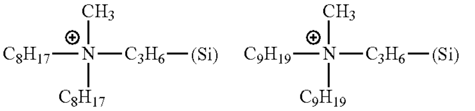
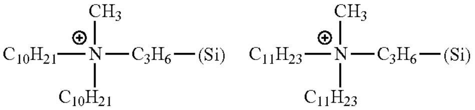
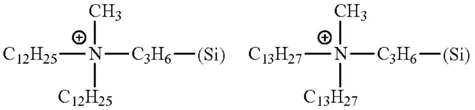
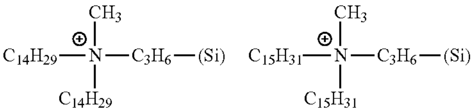

-continued
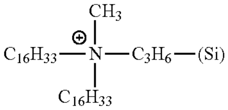
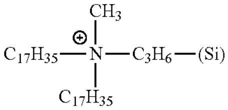
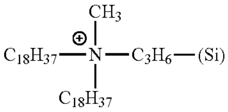
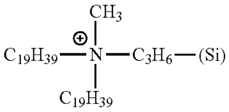
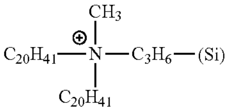
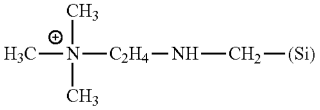
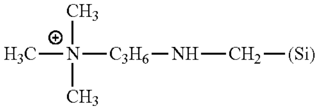
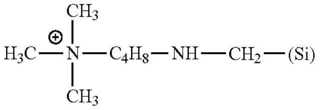
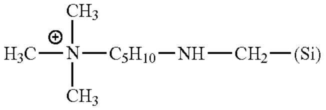
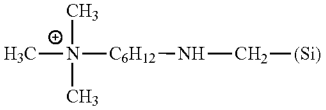
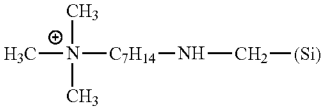
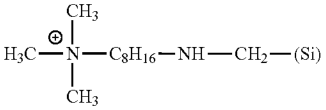
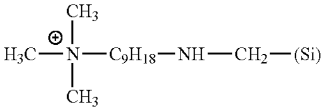
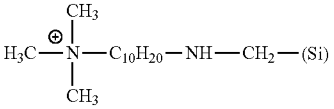
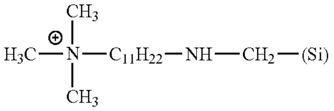
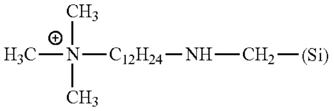
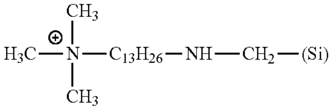
-continued
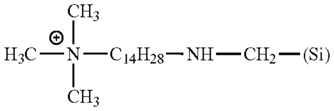
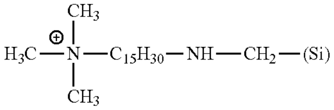
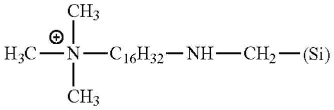
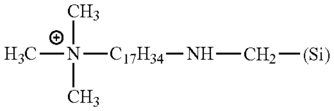
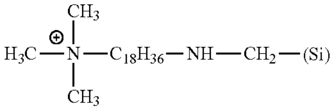
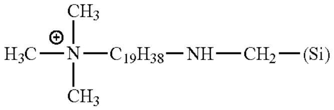
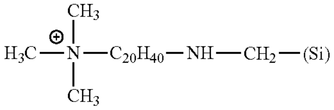
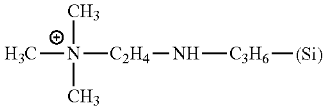
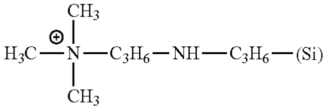
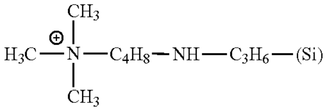
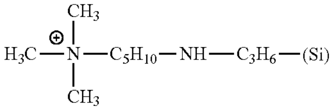
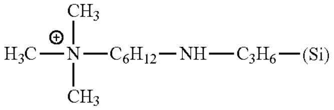
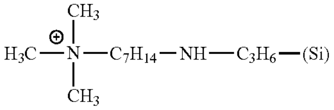
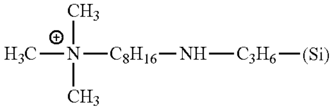
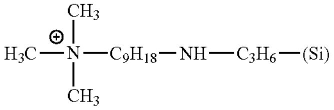

-continued
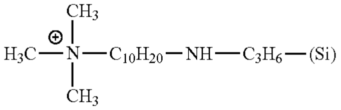
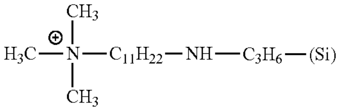
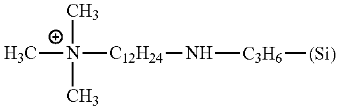
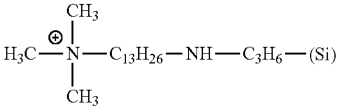
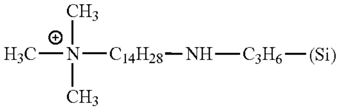
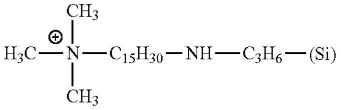
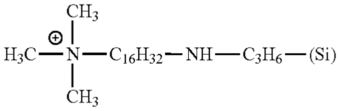
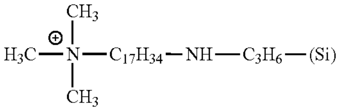
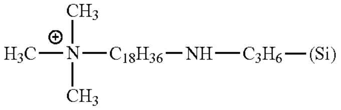
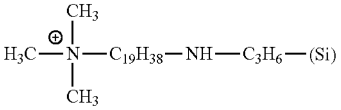
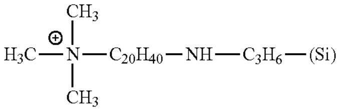
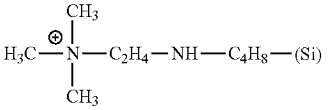
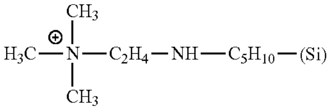
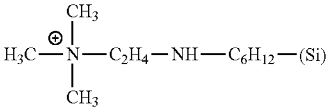
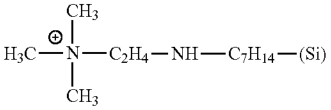
-continued
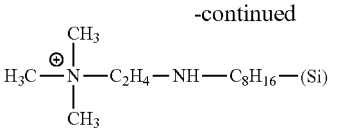
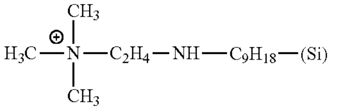
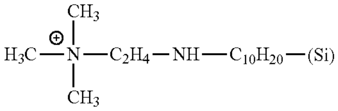
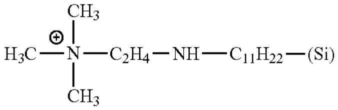
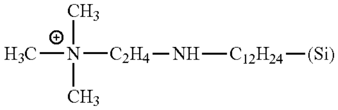
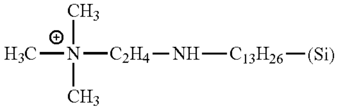
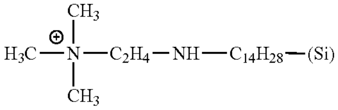
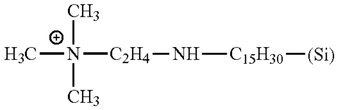
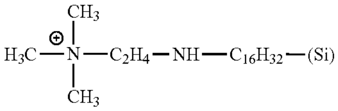
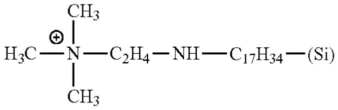
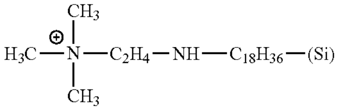
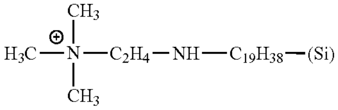
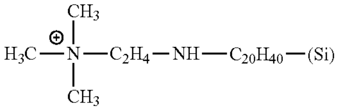
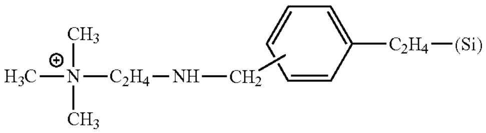
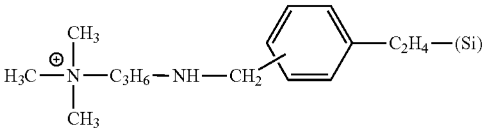

-continued
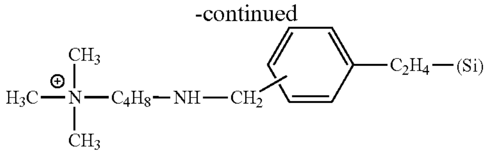
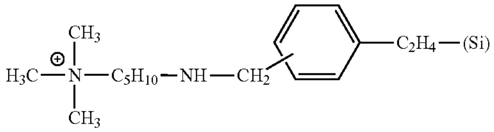
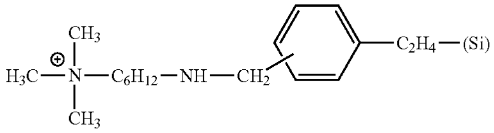
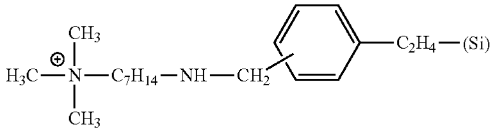
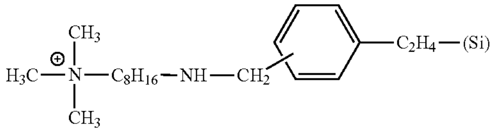
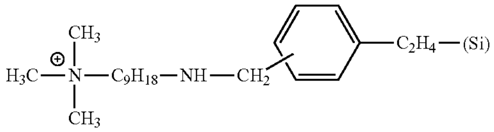
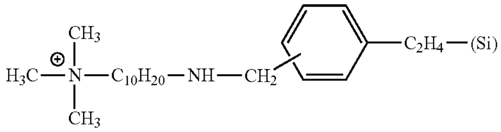
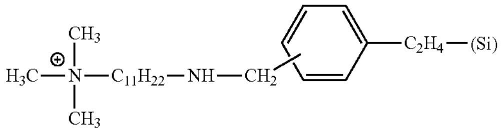
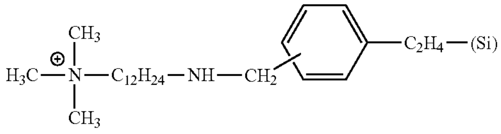
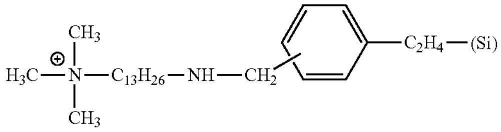
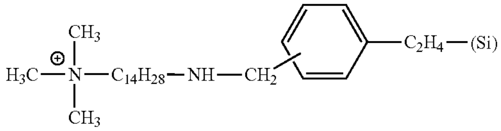
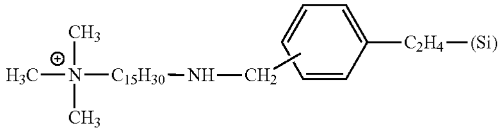
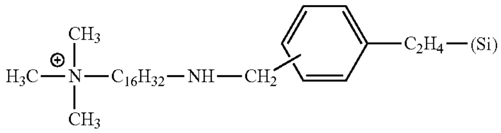
-continued
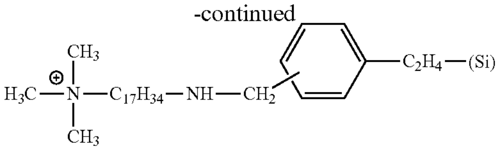
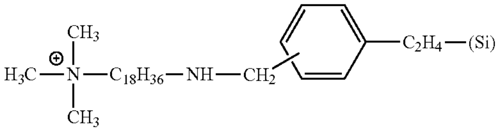
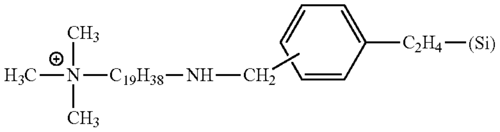
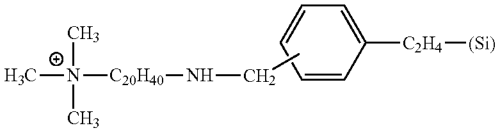
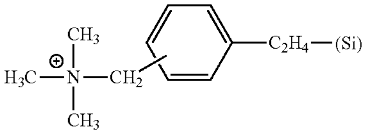
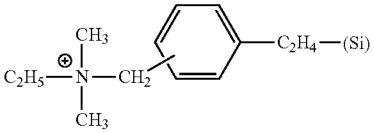
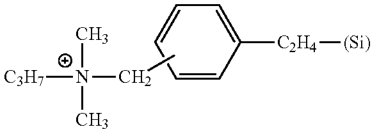
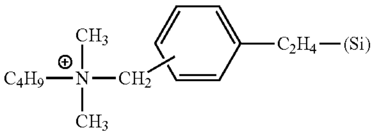
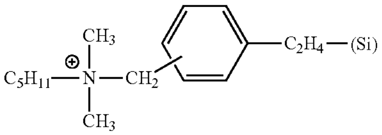
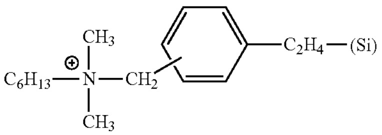
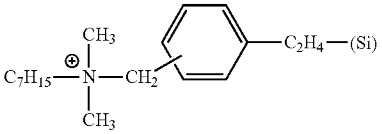
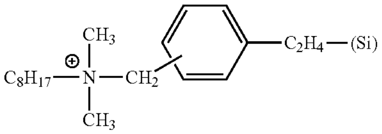
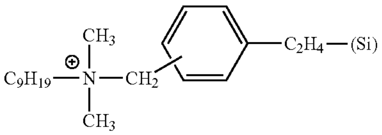

-continued
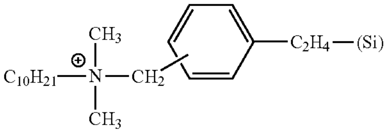
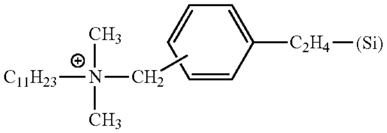
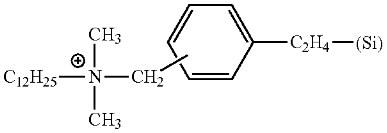
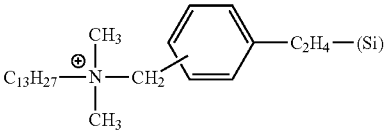
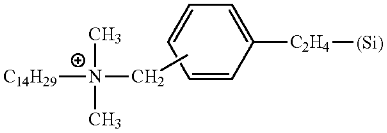
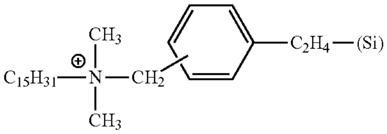
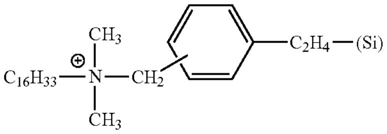
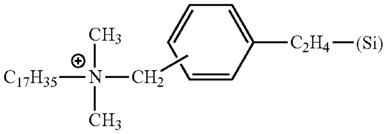
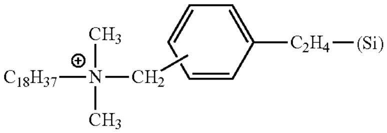
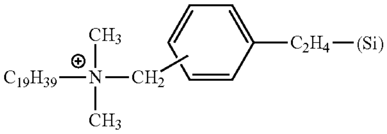
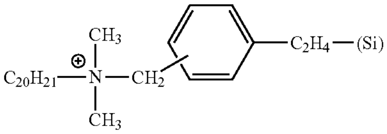
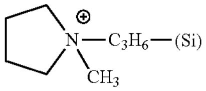
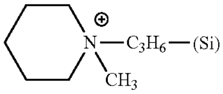
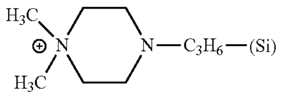
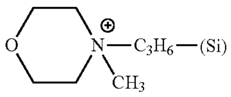
-continued
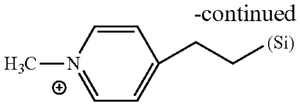
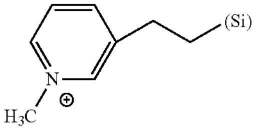
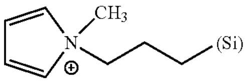
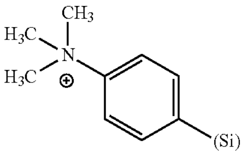
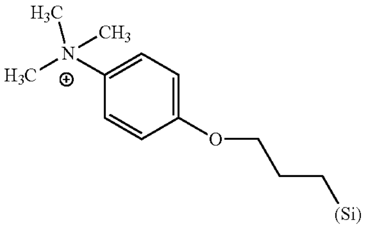
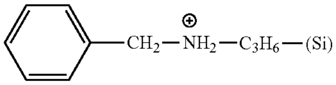
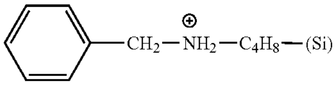
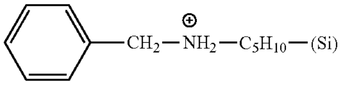
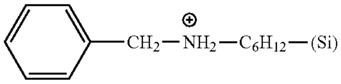
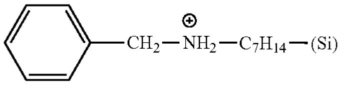
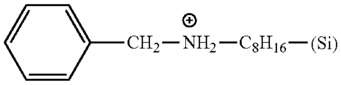
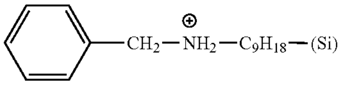
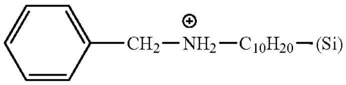
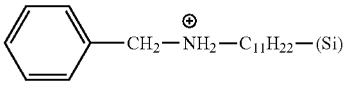
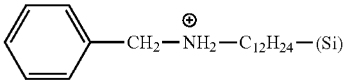
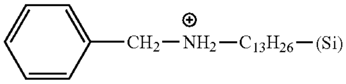
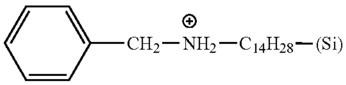
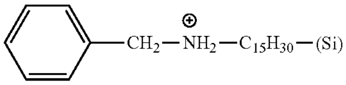

-continued
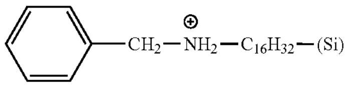
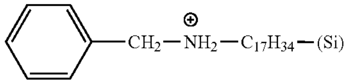
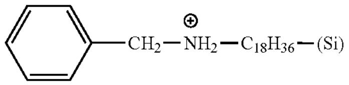
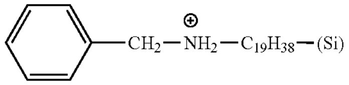
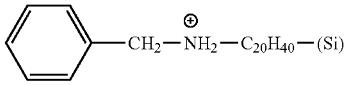
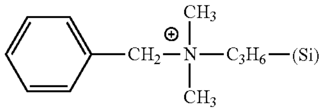
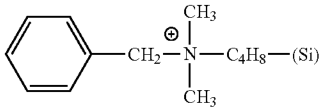
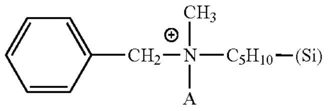
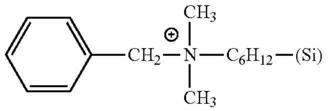
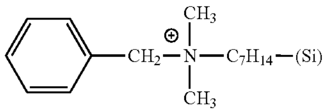
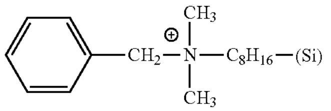
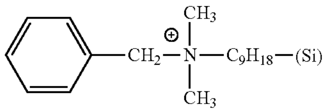
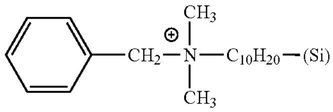
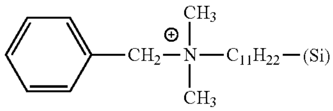
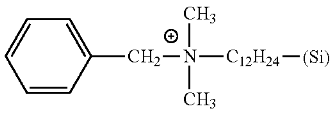
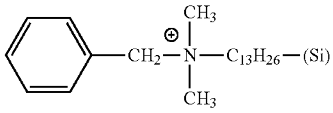
-continued
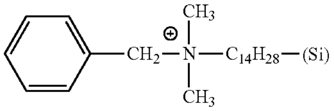
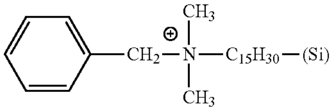
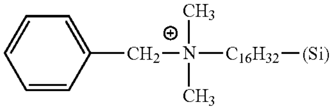
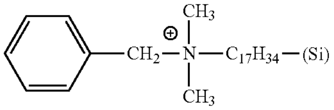
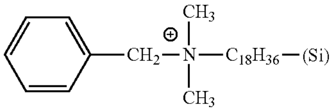
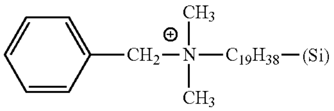
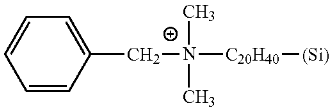
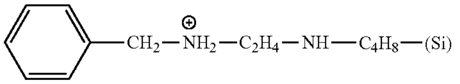
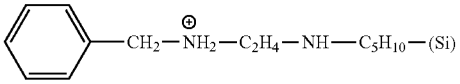
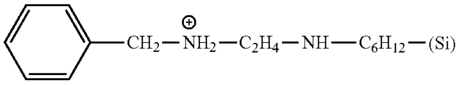
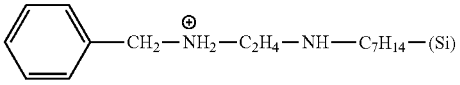
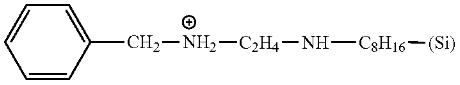
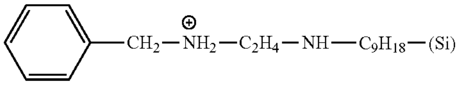
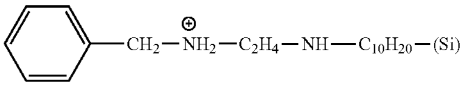
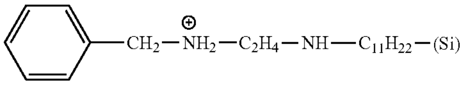
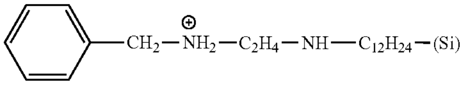
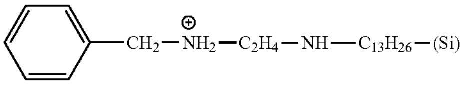
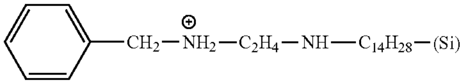

-continued
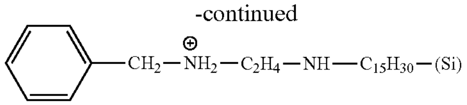
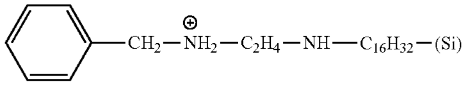
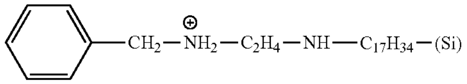
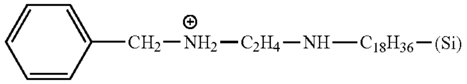
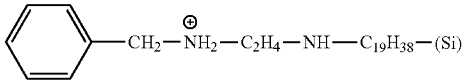
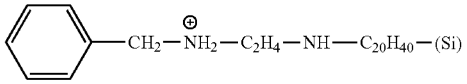
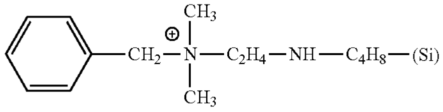
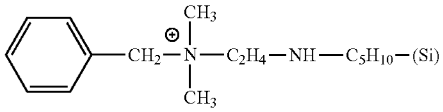
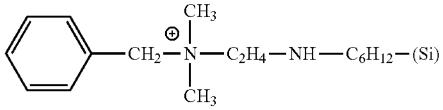
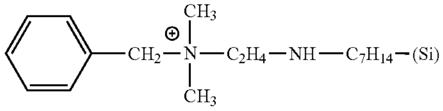
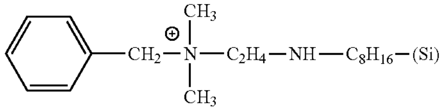
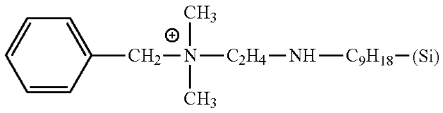
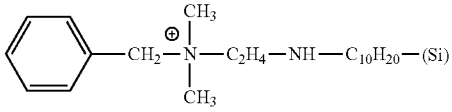
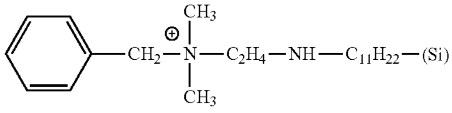
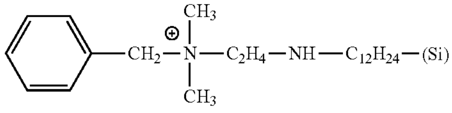
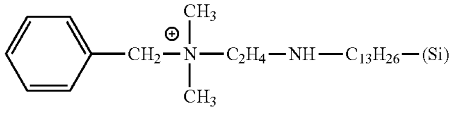
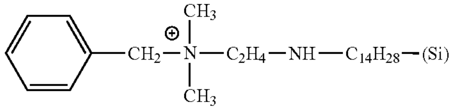
-continued
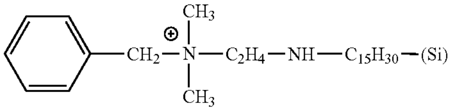
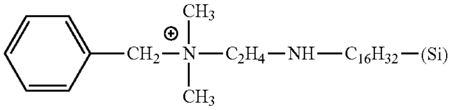
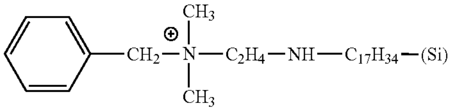
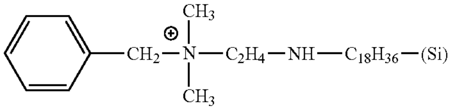
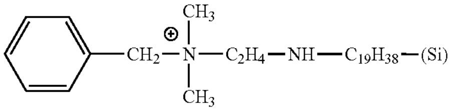
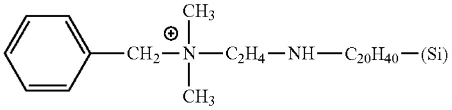
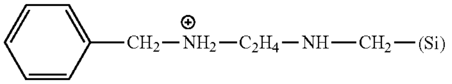
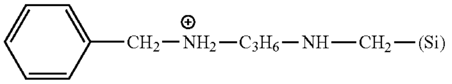
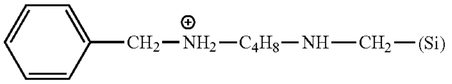
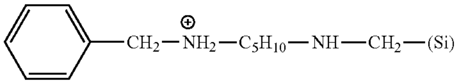
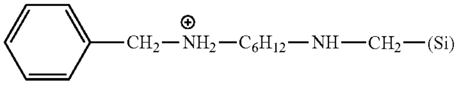
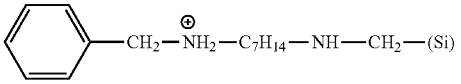
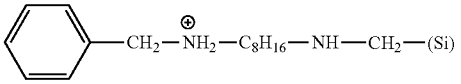
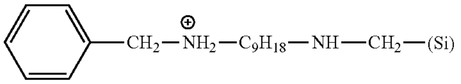
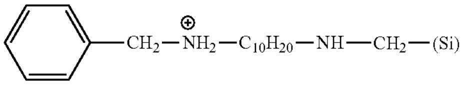
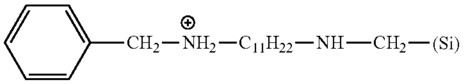
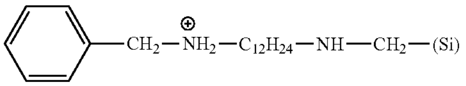
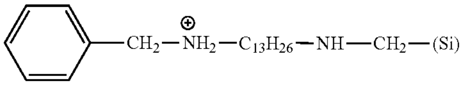

-continued
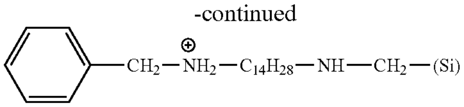
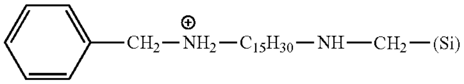
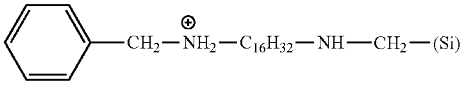
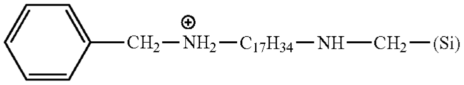
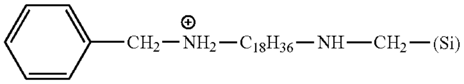
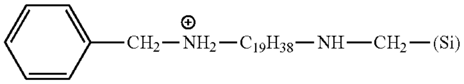
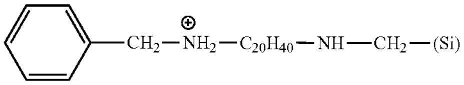
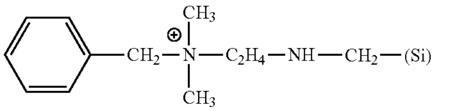
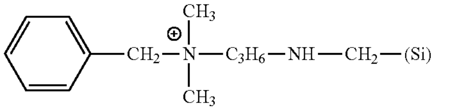
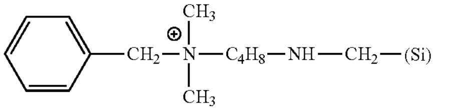
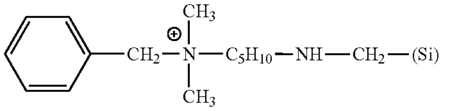
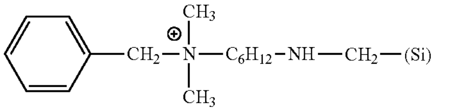
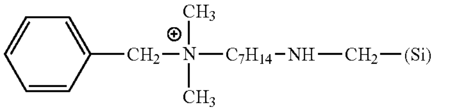
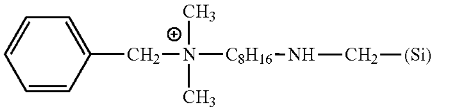
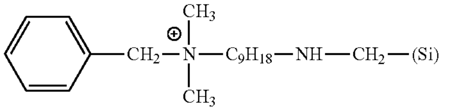
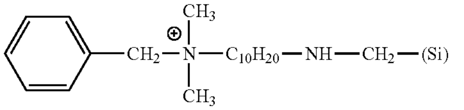
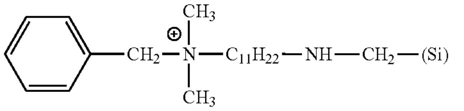
-continued
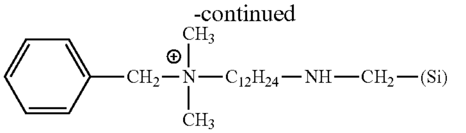
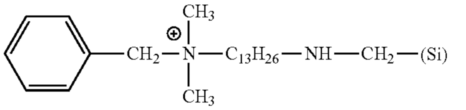
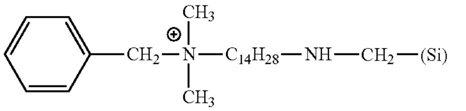
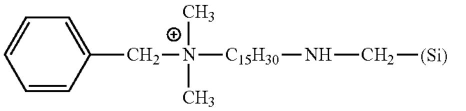
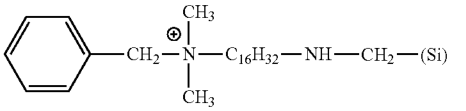
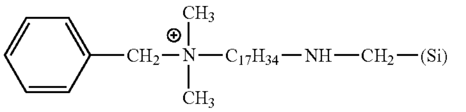
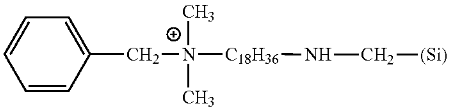
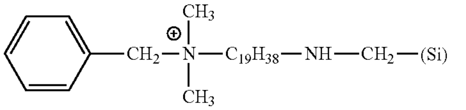
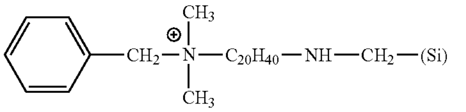
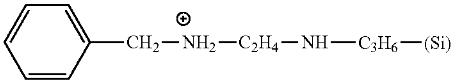
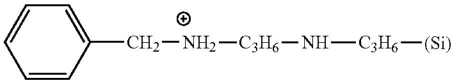
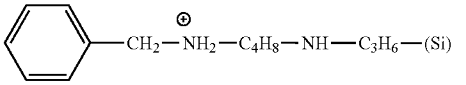
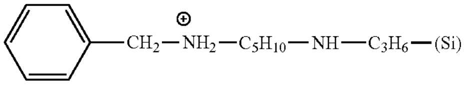
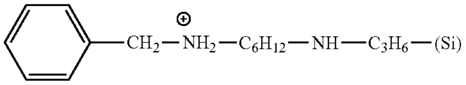
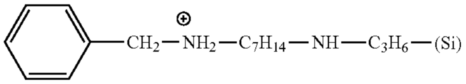
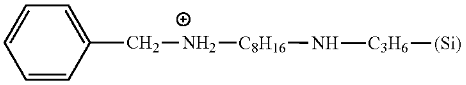
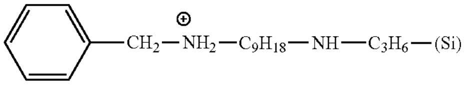

-continued
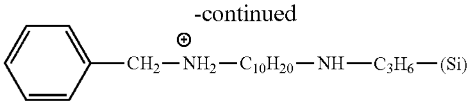
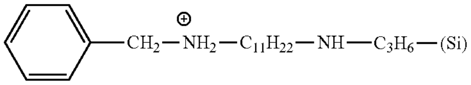
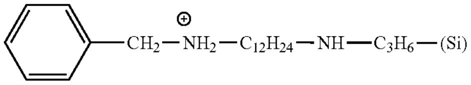
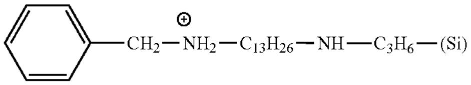
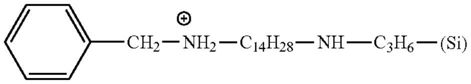
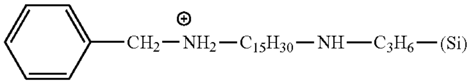
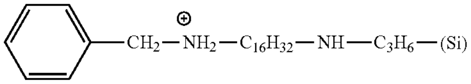
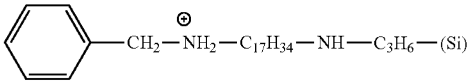
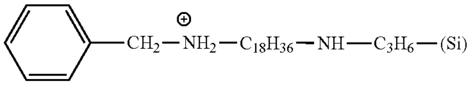
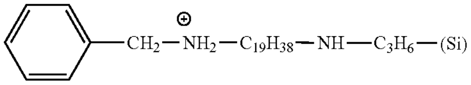
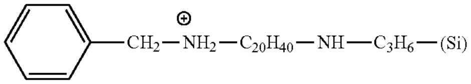
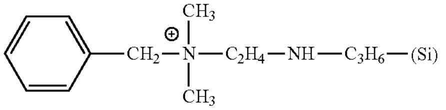
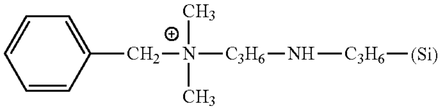
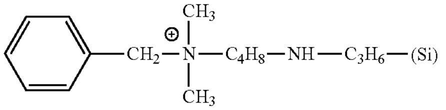
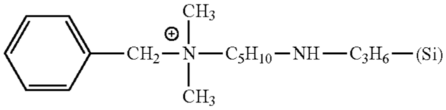
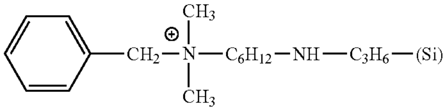
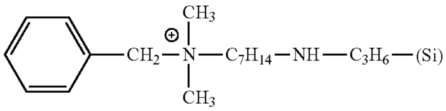
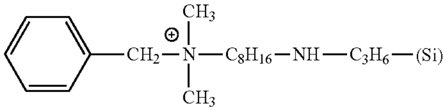
-continued
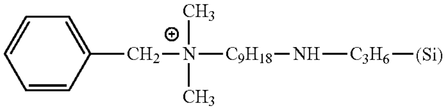
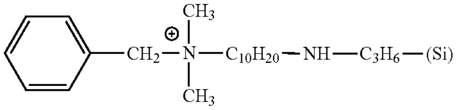
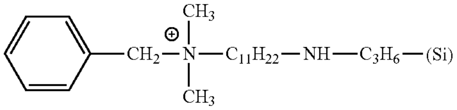
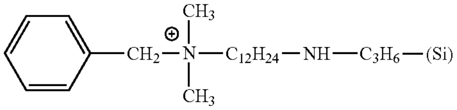
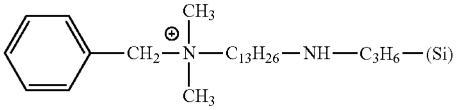
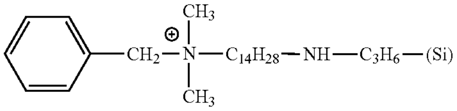
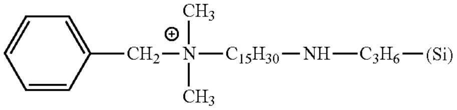
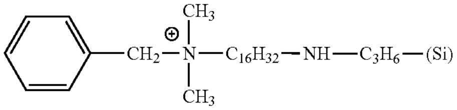
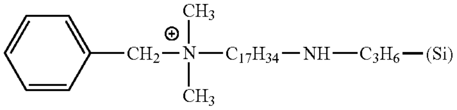
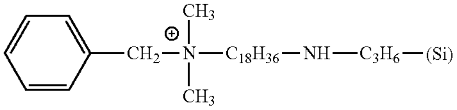
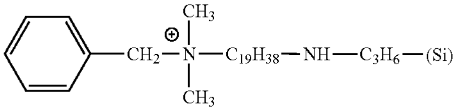
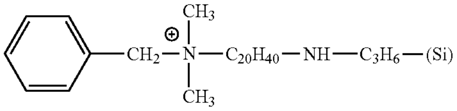
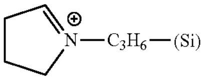 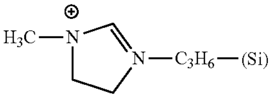
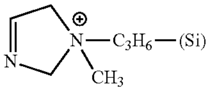 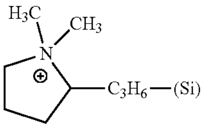

-continued

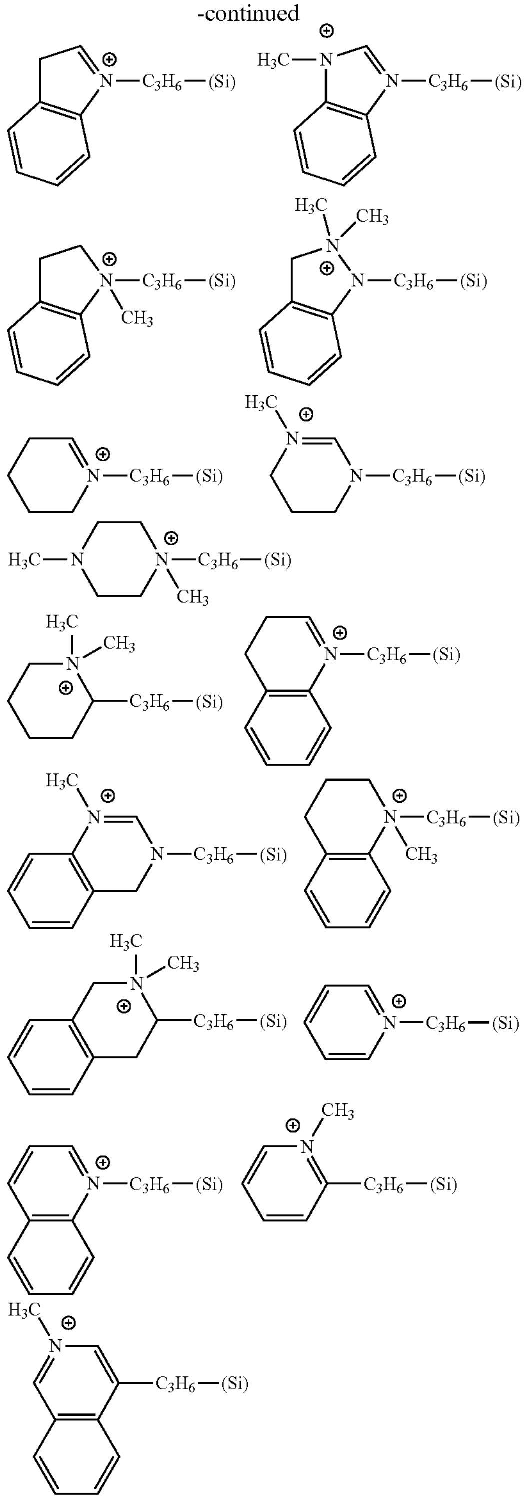

As a hydrolysable silicon compound simultaneously used with (Xm-1), (Xm-2), (Xm-3), and (Xm-4) to produce (Xc-10), above-mentioned (Sm) can be used, for example. Further, (Mm) may be added.

A reaction raw material for forming (Xc-10) can be prepared by: selecting at least one of the monomers (Xm-1), (Xm-2), (Xm-3), and (Xm-4) described above, in addition to at least one (Sm), and optionally at least one (Mm); and mixing the selected materials before or during the reaction.

The reaction conditions may follow the same method as the method for synthesizing the thermally crosslinkable polysiloxane (Sx).

The molecular weight of the silicon-containing compound (Xc-10) to be obtained can be adjusted not only through the selection of the monomers but also by controlling the reaction conditions during the polymerization. When the weight average molecular weight is 100,000 or less, generation of foreign matters and coating spots is suppressed. Thus, it is preferable to use the silicon-containing compound (Xc-10) having a weight average molecular weight of 100,000 or less, more preferably 200 to 50,000, further preferably 300 to 30,000. Regarding data on the weight average molecular weight, the molecular weight is expressed in terms of polystyrene which is obtained by gel permeation chromatography (GPC) using a refractive index (RI) detector, tetrahydrofuran as an eluent, and polystyrene as a reference substance.

Note that one of the crosslinking catalysts (Xc-1), (Xc-2), (Xc-3), (Xc-4), and (Xc-10) can be used alone, or two or more thereof can be used in combination. The amount of the crosslinking catalyst to be added is preferably 0.01 to 50 parts by mass, more preferably 0.1 to 40 parts by mass, based on 100 parts by mass of the base polymer (i.e., the silicon-containing compound (Sx) obtained by the above method).

(Organic Acid)

To improve the stability of the inventive composition for forming a silicon-containing resist underlayer film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the organic acid to be added may be 0.001 to 25 parts by mass, preferably 0.01 to 15 parts by mass, more preferably 0.1 to 5 parts by mass, based on 100 parts by mass of silicon contained in the inventive composition for forming a silicon-containing resist underlayer film.

Otherwise, the organic acid may be blended based on the pH of the inventive composition for forming a silicon-containing resist underlayer film so as to satisfy preferably $0 \leq pH \leq 7$, more preferably $0.3 \leq pH \leq 6.5$, further preferably $0.5 \leq pH \leq 6$.

(Water)

In the present invention, water may be added to the composition. When water is added, the polysiloxane compound in the inventive composition for forming a silicon-containing resist underlayer film is hydrated, so that the lithography performance is improved. The water content in the solvent component of the inventive composition for forming a silicon-containing resist underlayer film may be more than 0 mass % and less than 50 mass %, particularly preferably 0.3 to 30 mass %, further preferably 0.5 to 20 mass %. If water is excessive, the uniformity of the silicon-containing resist underlayer film deteriorates, and repelling may occur in the worst case. Meanwhile, if water is added too little, the lithography performance may be lowered.

The solvent including water is used in a total amount of preferably 100 to 100,000 parts by mass, particularly preferably 200 to 50,000 parts by mass, based on 100 parts by mass of the polysiloxane compound, which is the base polymer.

(Photo-Acid Generator)

In the present invention, a photo-acid generator other than the compound shown by the general formula (P-0) may be further added to the composition. As the photo-acid generator used in the present invention, it is possible to add, specifically, the materials described in paragraphs (0160) to (0179) of Japanese Unexamined Patent Application Publication No. 2009-126940.

(Stabilizer)

Further, in the present invention, a stabilizer can be added to the composition. As the stabilizer, a monohydric, dihydric, or polyhydric alcohol having cyclic ether substituent can be added. Particularly, adding stabilizers shown in paragraphs (0181) to (0182) of Japanese Unexamined Patent Application Publication No. 2009-126940 enables stability improvement of the composition for forming a silicon-containing resist underlayer film.

(Surfactant)

Further, in the present invention, a surfactant can be blended into the composition as necessary. Specifically, the materials described in paragraph (0185) of Japanese Unexamined Patent Application Publication No. 2009-126940 can be added as the surfactant.

(High-Boiling-Point Solvent)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

[Patterning Process]

Further, the present invention can provide a patterning process including the steps of:

forming an organic film on a body to be processed by using a coating-type organic film material;

forming a resist underlayer film on the organic film by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and transferring the pattern to the body to be processed by etching using the organic film having the transferred pattern as a mask (what is called "multilayer resist method").

Furthermore, the present invention can provide a patterning process including the steps of:

forming a hard mask mainly containing carbon on a body to be processed by a CVD method;

forming a resist underlayer film on the hard mask by using the inventive composition for forming a silicon-containing resist underlayer film;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the hard mask by dry etching using the resist underlayer film having the transferred pattern as a mask; and transferring the pattern to the body to be processed by dry etching using the hard mask having the transferred pattern as a mask (what is called "multilayer resist method").

When a pattern is formed using the inventive resist underlayer film, the combination with the organic film or the hard mask is optimized as described above, so that the pattern formed in the photoresist can be formed onto the substrate without changing the size during the transfer.

In a positive patterning process, after photoresist film formation and heat treatment, exposure and alkaline development with alkaline developer are carried out to obtain a positive resist pattern. In addition, it is preferable to perform post exposure bake (PEB) after the exposure.

As the alkaline developer, tetramethylammonium hydroxide (TMAH) can be used, for example.

The pattern is preferably formed in the resist upper layer film by a photolithography with a wavelength of 10 nm or more and 300 nm or less, direct drawing with electron beam, nanoimprinting, or a combination thereof.

The body to be processed is preferably a semiconductor apparatus substrate, a metal film, a metal carbide film, a metal oxide film, a metal nitride film, a metal oxycarbide film, or a metal oxynitride film.

The metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

EXAMPLE

Hereinafter, the present invention will be specifically described with reference to Synthesis Example, Examples, and Comparative Examples. However, the present invention is not limited to these descriptions. Note that, in the following examples, % means mass %, and the molecular weight measurement was carried out by GPC.

Synthesis Example 1

To a mixture containing 120 g of methanol, 0.1 g of 10% nitric acid, and 60 g of deionized water, a mixture containing 30.6 g of Compound (101), 38.1 g of Compound (102), and 5.9 g of Compound (110) was added and maintained at 40°

C. for 12 hours to perform hydrolysis condensation. After completion of the reaction, 600 g of propylene glycol ethyl ether (PGEE) was added thereto. Then, the water used for the hydrolysis condensation and by-produced alcohol were distilled off under reduced pressure. Thus, 440 g of PGEE solution of Polysiloxane Compound 1 was obtained (compound concentration: 10%). The molecular weight of Polysiloxane Compound 1 was measured in terms of polystyrene and found Mw=2,900.

[Synthesis Example 2] to [Synthesis Example 22] were carried out under the same conditions as in Synthesis Example 1 by using monomers shown in Table 1 to obtain the target products.

TABLE 1

| Synthesis Example | Reaction raw materials | Mw |
|---|---|---|
| 1 | Compound (101): 30.6 g, Compound (102): 38.1 g, Compound (110): 5.9 g | 2900 |
| 2 | Compound (101): 30.6 g, Compound (102): 38.1 g, Compound (111): 6.4 g | 2300 |
| 3 | Compound (101): 30.6 g, Compound (102): 38.1 g, Compound (112): 7.0 g | 2900 |
| 4 | Compound (101): 30.6 g, Compound (102): 38.1 g, Compound (113): 6.6 g | 2900 |
| 5 | Compound (101): 30.6 g, Compound (102): 38.1 g, Compound (114): 7.3 g | 2100 |
| 6 | Compound (101): 30.6 g, Compound (102): 38.1 g, Compound (115): 6.2 g | 2700 |
| 7 | Compound (101): 30.6 g, Compound (102): 38.1 g, Compound (116): 5.1 g | 2000 |
| 8 | Compound (101): 30.6 g, Compound (102): 38.1 g, Compound (117): 6.8 g | 2300 |
| 9 | Compound (101): 30.6 g, Compound (102): 38.1 g, Compound (118): 8.9 g | 2600 |
| 10 | Compound (101): 30.6 g, Compound (102): 38.1 g, Compound (119): 8.0 g | 2300 |
| 11 | Compound (100): 5.0 g, Compound (101): 30.6 g, Compound (102): 38.1 g | 2500 |
| 12 | Compound (101): 13.6 g, Compound (102): 53.3 g, Compound (110): 11.8 g | 2100 |
| 13 | Compound (101): 13.6 g, Compound (102): 53.3 g, Compound (111): 12.7 g | 2800 |
| 14 | Compound (101): 13.6 g, Compound (102): 53.3 g, Compound (112): 13.9 g | 2500 |
| 15 | Compound (101): 13.6 g, Compound (102): 53.3 g, Compound (113): 13.2 g | 2400 |
| 16 | Compound (101): 13.6 g, Compound (102): 53.3 g, Compound (114): 14.5 g | 2600 |
| 17 | Compound (101): 13.6 g, Compound (102): 53.3 g, Compound (115): 12.3 g | 2300 |
| 18 | Compound (101): 13.6 g, Compound (102): 53.3 g, Compound (116): 10.2 g | 2600 |
| 19 | Compound (101): 13.6 g, Compound (102): 53.3 g, Compound (117): 13.5 g | 2500 |
| 20 | Compound (101): 13.6 g, Compound (102): 53.3 g, Compound (118): 17.7 g | 2700 |
| 21 | Compound (101): 13.6 g, Compound (102): 53.3 g, Compound (119): 16.0 g | 3000 |
| 22 | Compound (100): 5.0 g, Compound (101): 17.0 g, Compound (102): 53.3 g | 2800 |

$PhSi(OCH_3)_3$ . . . Compound (100)
$CH_3Si(OCH_3)_3$ . . . Compound (101)
$Si(OCH_3)_4$ . . . Compound (102)

Compound (110)

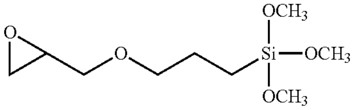

-continued

Compound (111)

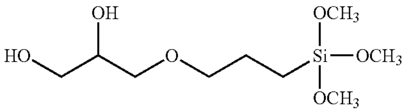

Compound (112)

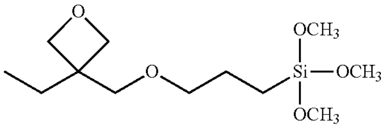

Compound (113)

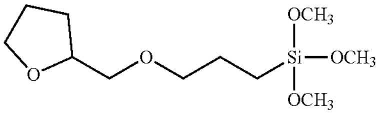

Compound (114)

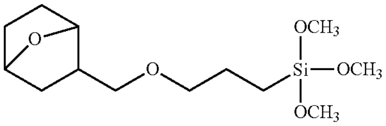

Compound (115)

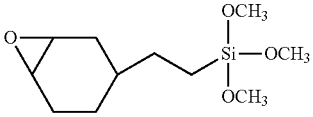

Compound (116)

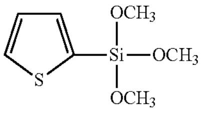

Compound (117)

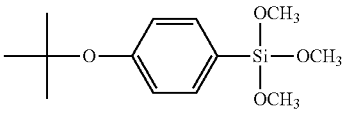

Compound (118)

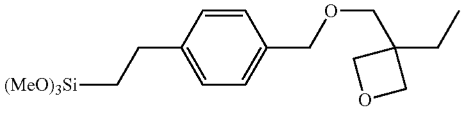

Compound (119)

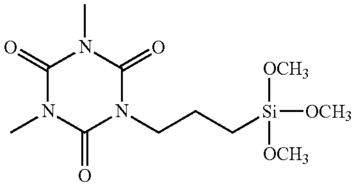

Compound (120)

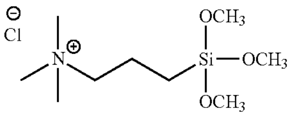

Synthesis Example of Crosslinking Catalyst

To a mixture containing 120 g of methanol, 0.1 g of 10% nitric acid, and 60 g of deionized water, a mixture containing 61.3 g of Compound (101) and 12.9 g of Compound (120) was added and maintained at 40° C. for 12 hours to perform hydrolysis condensation. After completion of the reaction, 300 g of propylene glycol ethyl ether (PGEE) was added thereto. Then, the water used for the hydrolysis condensation and by-produced alcohol were distilled off under reduced pressure. Thus, 250 g of PGEE solution of ammonium salt-containing Polysiloxane Compound 23 (Z-1) was obtained (compound concentration: 20%). The molecular weight of Polysiloxane Compound 23 was measured in terms of polystyrene and found Mw=1,500.

Examples, Comparative Examples

Polysiloxane Compounds 1 to 22 obtained in Synthesis Examples, crosslinking catalysts, acid, photo-acid generators (PAG-1 to -15) shown in Table 6, solvents, and water were mixed at ratios shown in Tables 2 to 5. Each mixture was filtered through a 0.1-μm filter made of fluorinated resin. Thus, composition solutions for forming a polysiloxane underlayer film were prepared and referred to as Sol. 1 to Sol. 73 hereinbelow.

TABLE 2

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 1 | Compound 1(1) | $QBANO_3$ (0.01) | PAG-1 (0.01) | maleic acid (0.01) | PGEE (100) | water (10) |
| Sol. 2 | Compound 1(1) | $QBANO_3$ (0.01) | PAG-2 (0.01) | maleic acid (0.01) | PGEE (100) | water (10) |
| Sol. 3 | Compound 1(1) | $QBANO_3$ (0.01) | PAG-3 (0.01) | maleic acid (0.01) | PGEE (100) | water (10) |
| Sol. 4 | Compound 2(1) | $TPSNO_3$ (0.01) | PAG-4 (0.01) | maleic acid (0.01) | PGEE (100) | water (10) |
| Sol. 5 | Compound 2(1) | $TPSNO_3$ (0.01) | PAG-5 (0.01) | maleic acid (0.01) | PGEE (100) | water (10) |
| Sol. 6 | Compound 2(1) | $TPSNO_3$ (0.01) | PAG-6 (0.01) | maleic acid (0.01) | PGEE (100) | water (10) |
| Sol. 7 | Compound 3(1) | $QBANO_3$ (0.01) | PAG-7 (0.01) | maleic acid (0.01) | PGEE (100) | water (10) |
| Sol. 8 | Compound 3(1) | $QBANO_3$ (0.01) | PAG-8 (0.01) | maleic acid (0.01) | PGEE (100) | water (10) |
| Sol. 9 | Compound 3(1) | $QBANO_3$ (0.01) | PAG-9 (0.01) | maleic acid (0.01) | PGEE (100) | water (10) |
| Sol. 10 | compound 4(1) | $QBANO_3$ (0.01) | PAG-10 (0.01) | maleic acid (0.01) | PGEE (90) GBL (10) | water (10) |
| Sol. 11 | compound 4(1) | $QBANO_3$ (0.01) | PAG-11 (0.01) | maleic acid (0.01) | PGEE (100) | water (10) |
| Sol. 12 | compound 4(1) | $QBANO_3$ (0.01) | PAG-12 (0.01) | maleic acid (0.01) | PGEE (90) PGME (10) | water (10) |
| Sol. 13 | compound 5(1) | $QBANO_3$ (0.01) | PAG-1 (0.01) | maleic acid (0.01) | PGEE (90) DAA (10) | water (10) |
| Sol. 14 | compound 5(1) | $TMPANO_3$ (0.01) | PAG-2 (0.01) | maleic acid (0.01) | PGEE (100) | water (10) |
| Sol. 15 | compound 5(1) | $QBANO_3$ (0.01) | PAG-3 (0.01) | maleic acid (0.01) | PGEE (100) | water (10) |
| Sol. 16 | Compound 6(1) | $QBANO_3$ (0.01) | PAG-4 (0.01) | maleic acid (0.01) | PGEE (100) | water (10) |
| Sol. 17 | Compound 6(1) | $QBANO_3$ (0.01) | PAG-5 (0.01) | maleic acid (0.01) | PGEE (100) | water (10) |
| Sol. 18 | Compound 6(1) | $QBANO_3$ (0.01) | PAG-6 (0.01) | maleic acid (0.01) | PGEE (100) | water (10) |

TABLE 3

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 19 | compound 7(1) | $QBANO_3$ (0.01) | PAG-7 (0.01) | maleic acid (0.01) | PGEE (100) | water (10) |
| Sol. 20 | compound 7(1) | $QBANO_3$ (0.01) | PAG-8 (0.01) | maleic acid (0.01) | PGEE (90) GBL (10) | water (10) |
| Sol. 21 | compound 7(1) | $QBANO_3$ (0.01) | PAG-9 (0.01) | maleic acid (0.01) | PGEE (100) | water (10) |
| Sol. 22 | compound 8(1) | $QBANO_3$ (0.01) | PAG-10 (0.01) | maleic acid (0.01) | PGEE (100) | water (10) |
| Sol. 23 | compound 8(1) | $QBANO_3$ (0.01) | PAG-11 (0.01) | maleic acid (0.01) | PGEE (100) | water (10) |

TABLE 3-continued

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 24 | compound 8(1) | $QBANO_3$ (0.01) | PAG-12 (0.01) | maleic acid (0.01) | PGEE (100) | water (10) |
| Sol. 25 | compound 9(1) | TPSMSA (0.01) | PAG-1 (0.01) | maleic acid (0.01) | PGEE (100) | water (10) |
| Sol. 26 | compound 9(1) | TPSMSA (0.01) | PAG-2 (0.01) | maleic acid (0.01) | PGEE (100) | water (10) |
| Sol. 27 | compound 9(1) | TPSMSA (0.01) | PAG-3 (0.01) | maleic acid (0.01) | PGEE (90) PGME (10) | water (10) |
| Sol. 28 | Compound 10(1) | $QBANO_3$ (0.01) | PAG-4 (0.01) | maleic acid (0.01) | PGEE (100) | water (10) |
| Sol. 29 | Compound 10(1) | $QBANO_3$ (0.01) | PAG-5 (0.01) | maleic acid (0.01) | PGEE (100) | water (10) |
| Sol. 30 | Compound 10(1) | $QBANO_3$ (0.01) | PAG-6 (0.01) | maleic acid (0.01) | PGEE (100) | water (10) |
| Sol. 31 | Compound 11(1) | $QBANO_3$ (0.01) | PAG-7 (0.01) | maleic acid (0.01) | PGEE (100) | water (10) |
| Sol. 32 | Compound 11(1) | $QBANO_3$ (0.01) | PAG-8 (0.01) | maleic acid (0.01) | PGEE (100) | water (10) |
| Sol. 33 | Compound 11(1) | $QBANO_3$ (0.01) | PAG-9 (0.01) | maleic acid (0.01) | PGEE (100) | water (10) |
| Sol. 34 | Compound 12(1) | $QBANO_3$ (0.01) | PAG-10 (0.01) | maleic acid (0.01) | PGEE (100) | water (10) |
| Sol. 35 | Compound 12(1) | $QBANO_3$ (0.01) | PAG-11 (0.01) | maleic acid (0.01) | PGEE (100) | water (10) |
| Sol. 36 | Compound 12(1) | $QBANO_3$ (0.01) | PAG-12 (0.01) | maleic acid (0.01) | PGEE (100) | water (10) |

TABLE 4

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 37 | Compound 13(1) | $QBANO_3$ (0.01) | PAG-1 (0.01) | maleic acid (0.01) | PGEE (90) PGME (10) | water (10) |
| Sol. 38 | Compound 13(1) | $QBANO_3$ (0.01) | PAG-2 (0.01) | maleic acid (0.01) | PGEE (100) | water (10) |
| Sol. 39 | Compound 13(1) | $QBANO_3$ (0.01) | PAG-3 (0.01) | maleic acid (0.01) | PGEE (100) | water (10) |
| Sol. 40 | Compound 14(1) | $QBANO_3$ (0.01) | PAG-4 (0.01) | maleic acid (0.01) | PGEE (90) GBL (10) | water (10) |
| Sol. 41 | Compound 14(1) | $QBANO_3$ (0.01) | PAG-5 (0.01) | maleic acid (0.01) | PGEE (100) | water (10) |
| Sol. 42 | Compound 14(1) | $QBANO_3$ (0.01) | PAG-6 (0.01) | maleic acid (0.01) | PGEE (100) | water (10) |
| Sol. 43 | Compound 15(1) | Z-1 (0.01) | PAG-7 (0.01) | maleic acid (0.01) | PGEE (100) | water (10) |
| Sol. 44 | Compound 15(1) | Z-1 (0.01) | PAG-8 (0.01) | maleic acid (0.01) | PGEE (100) | water (10) |
| Sol. 45 | Compound 15(1) | Z-1 (0.01) | PAG-9 (0.01) | maleic acid (0.01) | PGEE (100) | water (10) |
| Sol. 46 | Compound 16(1) | $QBANO_3$ (0.01) | PAG-10 (0.01) | maleic acid (0.01) | PGEE (100) | water (10) |
| Sol. 47 | Compound 16(1) | $QBANO_3$ (0.01) | PAG-11 (0.01) | maleic acid (0.01) | PGEE (100) | water (10) |
| Sol. 48 | Compound 16(1) | $QBANO_3$ (0.01) | PAG-12 (0.01) | maleic acid (0.01) | PGEE (100) | water (10) |
| Sol. 49 | Compound 17(1) | $QBANO_3$ (0.01) | PAG-1 (0.01) | maleic acid (0.01) | PGEE (100) | water (10) |
| Sol. 50 | Compound 17(1) | $QBANO_3$ (0.01) | PAG-2 (0.01) | maleic acid (0.01) | PGEE (90) GBL (10) | water (10) |
| Sol. 51 | Compound 17(1) | $QBANO_3$ (0.01) | PAG-3 (0.01) | maleic acid (0.01) | PGEE (100) | water (10) |
| Sol. 52 | Compound 18(1) | $QBANO_3$ (0.01) | PAG-4 (0.01) | maleic acid (0.01) | PGEE (100) | water (10) |
| Sol. 53 | Compound 18(1) | $QBANO_3$ (0.01) | PAG-5 (0.01) | maleic acid (0.01) | PGEE (100) | water (10) |
| Sol. 54 | Compound 18(1) | $QBANO_3$ (0.01) | PAG-6 (0.01) | maleic acid (0.01) | PGEE (100) | water (10) |

TABLE 5

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 55 | Compound 19(1) | $QBANO_3$ (0.01) | PAG-7 (0.01) | maleic acid (0.01) | PGEE (100) | water (10) |
| Sol. 56 | Compound 19(1) | $QBANO_3$ (0.01) | PAG-8 (0.01) | maleic acid (0.01) | PGEE (90) PGME (10) | water (10) |
| Sol. 57 | Compound 19(1) | $QBANO_3$ (0.01) | PAG-9 (0.01) | maleic acid (0.01) | PGEE (100) | water (10) |
| Sol. 58 | Compound 20(1) | QMATFA (0.01) | PAG-10 (0.01) | maleic acid (0.01) | PGEE (100) | water (10) |
| Sol. 59 | Compound 20(1) | QMATFA (0.01) | PAG-11 (0.01) | maleic acid (0.01) | PGEE (100) | water (10) |
| Sol. 60 | Compound 20(1) | QMATFA (0.01) | PAG-12 (0.01) | maleic acid (0.01) | PGEE (90) GBL (10) | water (10) |
| Sol. 61 | Compound 21(1) | $QBANO_3$ (0.01) | PAG-1 (0.01) | maleic acid (0.01) | PGEE (100) | water (10) |
| Sol. 62 | Compound 21(1) | $QBANO_3$ (0.01) | PAG-2 (0.01) | maleic acid (0.01) | PGEE (100) | water (10) |
| Sol. 63 | Compound 21(1) | $QBANO_3$ (0.01) | PAG-3 (0.01) | maleic acid (0.01) | PGEE (100) | water (10) |
| Sol. 64 | Compound 22(1) | $QBANO_3$ (0.01) | PAG-4 (0.01) | maleic acid (0.01) | PGEE (100) | water (10) |
| Sol. 65 | Compound 22(1) | $QBANO_3$ (0.01) | PAG-5 (0.01) | maleic acid (0.01) | PGEE (90) PGME (10) | water (10) |
| Sol. 66 | Compound 22(1) | $QBANO_3$ (0.01) | PAG-6 (0.01) | maleic acid (0.01) | PGEE (100) | water (10) |
| Sol. 67 | Compound 1(1) | $QBANO_3$ (0.01) | PAG-13 (0.01) | maleic acid (0.01) | PGEE (100) | water (10) |
| Sol. 68 | Compound 3(1) | $QBANO_3$ (0.01) | PAG-13 (0.01) | maleic acid (0.01) | PGEE (100) | water (10) |
| Sol. 69 | Compound 6(1) | $QBANO_3$ (0.01) | PAG-14 (0.01) | maleic acid (0.01) | PGEE (100) | water (10) |
| Sol. 70 | Compound 11(1) | $QBANO_3$ (0.01) | PAG-14 (0.01) | maleic acid (0.01) | PGEE (90) GBL (10) | water (10) |
| Sol. 71 | Compound 16(1) | $QBANO_3$ (0.01) | PAG-15 (0.01) | maleic acid (0.01) | PGEE (100) | water (10) |
| Sol. 72 | Compound 18(1) | $QBANO_3$ (0.01) | PAG-15 (0.01) | maleic acid (0.01) | PGEE (100) | water (10) |
| Sol. 73 | Compound 22(1) | $QBANO_3$ (0.01) | PAG-15 (0.01) | maleic acid (0.01) | PGEE (100) | water (10) |

The following crosslinking catalysts were used.

$TPSNO_3$ . . . triphenylsulfonium nitrate $TMPANO_3$ . . . trimethylphenylammonium nitrate TPSMSA . . . mono (triphenylsulfonium)maleate QMATFA . . . tetramethylammonium trifluoroacetate $QBANO_3$ . . . tetrabutylammonium nitrate Z-1 . . . ammonium salt-containing Polysiloxane Compound 23

The following solvents were used.

PGEE . . . propylene glycol ethyl ether

PGME . . . propylene glycol methyl ether

GBL . . . gamma-butyrolactone

DAA . . . diacetone alcohol

TABLE 6

| PAG | |
|---|---|
| 1 | 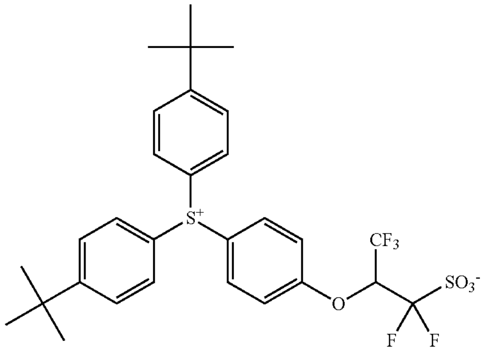 |

TABLE 6-continued
| PAG | |
|---|---|
| 2 | 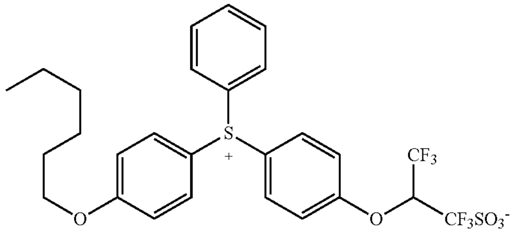 |
| 3 | 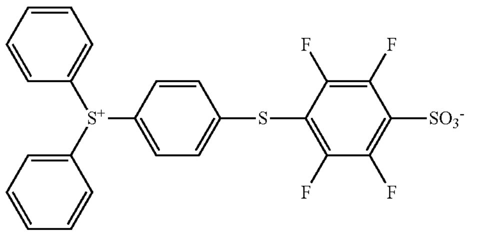 |
| 4 | 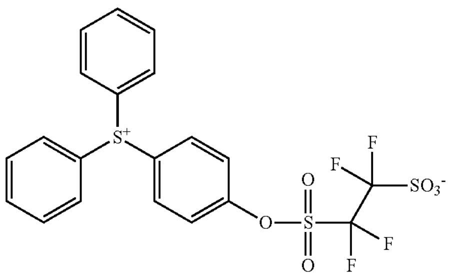 |
| 5 | 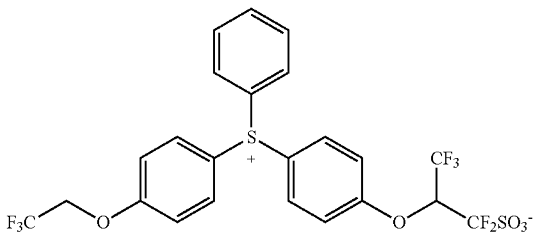 |
| 6 | 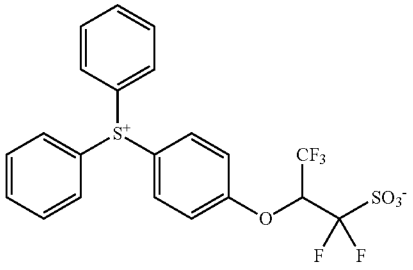 |
| 7 | 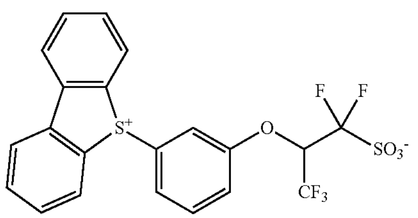 |
TABLE 6-continued
| PAG | |
|---|---|
| 8 | 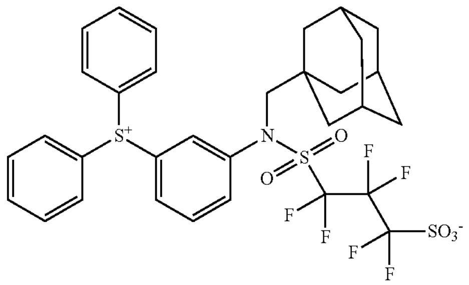 |
| 9 | 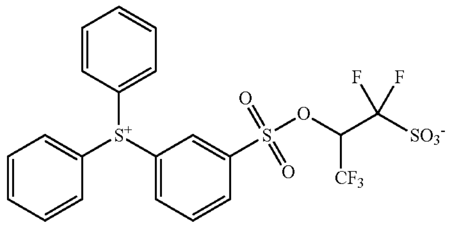 |
| 10 | 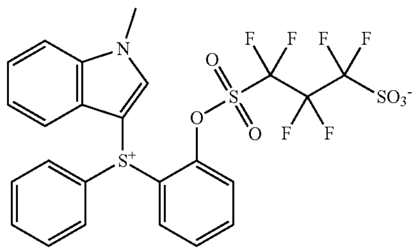 |
| 11 | 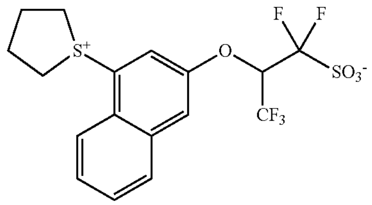 |
| 12 | 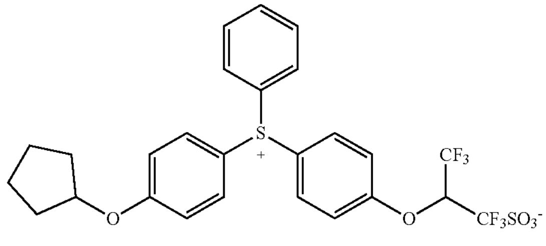 |
| 13 | 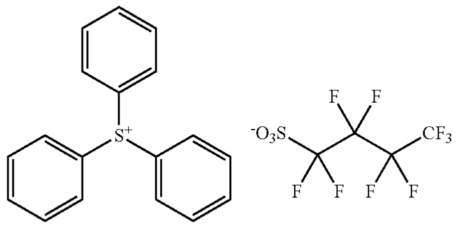 |

TABLE 6-continued

| PAG | |
|---|---|
| 14 | 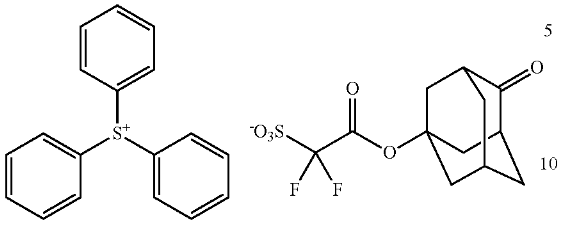 |
| 15 | 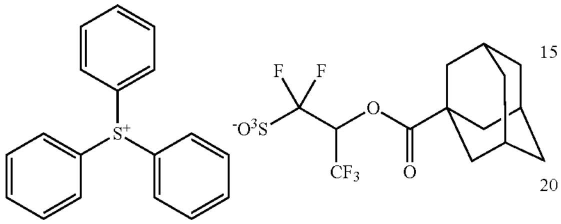 |

(EUV Patterning Test)

A silicon wafer was spin-coated with one of the composition Sols. 1 to 72 for forming a silicon-containing resist under layer film, and heated at 220° C. for 60 seconds. In this way, silicon-containing films were prepared as Films 1 to 72 each of which had a film thickness of 20 nm on the Si substrate.

Subsequently, Films 1 to 72 were each spin-coated with a resist material in which the following components were dissolved at ratios in Table 7, and prebaked at 105° C. for 60 seconds using a hot plate to prepare a resist film having a film thickness of 60 nm. The resultant was exposed using an EUV scanner NXE3300 (manufactured by ASML, NA: 0.33, σ: 0.9/0.6, quadrupole illumination, with a mask having a hole pattern with a pitch of 46 nm and +20% bias (on-wafer size)), followed by PEB at 100° C. for 60 seconds on the hot plate and development with a 2.38 mass % TMAH aqueous solution for 30 seconds. Thus, a hole pattern with a dimension of 23 nm was obtained.

Using a CD-SEM (CG5000) manufactured by Hitachi High-Technologies Corporation, an exposure dose at which a hole dimension of 23 nm was formed was determined as sensitivity. Moreover, in this event, the dimensions of 50 holes were measured, from which the dimensional variation (CDU, 3σ) was computed. Table 8 and Table 9 show the result.

The following polymer, quencher, sensitizer, surfactant, and organic solvents were used.

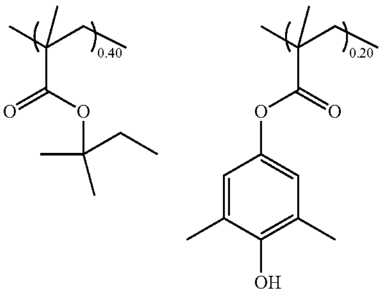

-continued

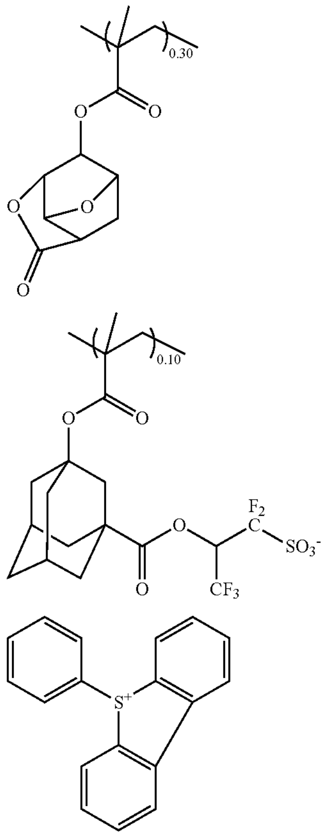

Polymer
Mw = 8,900
Mw/Mn = 1.89

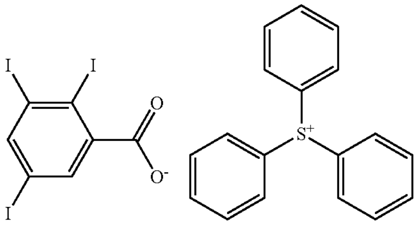

Quencher

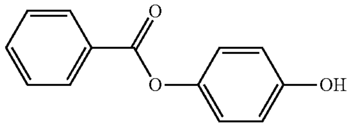

Sensitizer

Surfactant: FC-4430 manufactured by 3M

PGMEA: propylene glycol monomethyl ether acetate

CyHO: cyclohexanone

PGME: propylene glycol monomethyl ether

TABLE 7

| Components | Polymer | Quencher | Sensi-tizer | Surfactant | Organic solvent |
|---|---|---|---|---|---|
| Composition (parts by mass) | (100) | (4.0) | (2.1) | (0.25) | PGMEA(400) CyHO(2000) PGME(100) |

TABLE 8

| Example 1 | Polysiloxane resist underlayer film | Sensitivity (mJ/cm$^2$) | CDU (nm) |
|---|---|---|---|
| Example 1-1 | Film 1 | 27 | 2.3 |
| Example 1-2 | Film 2 | 29 | 2.4 |
| Example 1-3 | Film 3 | 28 | 2.3 |
| Example 1-4 | Film 4 | 29 | 2.4 |
| Example 1-5 | Film 5 | 28 | 2.2 |
| Example 1-6 | Film 6 | 28 | 2.4 |
| Example 1-7 | Film 7 | 29 | 2.5 |
| Example 1-8 | Film 8 | 29 | 2.4 |
| Example 1-9 | Film 9 | 28 | 2.5 |
| Example 1-10 | Film 10 | 27 | 2.4 |
| Example 1-11 | Film 11 | 29 | 2.3 |
| Example 1-12 | Film 12 | 29 | 2.3 |
| Example 1-13 | Film 13 | 27 | 2.5 |
| Example 1-14 | Film 14 | 28 | 2.4 |
| Example 1-15 | Film 15 | 28 | 2.2 |
| Example 1-16 | Film 16 | 29 | 2.5 |
| Example 1-17 | Film 17 | 27 | 2.4 |
| Example 1-18 | Film 18 | 27 | 2.3 |
| Example 1-19 | Film 19 | 28 | 2.4 |
| Example 1-20 | Film 20 | 28 | 2.5 |
| Example 1-21 | Film 21 | 29 | 2.4 |
| Example 1-22 | Film 22 | 28 | 2.3 |
| Example 1-23 | Film 23 | 29 | 2.4 |
| Example 1-24 | Film 24 | 28 | 2.3 |
| Example 1-25 | Film 25 | 28 | 2.4 |
| Example 1-26 | Film 26 | 28 | 2.4 |
| Example 1-27 | Film 27 | 28 | 2.3 |
| Example 1-28 | Film 28 | 28 | 2.5 |
| Example 1-29 | Film 29 | 28 | 2.4 |
| Example 1-30 | Film 30 | 27 | 2.3 |
| Example 1-31 | Film 31 | 28 | 2.3 |
| Example 1-32 | Film 32 | 27 | 2.3 |
| Example 1-33 | Film 33 | 28 | 2.4 |
| Example 1-34 | Film 34 | 27 | 2.2 |
| Example 1-35 | Film 35 | 28 | 2.4 |
| Example 1-36 | Film 36 | 29 | 2.3 |

TABLE 9

| Example 1 | Polysiloxane resist underlayer film | Sensitivity (mJ/cm$^2$) | CDU (nm) |
|---|---|---|---|
| Example 1-37 | Film 37 | 28 | 2.3 |
| Example 1-38 | Film 38 | 28 | 2.3 |
| Example 1-39 | Film 39 | 29 | 2.2 |
| Example 1-40 | Film 40 | 28 | 2.3 |
| Example 1-41 | Film 41 | 27 | 2.3 |
| Example 1-42 | Film 42 | 27 | 2.5 |
| Example 1-43 | Film 43 | 27 | 2.3 |
| Example 1-44 | Film 44 | 29 | 2.4 |
| Example 1-45 | Film 45 | 28 | 2.3 |
| Example 1-46 | Film 46 | 28 | 2.4 |
| Example 1-47 | Film 47 | 28 | 2.4 |
| Example 1-48 | Film 48 | 29 | 2.5 |
| Example 1-49 | Film 49 | 27 | 2.3 |
| Example 1-50 | Film 50 | 28 | 2.2 |
| Example 1-51 | Film 51 | 29 | 2.2 |
| Example 1-52 | Film 52 | 28 | 2.4 |
| Example 1-53 | Film 53 | 28 | 2.3 |

TABLE 9-continued

| Example 1 | Polysiloxane resist underlayer film | Sensitivity (mJ/cm$^2$) | CDU (nm) |
|---|---|---|---|
| Example 1-54 | Film 54 | 28 | 2.4 |
| Example 1-55 | Film 55 | 29 | 2.4 |
| Example 1-56 | Film 56 | 27 | 2.3 |
| Example 1-57 | Film 57 | 29 | 2.3 |
| Example 1-58 | Film 58 | 27 | 2.4 |
| Example 1-59 | Film 59 | 28 | 2.2 |
| Example 1-60 | Film 60 | 27 | 2.4 |
| Example 1-61 | Film 61 | 27 | 2.3 |
| Example 1-62 | Film 62 | 27 | 2.4 |
| Example 1-63 | Film 63 | 27 | 2.3 |
| Example 1-64 | Film 64 | 27 | 2.4 |
| Example 1-65 | Film 65 | 29 | 2.3 |
| Example 1-66 | Film 66 | 28 | 2.3 |
| Comparative Example 1-1 | Film 67 | 27 | 3.0 |
| Comparative Example 1-2 | Film 68 | 29 | 3.1 |
| Comparative Example 1-3 | Film 69 | 27 | 3.3 |
| Comparative Example 1-4 | Film 70 | 29 | 3.2 |
| Comparative Example 1-5 | Film 71 | 27 | 3.0 |
| Comparative Example 1-6 | Film 72 | 29 | 3.1 |

As shown by Comparative Examples in Table 9, when the conventional acid generators (PAG-13 to -15) not having both of a cation moiety and an anion moiety formed in one molecule were used, acids generated by the exposure non-uniformly diffused at the interface portion between the resist upper layer film and the silicon-containing resist underlayer film, causing CDU degradation. In contrast, when the silicon-containing films containing the inventive betaine-type acid generators (PAG-1 to -12) were used as the resist underlayer films, it was found that the generated acids diffused only to very small extent, so that no side effect such as sensitivity degradation occurred, and favorable CDU was demonstrated.

(ArF Patterning Test)

On a silicon wafer, a spin-on carbon film ODL-102 (carbon content: 89 mass %) manufactured by Shin-Etsu Chemical CO., Ltd. was formed to have a film thickness of 200 nm. Then, the spin-on carbon film was coated with one of the composition Sols. 31 to 33, 64 to 66, 70, and 73 for forming a polysiloxane film, and heated at 220° C. for 60 seconds. In this way, polysiloxane films were prepared as Films 31 to 33, 64 to 66, 70, and 73 each of which had a film thickness of 20 nm.

Subsequently, the polysiloxane films were each coated with an ArF resist solution (PR-1) for positive development shown in Table 10, and baked at 110° C. for 60 seconds to form a photoresist film having a thickness of 100 nm. Further, the resulting photoresist film was coated with a liquid immersion top coat (TC-1) shown in Table 11, and baked at 90° C. for 60 seconds. In this way, top coats each having a film thickness of 50 nm were formed.

Next, these were exposed by using an ArF liquid immersion exposure apparatus (manufactured by ASML; XT-1900i, NA: 1.35, σ: 0.97/0.77, 35° polarized dipole illumination), followed by baking (PEB) at 100° C. for 60 seconds, and development with a 2.38 mass % tetramethylammonium hydroxide (TMAH) aqueous solution for 30 seconds. In this way, 40-nm 1:1 positive line-and-space patterns were obtained.

Each dimension was observed with an electron microscope (CG5000) manufactured by Hitachi High-Technologies Corporation to check LWR, and the sectional profile was observed with an electron microscope (S-9380) manufactured by Hitachi, Ltd. (Table 12).

TABLE 10

| No. | Polymer (parts by mass) | Acid generator (parts by mass) | Base (parts by mass) | Surfactant (parts by mass) | Solvent (parts by mass) |
|---|---|---|---|---|---|
| PR-1 | ArF resist polymer 1 (100) | PAG-A (7.0) | Quencher (1.0) | FC-4430 (0.2) | PGMEA (2,500) |

ArF resist polymer 1 [molecular weight (Mw)=7,800, dispersity (Mw/Mn)=1.78]:

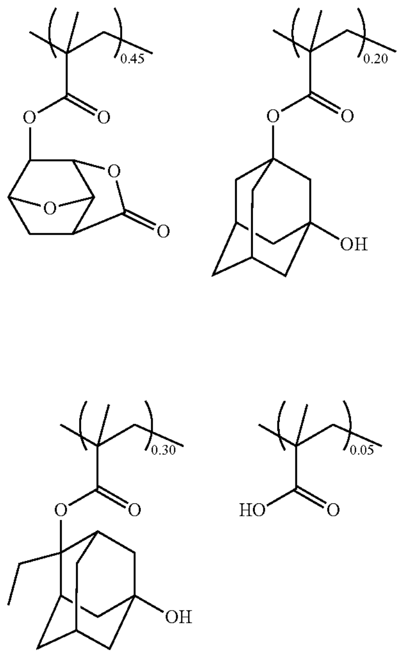

Acid generator: PAG-A

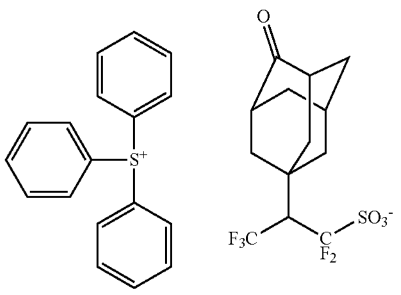

Base: Quencher

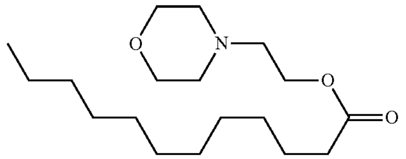 [SMILES: CCCCCCCCCCCC(=O)OCCN1CCOCC1]

Surfactant: FC-4430 manufactured by 3M

Top coat polymer [molecular weight (Mw)=8,800, dispersity (Mw/Mn)=1.69]

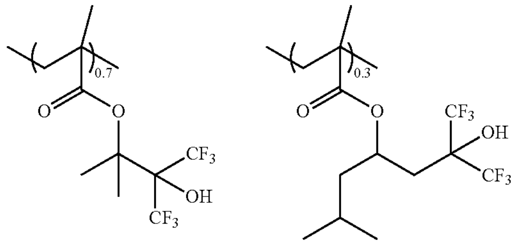

TABLE 11

| | Polymer (parts by mass) | Organic solvent (parts by mass) |
|---|---|---|
| TC-1 | top coat polymer (100) | diisoamyl ether (2700)<br>2-methyl-1-butanol (270) |

TABLE 12

| Example 2 | Polysiloxane resist underlayer film | Pattern sectional profile after development | LWR |
|---|---|---|---|
| Example 2-1 | Film 31 | vertical profile | 2.2 |
| Example 2-2 | Film 32 | vertical profile | 2.1 |
| Example 2-3 | Film 33 | vertical profile | 2.1 |
| Example 2-4 | Film 64 | vertical profile | 2.2 |
| Example 2-5 | Film 65 | vertical profile | 2.0 |
| Example 2-6 | Film 66 | vertical profile | 2.0 |
| Comparative Example 2-1 | Film 70 | undercut profile | 2.6 |
| Comparative Example 2-2 | Film 73 | undercut profile | 2.5 |

As shown by Comparative Examples in Table 12, when the conventional acid generators (PAG-14, -15) not having both of a cation moiety and an anion moiety formed in one molecule were used, it was observed that acids generated by the exposure diffused at the interface portion between the resist upper layer film and the silicon-containing resist underlayer film, resulting in undercut profile formation and LWR degradation due to necking of line patterns. In contrast, when the silicon-containing films containing the inventive betaine-type acid generators (PAG-7 to -9, -4 to -6) were used as the resist underlayer films, it was found that favorable LWR was demonstrated in the ArF lithography, too.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a silicon-containing resist underlayer film, comprising at least:

one or more compounds shown by the following general formula (P-0); and a thermally crosslinkable polysiloxane (Sx), (P-0)

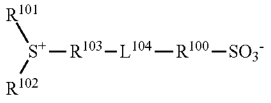

wherein $R^{100}$ represents a divalent organic group substituted with one or more fluorine atoms; $R^{101}$ and $R^{102}$ each independently represent a linear, branched, or cyclic monovalent hydrocarbon group having 1 to 20 carbon atoms optionally substituted with a hetero-atom or optionally interposed by a hetero-atom; $R^{103}$ represents a linear, branched, or cyclic divalent hydrocarbon group having 1 to 20 carbon atoms optionally substituted with a hetero-atom or optionally interposed by a hetero-atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero-atom or optionally interposed by a hetero-atom.

2. The composition for forming a silicon-containing resist underlayer film according to claim 1, wherein the compound shown by the general formula (P-0) is a compound shown by the following general formula (P-1):

(P-1)

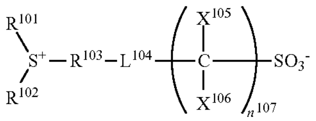

wherein $X^{105}$ and $X^{106}$ each independently represent any of a hydrogen atom, a fluorine atom, and a trifluoromethyl group, but not all of $X^{105}$'s and $X^{106}$'s are hydrogen atoms simultaneously; $n^{107}$ represents an integer of 1 to 4; and $R^{101}$, $R^{102}$, $R^{103}$, and $L^{104}$ are as defined above.

3. The composition for forming a silicon-containing resist underlayer film according to claim 1, wherein the thermally crosslinkable polysiloxane (Sx) comprises any one or more of a repeating unit shown by the following general formula (Sx-1), a repeating unit shown by the following general formula (Sx-2), and a partial structure shown by the following general formula (Sx-3):

(Sx-1)

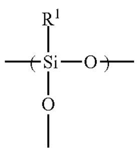

-continued (Sx-2)

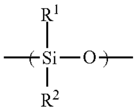

(Sx-3)

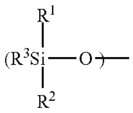

wherein $R^1$, $R^2$, and $R^3$ are identical to or different from each other and each represent a monovalent organic group having 1 to 30 carbon atoms.

4. The composition for forming a silicon-containing resist underlayer film according to claim 2, wherein the thermally crosslinkable polysiloxane (Sx) comprises any one or more of a repeating unit shown by the following general formula (Sx-1), a repeating unit shown by the following general formula (Sx-2), and a partial structure shown by the following general formula (Sx-3):

(Sx-1)

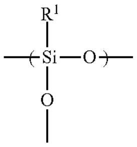

(Sx-2)

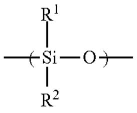

(Sx-3)

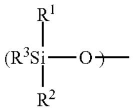

wherein $R^1$, $R^2$, and $R^3$ are identical to or different from each other and each represent a monovalent organic group having 1 to 30 carbon atoms.

5. The composition for forming a silicon-containing resist underlayer film according to claim 1, further comprising a crosslinking catalyst (Xc).

6. The composition for forming a silicon-containing resist underlayer film according to claim 2, further comprising a crosslinking catalyst (Xc).

7. The composition for forming a silicon-containing resist underlayer film according to claim 3, further comprising a crosslinking catalyst (Xc).

8. The composition for forming a silicon-containing resist underlayer film according to claim 4, further comprising a crosslinking catalyst (Xc).

9. The composition for forming a silicon-containing resist underlayer film according to claim 5, wherein the crosslinking catalyst (Xc) is a sulfonium salt (Xc-1), an iodonium salt (Xc-2), a phosphonium salt (Xc-3), an ammonium salt (Xc-4), a polysiloxane (Xc-10) having a structure partially containing one of these salts, or an alkaline metal salt.

10. The composition for forming a silicon-containing resist underlayer film according to claim 6, wherein the crosslinking catalyst (Xc) is a sulfonium salt (Xc-1), an iodonium salt (Xc-2), a phosphonium salt (Xc-3), an ammonium salt (Xc-4), a polysiloxane (Xc-10) having a structure partially containing one of these salts, or an alkaline metal salt.

11. The composition for forming a silicon-containing resist underlayer film according to claim 7, wherein the crosslinking catalyst (Xc) is a sulfonium salt (Xc-1), an iodonium salt (Xc-2), a phosphonium salt (Xc-3), an ammonium salt (Xc-4), a polysiloxane (Xc-10) having a structure partially containing one of these salts, or an alkaline metal salt.

12. The composition for forming a silicon-containing resist underlayer film according to claim 8, wherein the crosslinking catalyst (Xc) is a sulfonium salt (Xc-1), an iodonium salt (Xc-2), a phosphonium salt (Xc-3), an ammonium salt (Xc-4), a polysiloxane (Xc-10) having a structure partially containing one of these salts, or an alkaline metal salt.

13. A patterning process comprising the steps of:

forming an organic film on a body to be processed by using a coating-type organic film material;

forming a resist underlayer film on the organic film by using the composition for forming a silicon-containing resist underlayer film according to claim 1;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and transferring the pattern to the body to be processed by etching using the organic film having the transferred pattern as a mask.

14. A patterning process comprising the steps of:

forming a hard mask mainly containing carbon on a body to be processed by a CVD method;

forming a resist underlayer film on the hard mask by using the composition for forming a silicon-containing resist underlayer film according to claim 1;

forming a resist upper layer film on the resist underlayer film by using a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the hard mask by dry etching using the resist underlayer film having the transferred pattern as a mask; and transferring the pattern to the body to be processed by dry etching using the hard mask having the transferred pattern as a mask.

15. The patterning process according to claim 13, wherein the pattern is formed in the resist upper layer film by a photolithography with a wavelength of 10 nm or more and 300 nm or less, direct drawing with electron beam, nanoimprinting, or a combination thereof.

16. The patterning process according to claim 14, wherein the pattern is formed in the resist upper layer film by a photolithography with a wavelength of 10 nm or more and 300 nm or less, direct drawing with electron beam, nanoimprinting, or a combination thereof.

17. The patterning process according to claim 13, wherein the body to be processed is a semiconductor apparatus substrate, a metal film, a metal carbide film, a metal oxide film, a metal nitride film, a metal oxycarbide film, or a metal oxynitride film.

18. The patterning process according to claim 14, wherein the body to be processed is a semiconductor apparatus substrate, a metal film, a metal carbide film, a metal oxide film, a metal nitride film, a metal oxycarbide film, or a metal oxynitride film.

19. The patterning process according to claim 13, wherein the metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

20. The patterning process according to claim 14, wherein the metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

* * * * *